United States Patent
McManamon et al.

(10) Patent No.: US 12,248,139 B2
(45) Date of Patent: Mar. 11, 2025

(54) DECENTERED LENS LIGHT BEAM STEERING

(71) Applicant: Exciting Technology, LLC, Dayton, OH (US)

(72) Inventors: Paul F. McManamon, Dayton, OH (US); Abtin Ataei, Oakwood, OH (US)

(73) Assignee: Exciting Technology LLC, Dayton, OH (US)

(*) Notice: Subject to any disclaimer, the term of this patent is extended or adjusted under 35 U.S.C. 154(b) by 299 days.

(21) Appl. No.: 17/860,813

(22) Filed: Jul. 8, 2022

(65) Prior Publication Data

US 2022/0350135 A1 Nov. 3, 2022

Related U.S. Application Data

(63) Continuation of application No. PCT/US2020/056253, filed on Oct. 19, 2020.

(Continued)

(51) Int. Cl.
*G02B 26/08* (2006.01)
*H01S 5/00* (2006.01)
*H01S 5/02251* (2021.01)

(52) U.S. Cl.
CPC ........ *G02B 26/0875* (2013.01); *H01S 5/0071* (2013.01); *H01S 5/02251* (2021.01)

(58) Field of Classification Search
CPC ............... G02B 26/0875; H01S 5/0071; H01S 5/02251

(Continued)

(56) References Cited

U.S. PATENT DOCUMENTS 3,822,932 A 7/1974 Humphrey
5,223,971 A 6/1993 Magel
(Continued)

FOREIGN PATENT DOCUMENTS

DE 102007004609 A1 8/2007
EP 0903608 A2 3/1999
(Continued)

OTHER PUBLICATIONS

Gibson, Jennifer L., et al., "Wide Angle Decentered Lens Beam Steering for Infrared Countermeasures", Opt'Eng; Publication [online]. Mar. 31, 2004 [retrieved Dec. 26, 2020]. Retrieved from the Internet;, Mar. 31, 2004, 11 pages.

(Continued)

*Primary Examiner* — William Choi
(74) *Attorney, Agent, or Firm* — GTC Law Group PC & Affiliates

(57) ABSTRACT

An example system includes a first steering lens positioned between an EM source and a second steering lens, and the second steering lens positioned between the first steering lens and an emission lens. The example system includes the first and second steering lenses having a combined first effective focal length, and where the emission lens is a positive lens have a second focal length. The example system includes the first effective focal length being shorter than the second focal length. The example system includes a first steering actuator that move the first steering lens along a first movement course, and a second steering actuator that moves the second steering lens along a second movement course.

20 Claims, 34 Drawing Sheets

Related U.S. Application Data

(60) Provisional application No. 63/040,319, filed on Jun. 17, 2020, provisional application No. 63/011,706, filed on Apr. 17, 2020.

(58) Field of Classification Search
USPC .................................................. 359/622, 813
See application file for complete search history.

(56) References Cited

U.S. PATENT DOCUMENTS

| | | |
|---|---|---|
| 5,249,079 A | 9/1993 | Umeda |
| 5,392,157 A | 2/1995 | Shih |
| 5,444,572 A | 8/1995 | Gal et al. |
| 5,598,299 A | 1/1997 | Hayakawa |
| 5,703,726 A | 12/1997 | Griffith |
| 5,923,480 A | 7/1999 | Labeye |
| 5,943,159 A | 8/1999 | Zhu |
| 5,987,041 A | 11/1999 | Taniguchi et al. |
| 6,169,594 B1 | 1/2001 | Aye et al. |
| 6,295,171 B1 | 9/2001 | Chao et al. |
| 6,317,251 B1 | 11/2001 | Wang |
| 6,373,620 B1 | 4/2002 | Wang |
| 6,384,975 B1 | 5/2002 | Hayakawa |
| 6,400,855 B1 | 6/2002 | Li et al. |
| 6,456,419 B1 | 9/2002 | Winker et al. |
| 6,556,260 B1 | 4/2003 | Itou et al. |
| 6,728,033 B2 | 4/2004 | Hayakawa |
| 6,746,618 B2 | 6/2004 | Li et al. |
| 7,057,787 B2 | 6/2006 | Cicchiello et al. |
| 7,411,724 B2 | 8/2008 | Cicchiello et al. |
| 7,544,945 B2 | 6/2009 | Tan et al. |
| 8,014,050 B2 | 9/2011 | McGrew |
| 8,301,027 B2 | 10/2012 | Shaw et al. |
| 8,614,743 B2 | 12/2013 | Winsor |
| 8,654,292 B2 | 2/2014 | Kubota et al. |
| 8,699,137 B2 | 4/2014 | McGrew |
| 8,941,921 B2 | 1/2015 | Ito et al. |
| 9,025,230 B2 | 5/2015 | Sagan et al. |
| 9,075,324 B2 | 7/2015 | Zimmerman et al. |
| 9,164,206 B2 | 10/2015 | Valley et al. |
| 9,577,327 B2 | 2/2017 | Driscoll et al. |
| 9,709,829 B2 | 7/2017 | McGrew |
| 9,915,850 B2 | 3/2018 | Bitauld et al. |
| 10,295,671 B2 | 5/2019 | Gazit et al. |
| 10,303,037 B2 | 5/2019 | Spector et al. |
| 10,386,489 B2 | 8/2019 | Albelo et al. |
| 10,761,195 B2 | 9/2020 | Donovan |
| 10,838,043 B2 | 11/2020 | Hansson |
| 10,845,671 B2 | 11/2020 | McManamon et al. |
| 10,989,982 B2 | 4/2021 | Ataei et al. |
| 11,221,435 B2 | 1/2022 | Gopinath et al. |
| 11,762,068 B2 | 9/2023 | Donovan |
| 11,822,205 B2 | 11/2023 | McManamon et al. |
| 2002/0126383 A1 | 9/2002 | Hayakawa |
| 2003/0021519 A1 | 1/2003 | Zalevsky et al. |
| 2004/0067013 A1 | 4/2004 | Gu et al. |
| 2004/0135965 A1 | 7/2004 | Holmes |
| 2004/0264229 A1 | 12/2004 | Tsu |
| 2005/0213964 A1 | 9/2005 | Kreger et al. |
| 2005/0265403 A1 | 12/2005 | Anderson et al. |
| 2005/0271325 A1 | 12/2005 | Anderson et al. |
| 2006/0092499 A1 | 5/2006 | Cicchiello et al. |
| 2006/0119928 A1 | 6/2006 | Cicchiello et al. |
| 2007/0146910 A1 | 6/2007 | Duston et al. |
| 2007/0181810 A1 | 8/2007 | Tan et al. |
| 2007/0279365 A1 | 12/2007 | Kageyama |
| 2008/0015553 A1 | 1/2008 | Zacharias |
| 2008/0212007 A1 | 9/2008 | Meredith |
| 2008/0239420 A1 | 10/2008 | McGrew |
| 2008/0247031 A1 | 10/2008 | Wasilousky |
| 2009/0073411 A1 | 3/2009 | Tanitsu |
| 2009/0304328 A1 | 12/2009 | Presley et al. |
| 2010/0046953 A1 | 2/2010 | Shaw et al. |
| 2010/0165322 A1 | 7/2010 | Kane et al. |
| 2011/0286063 A1 | 11/2011 | McGrew |
| 2013/0128334 A1 | 5/2013 | Stephen |
| 2013/0241761 A1 | 9/2013 | Cooper et al. |
| 2014/0016051 A1 | 1/2014 | Kroll et al. |
| 2015/0346495 A1 | 12/2015 | Welch et al. |
| 2015/0346521 A1 | 12/2015 | Williams |
| 2015/0378241 A1 | 12/2015 | Eldada |
| 2016/0170287 A1 | 6/2016 | Bitauld et al. |
| 2016/0327636 A1 | 11/2016 | Gazit et al. |
| 2017/0269453 A1 | 9/2017 | Galstian et al. |
| 2017/0307736 A1 | 10/2017 | Donovan |
| 2017/0357142 A1 | 12/2017 | Spector et al. |
| 2018/0038576 A1 | 2/2018 | Mao |
| 2018/0101083 A1 | 4/2018 | Aflatouni et al. |
| 2018/0136538 A1 | 5/2018 | Khan |
| 2018/0180256 A1 | 6/2018 | Mao et al. |
| 2018/0275394 A1 | 9/2018 | Yeoh et al. |
| 2018/0364463 A1 | 12/2018 | Yuan et al. |
| 2019/0129275 A1 | 5/2019 | McManamon et al. |
| 2019/0146070 A1 | 5/2019 | Hansson |
| 2019/0187482 A1 | 6/2019 | Lanman |
| 2019/0285902 A1 | 9/2019 | Ouderkirk et al. |
| 2020/0124864 A1 | 4/2020 | Rothberg et al. |
| 2020/0183016 A1 | 6/2020 | Wang et al. |
| 2020/0326606 A1 | 10/2020 | Ataei et al. |
| 2020/0333679 A1 | 10/2020 | Ataei et al. |
| 2020/0333680 A1 | 10/2020 | Ataei et al. |
| 2020/0333682 A1 | 10/2020 | Ataei et al. |
| 2021/0048723 A1 | 2/2021 | McManamon et al. |
| 2021/0048725 A1 | 2/2021 | McManamon et al. |
| 2021/0116778 A1 | 4/2021 | Zhang et al. |
| 2021/0333443 A1* | 10/2021 | Gopinath .............. G02B 26/101 |
| 2022/0350136 A1 | 11/2022 | McManamon et al. |
| 2022/0360037 A1 | 11/2022 | McManamon et al. |
| 2023/0038746 A1 | 2/2023 | McManamon et al. |
| 2023/0039081 A1 | 2/2023 | McManamon et al. |
| 2023/0350192 A1 | 11/2023 | McManamon et al. |

FOREIGN PATENT DOCUMENTS

| | | |
|---|---|---|
| WO | 2018097869 A2 | 5/2018 |
| WO | 2018097869 A3 | 8/2018 |
| WO | 2020086111 A1 | 4/2020 |
| WO | 2020086692 A1 | 4/2020 |
| WO | 2020086111 A9 | 12/2020 |
| WO | 2021211162 A1 | 10/2021 |
| WO | 2021211163 A1 | 10/2021 |
| WO | 2022266229 A1 | 12/2022 |

OTHER PUBLICATIONS

Glockner, Steffen, et al., "Micro-opto-mechanical beam deflectors", Opt Eng; Publication [online]. Jan. 12, 1997 [retrieved Dec. 31, 2020], Retrieved from the Internet; DOI:, Jan. 12, 1997, 7 pages.

Hassanfiroozi, Amir, et al., "Dual layer electrode liquid crystal lens for 2D/3D tunable endoscopy imaging system", Optics Express; vol. 24, No. 8, Apr. 18, 2016, 12 pages.

Hatcher, Burrell R., "Granularity of beam positions in digital phased arrays", Proceedings of the IEEE (vol. 56, Issue: 11, Nov. 1968), Nov. 1968, 1795-1800.

Lou, Yimin, et al., "Design and fabrication of tunable liquid crystal diffractive lens", Optical Engineering 091713-1, vol. 52(9), 2013, 6 pages.

McManamon, Paul F., et al., ""Broadband optical phased-array beam steering"", Opt. Eng. 44, 128004, 2005, Dec. 1-5, 2005.

McManamon, Paul F., et al., ""Nonmechanical beam steering for active and passive sensors"", Downloaded From: https://www.spiedigitallibrary.org/conference-proceedings-of-spie on Aug. 22, 2019 Terms of Use: https://www.spiedigitallibrary.org/terms-of-use, Jan. 10, 1993.

McManamon, Paul F., et al., "Optical Phased Array Technology", Proc. IEEE 84(2), 268-298,, Feb. 1996, 268-298.

McManamon, Paul F., et al., "A Review of Phased Array Steering for Narrow-Band Electrooptical Systems", Proceedings of the IEEE, vol. 97, No. 6,, Jun. 2009, 19 pages.

(56) References Cited

OTHER PUBLICATIONS

PCT/US19/57616, "International Application Serial No. PCT/US19/57616, International Preliminary Report on Patentability mailed May 6, 2021", Exciting Technology LLC, 9 pages.

PCT/US19/57616, "International Application Serial No. PCT/US19/57616, International Search Report and Written Opinion mailed Jan. 13, 2020", Exciting Technology LLC, 10 pages.

PCT/US2019/023915, "International Application Serial No. PCT/US2019/023915, International Preliminary Report on Patentability mailed May 6, 2021", Exciting Technology LLC, 12 pages.

PCT/US2019/023915, "International Application Serial No. PCT/US2019/023915, International Search Report and Written Opinion mailed Jul. 18, 2019", Exciting Technology LLC, 15 pages.

PCT/US2019/023915, "International Application Serial No. PCT/US2019/023915, Invitation to Pay Additional Fees and, Where Applicable, Protest Fee mailed May 29, 2019", Exciting Technology LLC, 2 pages.

PCT/US2020/056253, "International Application Serial No. PCT/US2020/056253, International Search Report and Written Opinion mailed Feb. 3, 2021", Exciting Technology LLC, 8 pages.

PCT/US2020/056254, "International Application Serial No. PCT/US2020/056254, International Search Report and Written Opinion mailed Mar. 17, 2021", Exciting Technology LLC, 11 pages.

PCT/US2020/056254, "International Application Serial No. PCT/US2020/056254, Invitation to Pay Additional Fees and, Where Applicable, Protest Fee mailed Jan. 11, 2021", Exciting Technology LLC, 2 pages.

PCT/US2020/064071, "International Application Serial No. PCT/US2020/064071, International Search Report and Written Opinion mailed Apr. 16, 2021", Exciting Technology LLC, 14 pages.

PCT/US2020/064071, "International Application Serial No. PCT/US2020/064071, Invitation to Pay Additional Fees and, Where Applicable, Protest Fee mailed Feb. 19, 2021", Exciting Technology LLC, 2 pages.

Rabinovich, William S., et al., "Two-dimensional beam steering using a thermo-optic silicon photonic optical-phased-array", Opt. Eng. 55(11), 111603 (2016), doi: 10.1117/1.OE.55.11.111603, 2016, 8 pages.

Shang, Xiaobing, et al., "Tunable Optical Beam Deflection Via Liquid Crystal Gradient Refractive Index Generated By Highly Resistive Polymer Film", IEEE Photonics Journal, vol. 8, No. 3, 2016, pp. 1-11.

Thalhammer, Gregor, et al., ""Speeding up liquid crystal SLMs using overdrive with phase change reduction"", Jan. 28, 2013 / vol. 21, No. 2 / Optics Express p. 1779-1797, Jan. 2013, 1779-1797.

Wang, X., et al., ""Spatial resolution limitation of liquid crystal spatial light modulator"", Liquid Crystal Conference, Great Lakes Photonics Symposium, Cleveland, OH Jun. 7-11, 2004, Oct. 2004, 45-57.

U.S. Appl. No. 17/860,834, filed Jul. 8, 2022, Pending, Paul F. McManamon, Abtin Ataei.

U.S. Appl. No. 17/860,846, filed Jul. 8, 2022, Pending, Paul F. McManamon, Abtin Ataei.

20931402.0, "European Application Serial No. 20931402.0, Extended European Search Report mailed Mar. 4, 2024", Exciting Technology LLC, 5 pages.

PCT/US2020/056253, "International Application Serial No. PCT/US2020/056253, International Preliminary Report on Patentability mailed Oct. 13, 2022", Exciting Technology LLC, 9 pages.

PCT/US2020/056254, "International Application Serial No. PCT/US2020/056254, International Preliminary Report on Patentability mailed Oct. 27, 2022", Exciting Technology LLC, 10 pages.

PCT/US2022/033640, "International Application Serial No. PCT/US2022/033640, International Search Report and Written Opinion mailed Oct. 5, 2022", Exciting Technology LLC, 12 pages.

PCT/US2022/033640, "International Application Serial No. PCT/US2022/033640, International Preliminary Report on Patentability and Written Opinion mailed Dec. 28, 2023", Exciting Technology LLC, 6 pages.

Bawart, et al., "Dynamic beam-steering by a pair of rotating diffractive elements", Optics Communications, vol. 460, 125071, ISSN 0030-4018, https://doi.Org/10.1016/j.optcom.2019.125071, 2020, 6 pages.

Duerr, et al., "Tracking integration in concentrating photovoltaics using laterally moving optics", Opt. Express 19, A207-A218, 2011, 12 pages.

Shi, Lei, et al., "Design considerations for high efficiency liquid crystal decentered microlens arrays for steering light", Appl. Opt. 49,, 2010, pp. 109-421.

Zohrabi, Mo, et al., "Wide-angle nonmechanical beam steering using liquid lenses", Opt. Express 24,, 2016, pp. 23798-23809.

\* cited by examiner

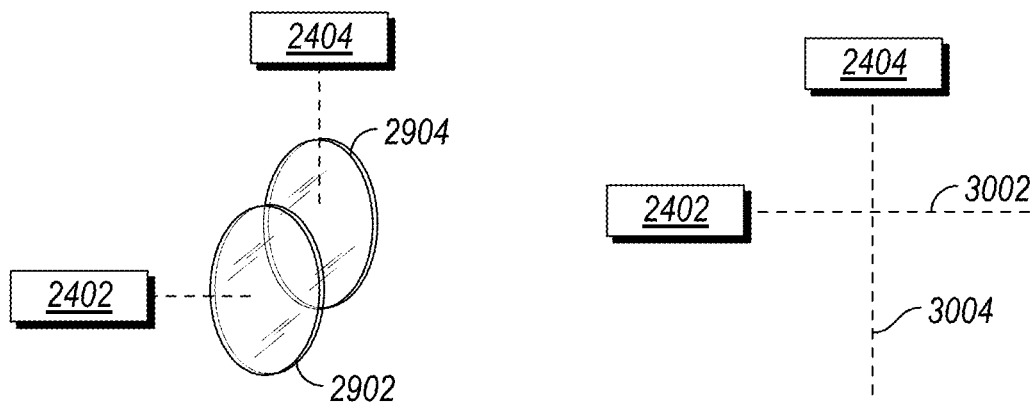
FIG. 29    FIG. 30
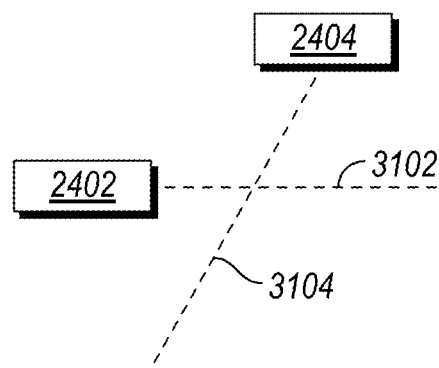
FIG. 31

DECENTERED LENS LIGHT BEAM STEERING

CROSS-REFERENCE TO RELATED APPLICATIONS

This application is a continuation of International Application No. PCT/US2020/056253, filed Oct. 19, 2020 entitled "DECENTERED LENS LIGHT BEAM STEERING.

PCT/US2020/056253 claims priority to the following U.S. Provisional Patent Applications: Ser. No. 63/011,706, filed 17 Apr. 2020, and entitled "DECENTERED LENS LIGHT BEAM ELECTRO-MECHANICAL STEERING"; and Ser. No. 63/040,319, filed 17 Jun. 2020, and entitled "DECENTERED LENS LIGHT BEAM ELECTRO-MECHANICAL STEERING".

Each of the foregoing patent applications is incorporated by reference herein in the entirety for all purposes.

BACKGROUND

A previously known decentered beam steering system consists of two identical thin lenses separated by two focal lengths, as seen in FIG. 1.

In the example previously known system, the first lens 112 is illuminated by an infinite uniform plane wave 102 (or incident beam). The first lens 112 and second lens 114 are arranged such that the back focal plane of the first lens coincides with the front focal plane of the second lens (at focal length 108 away from the second lens 114). The incoming collimated wavefront is focused to a point on the shared focal plane. The second lens 114 is decentered (e.g., relative to an optical axis 120 of the incident beam 102) by an offset 104 (defining steering angle Δ), and the decentered second lens 114 then collimates the exiting light 106, but the beam 106 is directed to a nonzero steering angle (θ) as seen in FIG. 1, for example comparing beam boundary 116 with beam boundary 118. The deflection angle θ can be calculated from the focal length 108 of the second lens (f) and the displacement 104 (defining Δ) as set forth in Eq. 1.

$$\theta = \tan^{-1}\left(\frac{\Delta}{f}\right).$$ Eq. 1

Deflection angle for previously known decentered beam steering system

As the maximum possible lens displacement 104 (Δ) is half of the lens 114 diameter, it can be seen that the maximum steering capability is (f/# is the f-number, or focal length over the beam diameter, in the context of the present disclosure):

$$\theta_{max} = \tan^{-1}\left(\frac{d}{2f}\right) = \tan^{-1}\left(\frac{1}{2f/\#}\right).$$ Eq. 2

Maximum deflection angle for previously known decentered beam steering system

Displacing the lens up to half of its diameter is not always practical, straight forward, and/or may introduce limitations in the steering speed (or frequency—e.g., a sweep frequency for steering through a range of angles) capability. Further, steering to a large angle in previously known systems may prevent some rays from hitting the next lens and introduce vignetting, e.g., depicted as vignetting losses 110 in the example of FIG. 1, where some of the initial beam 102 energy is directed to undesired locations, resulting in losses, heat generation, and/or direction of some beam energy to undesirable locations.

Accordingly, the deflection angle 104 capability is determined by the diameter of the second lens 114, which must be increased to increase steering capability, and the system must provide a corresponding increase in the displacement 104 to achieve that increased steering capability. The increased size of the lens 114 makes steering more difficult, with the requirement for a larger, more capable actuator, and the movement of a greater mass of the increased size of the lens 114. Thus, in previously known systems, for a given focal length 108, a large lens 114 must be moved a large distance A to provide for high angle steering capability, severely limiting the capability, increasing the cost, and/or increasing the footprint of the system to steer to large angles, especially if the final aperture is large (e.g., since the lens 114 must be at least twice the size of the final steered beam size).

As depicted in FIG. 1, a portion 110 of the steered beam is lost due to vignetting, where some of the light misses the second lens. A further previously known system includes the utilization of a field lens 202 as depicted in FIG. 2. The field lens 202 does not increase the steering capability, but does reduce the vignette losses, and increases the fraction of the beam 102, 106 that is successfully steered.

The previously known system operates at a magnification of one (1), where the steered beam 106 must be incident on the second lens 114, not counting the field lens 202, and accordingly the second lens 114 must be at least the size of the desired steered beam. For example, to achieve a one (1) inch steered beam, a minimum of a one (1) inch second lens 114 must be utilized. The large size of the second lens 114 suffers similar drawbacks to the system depicted in FIG. 1, for example requiring a large, highly capable, mechanical movement system for the second lens 114 to steer the beam 106, increasing the cost, weight, and complexity of the steering system. Additionally, while the system of FIGS. 1 and 2 is depicted steering in a single direction (e.g., azimuth or elevation), the steering may be performed in a second direction as well, further increasing the cost and complexity of the steering system (e.g., adding additional lens layers, additional actuators, imposing a minimum lens size in both directions even where high capability is only required in one steering direction, etc.).

Some previously known systems utilize a telescope (not shown) downstream of the second lens 114 to magnify the beam, reducing the required size of the second lens to achieve a desired steered beam size. However, the magnification proportionately reduces the effective steered angle θ by a fraction equal to the magnification, according to equation 3, where θ is the final steered angle, a is the deflected angle, and M is the magnification of the steered beam.

$$\theta = \frac{\alpha}{M}.$$ Eq. 3

Final deflection angle of a magnified beam

Accordingly, previously known decentered beam steering systems require large lenses with large deflections to achieve significant steering capability. Additionally, previously known systems suffer from high expense, low steering capability, a large footprint (e.g., weight, size, and/or power requirements), and generally more than one of these to meet some constraint for the others.

SUMMARY

An example system includes a first steering lens interposed between an electromagnetic (EM) source and a second steering lens, the second steering lens interposed between the first steering lens and an emission lens, the first steering lens and the second steering lens having a combined first effective focal length, the emission lens comprising a positive lens having a second focal length, wherein the first effective focal length is shorter than the second focal length, a first steering actuator coupled to the first steering lens, the first steering actuator configured to move the first steering lens along a first movement course, and a second steering actuator coupled to the second steering lens, the second steering actuator configured to move the second steering lens along a second movement course, wherein the second movement course is distinct from the first movement course.

Certain further aspects of the example system are described following, any one or more of which may be present in certain embodiments. An example system includes: wherein the first movement course corresponds to a first axis, and wherein the second movement course corresponds to a second axis; wherein the first axis comprises a first steering axis, and wherein the second axis comprises a second steering axis; wherein the first axis is perpendicular to the second axis; and/or wherein the first axis is radially separated from the second axis by at least 45 degrees. An example system includes: wherein the first steering lens comprises a negative lens; wherein the second steering lens comprises a negative lens; wherein the second steering lens comprises a positive lens, and wherein a power of the first steering lens comprises a distinct magnitude from the power of the second steering lens; wherein the first steering lens comprises a positive lens; wherein the second steering lens comprises a positive lens; and/or wherein the second steering lens comprises a negative lens, and wherein a power of the first steering lens comprises a distinct magnitude from the power of the second steering lens. An example system includes: wherein a ratio between the first effective focal length and the second focal length is selected in response to a beam steering angle capability value for a beam steering device comprising the first steering lens, the second steering lens, and the emission lens; wherein at least one of the first steering actuator or the second steering actuator comprises a piezoelectric actuator; wherein at least one of the first steering actuator or the second steering actuator comprises an electromagnetic actuator; wherein the first steering actuator comprises a configurable lens element having an active lens portion, wherein the first steering lens comprises the active lens portion, and wherein moving the first steering lens along the first movement course comprises changing a position of the active lens portion; wherein the second steering actuator comprises a configurable lens element having an active lens portion, wherein the second steering lens comprises the active lens portion, and wherein moving the second steering lens along the second movement course comprises changing a position of the active lens portion; and/or a source collimator lens interposed between the EM source and the first steering lens.

An example system further includes a beam steering controller, including: a steering target circuit structured to interpret a beam steering target value; a steering lens control circuit structured to determine a first position of the first steering lens and a second position of the second steering lens in response to the beam steering target value; a steering actuation circuit structured to provide a first actuator command value in response to the first position, and a second actuator command value in response to the second position; and wherein the first actuator is responsive to the first actuator command value, and wherein the second actuator is responsive to the second actuator command value. An example system further includes one or more of: wherein the first position comprises a selected displacement along a first steering axis; wherein the second position comprises a selected displacement along a second steering axis; wherein the steering lens control circuit is further structured to determine the first position and the second position, such that the EM source is incident upon the emission lens at a selected position of the emission lens; wherein the beam steering target value comprises a steering azimuth value and a steering elevation value; wherein the steering lens control circuit is further structured to determine one of the first position or the second position in response to the steering azimuth value, and to determine the other one of the first position or the second position in response to the steering elevation value; and/or wherein the steering lens control circuit is further structured to determine the first position and the second position such that the EM source incident upon the emission lens is at a selected position of the emission lens.

An example system further includes one or more of: wherein a beam steering device comprising the first steering lens, the second steering lens, and the emission lens comprises a greater magnification in an azimuthal axis than in an elevation axis; wherein the beam steering device comprises an azimuthal steering capability aligned with the azimuthal axis, an elevation steering capability aligned with the elevation axis, and wherein the azimuthal steering capability is greater than the elevation steering capability; wherein the first movement course aligns with the azimuthal axis, and wherein the second actuator comprises a greater displacement range than the first actuator; wherein the second movement course aligns with the elevation axis, and wherein the first actuator comprise a greater displacement range than the second actuator; wherein a beam steering device comprising the first steering lens, the second steering lens, and the emission lens comprises a greater magnification in an elevation axis than in an azimuthal axis; wherein the beam steering device comprises an azimuthal steering capability aligned with the azimuthal axis, an elevation steering capability aligned with the elevation axis, and wherein the elevation steering capability is greater than the azimuthal steering capability; wherein the first movement course aligns with the elevation axis, and wherein the second actuator comprises a greater displacement range than the first actuator; and/or wherein the second movement course aligns with the azimuthal axis, and wherein the first actuator comprise a greater displacement range than the second actuator.

An example system further includes one or more of: wherein a beam steering device comprising the first steering lens, the second steering lens, and the emission lens comprises a greater magnification in a first steering axis than in a second steering axis; wherein the beam steering device comprises a first steering capability aligned with the first steering axis, a second steering capability aligned with the second steering axis, and wherein the first steering capability is greater than the second steering capability; wherein the first movement course aligns with the first steering axis, and wherein the second actuator comprises a greater displacement range than the first actuator; wherein the second movement course aligns with the first axis, and wherein the first actuator comprise a greater displacement range than the second actuator; a field lens interposed between the second steering lens and the emission lens; and/or wherein the field lens is axially displaced by the first effective focal length from the second steering lens, and by the second focal length from the emission lens.

Another example system includes: a steering lens interposed between an electromagnetic (EM) source and an emission lens, the steering lens having a first focal length; the emission lens comprising a positive lens having a second focal length; wherein the first focal length is shorter than the second focal length; and a steering actuator coupled to the steering lens, the steering actuator configured to move the first steering lens along a movement course.

Certain further aspects of the example system are described following, any one or more of which may be present in certain embodiments. An example system further includes one or more of: wherein the movement course comprises selected movement along each of two axes; wherein a first one of the two axes comprises a first steering axis, and wherein a second one of the two axes comprises a second steering axis; wherein the two axes comprise perpendicular axes; wherein the steering actuator comprises a configurable lens element having an active lens portion, wherein the steering lens comprises the active lens portion, and wherein moving the steering lens along the movement course comprises changing a position of the active lens portion; wherein the steering lens comprises a positive lens, the system further comprising a field lens positioned between the steering lens and the emission lens; and/or further comprising a source collimator lens interposed between the EM source and the steering lens.

Yet another example system includes: a fixed positive lens interposed between an electromagnetic (EM) source and a first steering layer; the first steering layer interposed between the fixed positive lens and a second steering layer, the first steering layer comprising a net negative effective focal power; the second steering layer comprising a net positive effective focal power; a first steering actuator coupled to the first steering layer, the first steering actuator configured to move the first steering layer along a first movement course; and a second steering actuator coupled to the second steering layer, the second steering actuator configured to move the second steering layer along a second movement course.

Certain further aspects of the example system are described following, any one or more of which may be present in certain embodiments. An example system further includes one or more of: wherein the first steering layer comprises two lenses, and wherein the first steering actuator comprises a pair of actuators, each coupled to a corresponding one of the two lenses of the first steering layer; wherein the second steering layer comprises two lenses, and wherein the second steering actuator comprises a pair of actuators, each coupled to a corresponding one of the two lenses of the second steering layer; and/or a source collimator lens interposed between the EM source and the steering lens.

BRIEF DESCRIPTION OF THE FIGURES

FIG. 29 is a schematic depiction of an actuator arrangement for a beam steering device.

FIG. 30 is a schematic depiction of movement directions for a beam steering device.

FIG. 31 is a schematic depiction of another embodiment of movement directions for a beam steering device.

DETAILED DESCRIPTION

Figure 1:
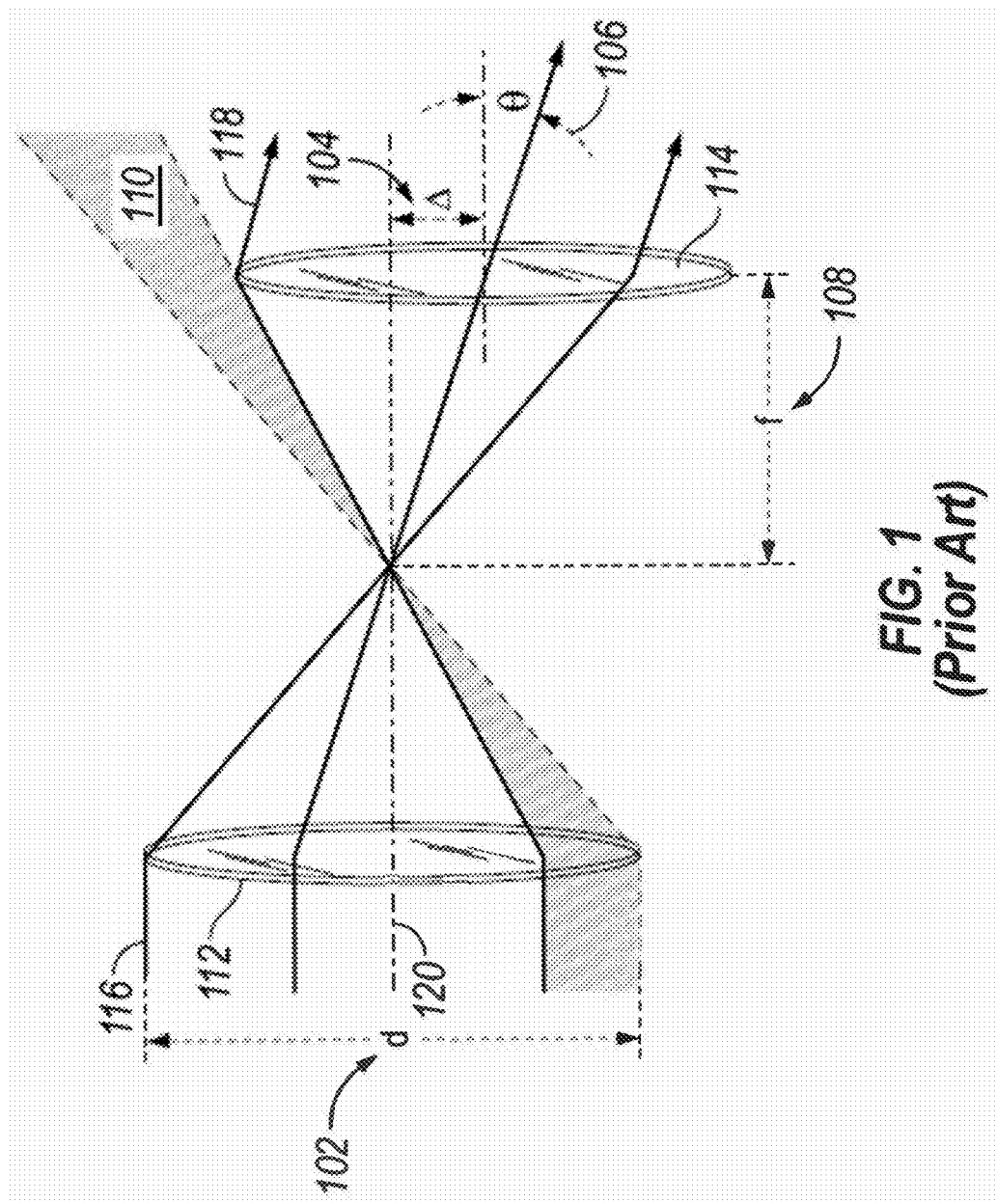
FIG. 1 depicts an example previously known steering device.
Figure 2:
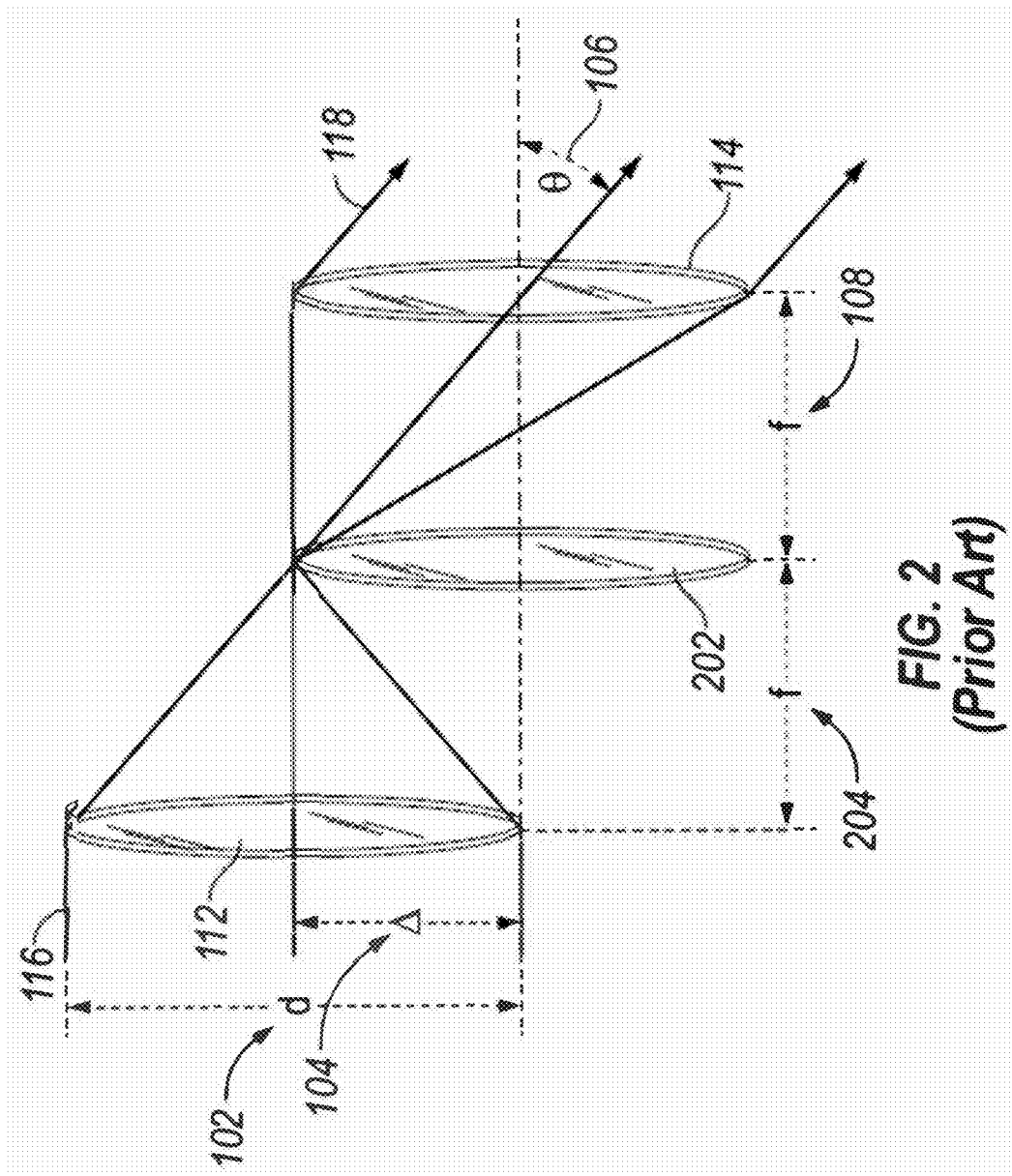
FIG. 2 depicts another example previously known steering device.
Figure 3:
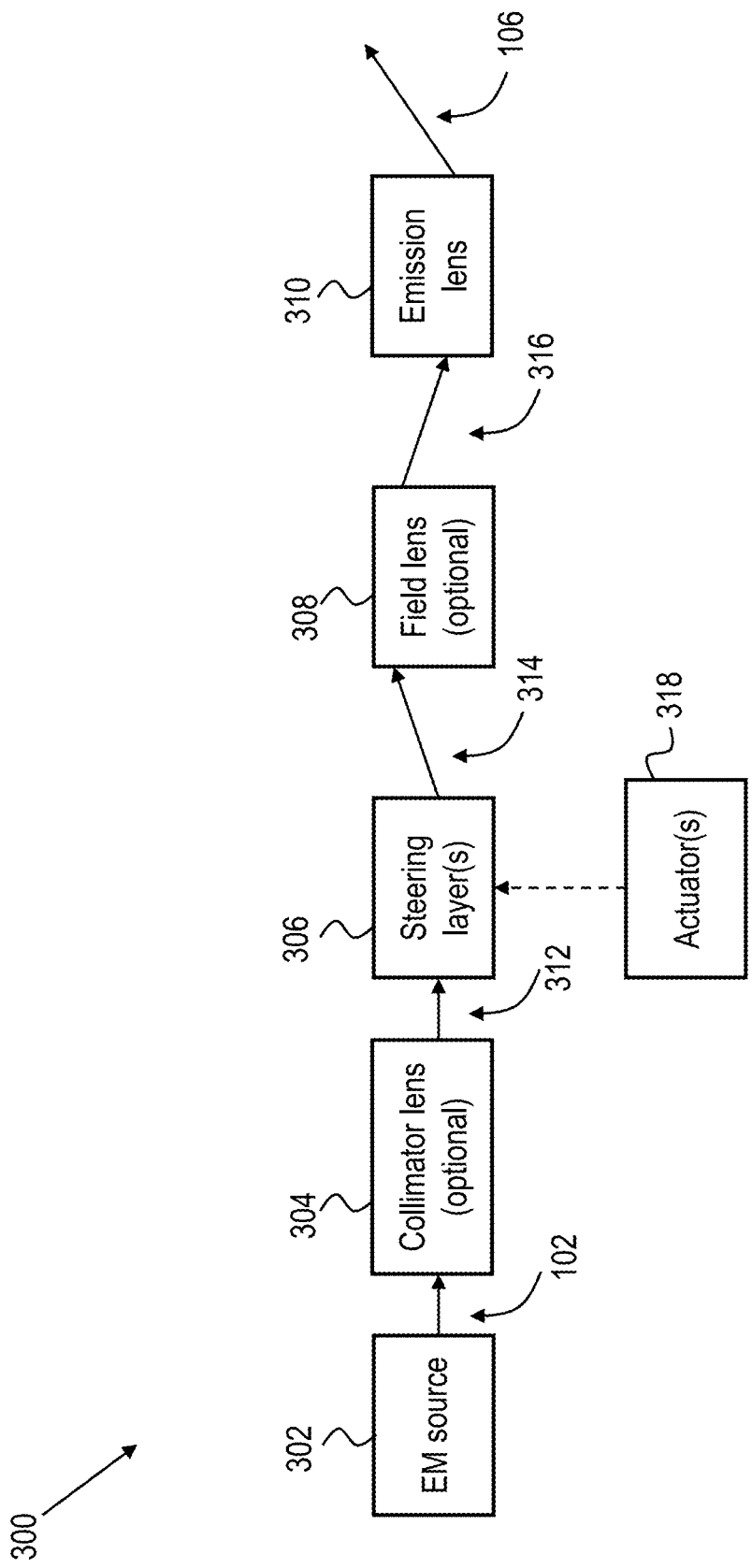
FIG. 3 is a schematic depiction of an example type 3 steering device.

Referencing FIG. 3, an example beam steering device 300 is schematically depicted, having a number of aspects as set forth throughout the present disclosure. The example beam steering device 300 overcomes and/or mitigates a number of drawbacks of previously known steering systems, including at least small steering angles, small steering apertures, low steering speeds (and/or frequencies), and/or a requirement for high capability actuating elements for steering lenses.

The example system 300 includes an EM source 302, for example a collimated light beam, laser, etc. In certain embodiments, the EM source 302 may be a fiber laser source or other fiber optic light source, and/or may be any other type of light source including a non-fiber light source. In certain embodiments, the EM source 302 may be provided as collimated light, and/or a converging and/or diverging light source, and/or combinations of these (e.g., in separate axes). In certain embodiments, the source light may be adjusted by a lens, a varifocal lens, and/or an aspherical collimating lens, before being provided to the negative lens(es). In certain embodiments, characteristics of the source light may be adjusted to the desired outlet characteristics, e.g., using net convergence and/or divergence, including in one or more axes, through the optical components of the steering system (e.g., the negative lens(es), field lens(es), and/or positive lens). Example, and non-limiting, light sources includes a laser diode, a fiber, and/or another laser component or collimated light source. As utilized herein, a light source, beam, or similar terms are understood to include electromagnetic (EM) radiation of any frequencies, including without limitation optical light, visible light, infrared radiation, ultraviolet radiation, microwaves, radio waves, and/or any selected frequency or range of frequencies relevant to the optical components of the steering system.

The example of FIG. 3, and throughout the present disclosure, is generally described in terms of steering an emitted light beam (e.g., incident beam 102 emitted as steered beam 106), for convenience of the present description. Additionally or alternatively, beam steering devices described throughout the present disclosure may be utilized to steer a received beam—for example a beam received from an object (e.g., emitted and/or reflected by the object), whereby the steering device directs the optical path of the beam steering device to the observed object, and steers the beam to final receiving optics or other observing components (e.g., a detection array or other device in FIG. 3 may replace the EM source 302). It can be seen that a given beam steering device may steer for emission or observation, including utilizing separate steering components for each of the emission and observation operations (e.g., reference FIGS. 15-18 and the related descriptions), utilizing the same steering components at distinct operating conditions (e.g., steering with the same components for emission at a first time, and for observation at a second time), and/or simultaneously (e.g., wherein the EM source 302 and/or observing components are configured to operate simultaneously, such as utilizing beam splitters or other optical components to separate the EM source 302 and observing components, and/or where the EM source 302 and observing components are configured to be aligned, such as with the EM source 302 directed through transparent observing components).

In the example of FIG. 3, the system 300 includes an optional collimator lens 304, for example to provide a selected divergence characteristic to the incident beam 302. The collimator lens 304 may provide collimated light (e.g., correcting a divergence of the incident beam 302, such as might be provided by a fiber laser), and/or light having a diverging or converging characteristic (e.g., to correct for net convergence or divergence in the remainder of the beam steering device 300, and/or to provide a final emitted beam 106 having a selected converging and/or diverging character). The selected divergence characteristic of the collimator lens 304 can be designed based on the divergence characteristic of the incident beam 302, the desired (and/or required) divergence characteristic of the emitted beam 106, and/or according to the converging and/or diverging effect applied to the steered beam by other components of the beam steering device 300.

The example system 300 further includes at least one steering layer 306, which may be a steering layer 306 according to any aspect of the present disclosure. The example steering layer 306 receives the collimated beam 312 (and/or the incident beam 102), and provides steering operations by displacement of one or more lenses of the steering layer 306, providing an initially steered beam 314.

An example steering layer 306 includes one or more steering lenses (typically a single lens, or two cooperating lenses), which are coupled to an actuator 318 that moves one (or more) associated steering lenses through a movement path. The steering layer 306 may include a negative lens, two cooperating negative lenses, a positive lens, two cooperating positive lenses, and/or a negative lens cooperating with a positive lens. The utilization of two lenses in a steering layer 306 allows for steering in two directions simultaneously (e.g., where one lens steers along a first axis and where the second lens steers along a second axis). For convenience of description, many examples throughout the present disclosure describe two steering lenses, where a first lens is moved in a first steering direction and a second lens is moved in a second steering direction. It will be understood that the movement directions of the lenses of a steering layer 306 may align with steering directions, or may be misaligned with the steering directions. For example, where steering is considered in two directions (e.g., an azimuthal direction and an elevation direction), a first example beam steering device 300 includes a first steering lens that moves in the azimuthal direction and a second steering lens that moves in the elevation direction. A second example beam steering device 300 includes the first steering lens that moves in a first direction, and a second steering lens that moves in a second direction, where the first and second direction are not aligned with the steering directions. In a further second example beam steering device 300, the target steering directions and/or the target movement positions of the steering lenses may be transformed (e.g., using a rotation, look-up table, or the like) allowing for steering control in the target steering direction using the movement of both lenses in cooperation. In certain embodiments, the first movement direction and the second movement direction may be perpendicular (whether aligned with the steering axes or not), but the movement directions need not be perpendicular. It will be seen that, where the movement directions are not perpendicular, the overall steering capability of the beam steering device 300 may be lower (e.g., a reduced magnitude of steering capability for one or both steering directions) relative to an equivalent beam steering device 300 having perpendicular movement directions. However, the movement capability of a beam steering device 300 can be provided to have sufficient capability for target steering directions, for example using one or more of (examples are not limiting): enhanced telescopic magnification (e.g., reference FIGS. 3-9); enhanced radial (and/or virtual) magnification (e.g., reference FIGS. 12-14); enhanced displacement of one or more steering lenses (e.g., a greater absolute displacement capability); and/or the utilization alternative steering components (e.g., where multiple steering layers are available, such as depicted in FIGS. 15-23). In certain embodiments, enhancement techniques may be differentiated by moving direction (e.g., a first steering lens having a greater displacement capability than a second steering lens); by steering direction (e.g., a greater capability for a first steering direction, such as azimuthal, relative to a second steering direction, such as elevation); by telescopic magnification capability (e.g., greater magnification in a selected movement direction and/or steering direction); by radial magnification capability (e.g., greater magnification in a selected movement direction and/or steering direction); and/or combinations of these. Lenses described and/or depicted throughout the present disclosure are generally set forth as spherical lenses for convenience of description, but it will be understood that lenses may have differential optical characteristics in a given direction (e.g., aspherical lens, anisotropic lens, negative power and/or positive power of the lens by direction, etc.), and/or may only have optical support for a given direction (e.g., a cylindrical lens).

One of skill in the art, having the benefit of the present disclosure and information ordinarily available when contemplating a particular system, can readily select lens configurations and characteristics for a given embodiment. Without limitation to any other aspect of the present disclosure, certain considerations for determining lens configurations and characteristics include, without limitation: movement capability (displacement and/or speed) of available actuators; orientation of movement directions (to each other, and/or to steering axes); the target steering envelope (e.g., magnitude and/or direction of steering); the available axial footprint of the beam steering device (e.g., axial extent of the steering components and/or a housing defining the steering components); a beam size of the incident beam; a beam size of the steered beam; relative costs of lens components (e.g., spherical, aspherical, anisotropic, astigmatic, positive and/or negative lenses, cylindrical lenses, and/or write-able lenses—e.g. reference FIGS. 36, 37); power throughput of the incident beam and/or an observed beam; heat transfer characteristics and/or active cooling characteristics available for components of the beam steering device (e.g., capital costs, integration costs, footprint costs (e.g., size, weight, systems, interfaces, controls), operating costs, and/or performance effects or limitations); the focusing characteristic of the steered beam progressing through the beam steering device; the number and geometry of available steering paths relative to the number and geometry of steered beams (e.g., where switching of steering responsibility between paths can enhance steering capability, steering response time, heat generation, and/or component utilization—e.g., reference FIGS. 15-25, 39-42, and 44); and/or duty cycles of steering operations (e.g., steering angles and/or frequencies, and or power throughput; including a description of operating times corresponding to these; including consequent effects on steering actuators, component time-at-temperature, cooling system, and the like).

The example beam steering device 300 further includes one or more steering actuator(s) 318 configured to move the steering lenses of the steering layer 306. An example actuator 318 includes a piezoelectric actuator, for example a piezo responsive armature that displaces in response to an applied electric field, thereby moving an associated steering lens. In certain embodiments, a piezoelectric actuator has a modest displacement capability (e.g., a few millimeters), which may be preserved by separating actuators 318 into a first actuator 318 associated with a first steering lens, and a second actuator 318 associated with a second steering lens. Embodiments herein provide for significant steering capability, such that even with modest movement capabilities provided by piezoelectric actuators, highly capable steering (e.g., +/−10 degrees, +/−20 degrees, +/−30 degrees, +/−45 degrees, etc.) can nevertheless be achieved. An example actuator 318 includes an electromagnetic actuator, which may be of any type such as a linear actuator and/or a rotary-to-linear actuator of any type. An example actuator 318 includes an electromagnetic actuator (e.g., reference FIGS. 27-28) capable to steer a lens in one, or both, directions at the same time. Actuators described herein are capable to move a steering lens in a generally linear direction (e.g., along a movement axis and/or a steering axis), although a travelling path of a steering lens need not be linear (e.g., operating a transform between actuator position(s) and target steering directions). An example actuator 318 includes a write-able lens (e.g., reference FIGS. 36, 37, and the related descriptions), for example where movement operations of the steering lens are executed by adjusting a configuration of a write-able lens (e.g., providing a selected electric field to an electro-optical substrate). In certain embodiments, an actuator 318 may differ between a first steering lens and a second steering lens of a steering layer (e.g., a first type of actuator for the first steering lens, and a second type of actuator for the second steering lens), and/or for steering lenses between layers (e.g., a first type of actuator for a first steering layer, and a second type of actuator for a second steering layer). Different actuator types may be included for any reason, including at least providing differential steering capability to each movement direction and/or steering axis (e.g., differential displacement magnitude, steering speed, lifetime actuating cycles, and/or size/weight of steered lenses), and/or providing differential actuators dependent upon the available footprint for each (e.g., utilizing distinct input/output resources; utilizing distinct power resources; having differential sizes available at an actuating location within a system having the beam steering device; having differential integration requirements and/or interfaces to the system; etc.).

The example beam steering device 300 includes a field lens 308. The example field lens 308 is positioned at an intersection of a focal plane of an emission lens 310 and an effective focal plan of the steering layer 306 (e.g., the net focal position of lenses of the steering layer 306. The field lens 308 ensures the steered beam 316 is fully incident on the emission lens 310 (e.g., reducing vignetting losses). The emission lens 310 is the final optical element of the beam steering device 300, whereby the emitted beam 106 is the final steered beam. The emission lens 310 and the field lens 308 can be sized according to the desired steering capability, beam size, and axial length of the beam steering device 300. The emission lens 310 can have a selected optical power to provide the selected convergence/divergence character (e.g., collimated) of the steered beam 106, to provide the selected telescopic magnification (e.g., 1×, 1.5×, 2×, 3×, etc.), and/or selected axial length of the beam steering device 300. The axial positioning of the components of the beam steering device 300, the optical power of the components, and the size of the components, can be selected to provide the appropriate magnification for beam steering capability and steered beam size, and to ensure that the steered beam does not experience vignetting losses.

It will be understood that a system including the beam steering device 300 may have further optics that the emitted beam 106 passes through before emission from the system. The example beam steering device 300 allows for significant steering capability (e.g., +/−8 deg., +/−10 deg., +/−15 deg., +/−20 deg., and/or +/−30 deg.) with an arbitrary aperture and/or emitted beam size. The example beam steering device 300 utilizes telescopic magnification to enhance the beam steering capability and the aperture size, allowing for a greater steering capability and/or steered beam size than available in previously known systems.

Figure 4:
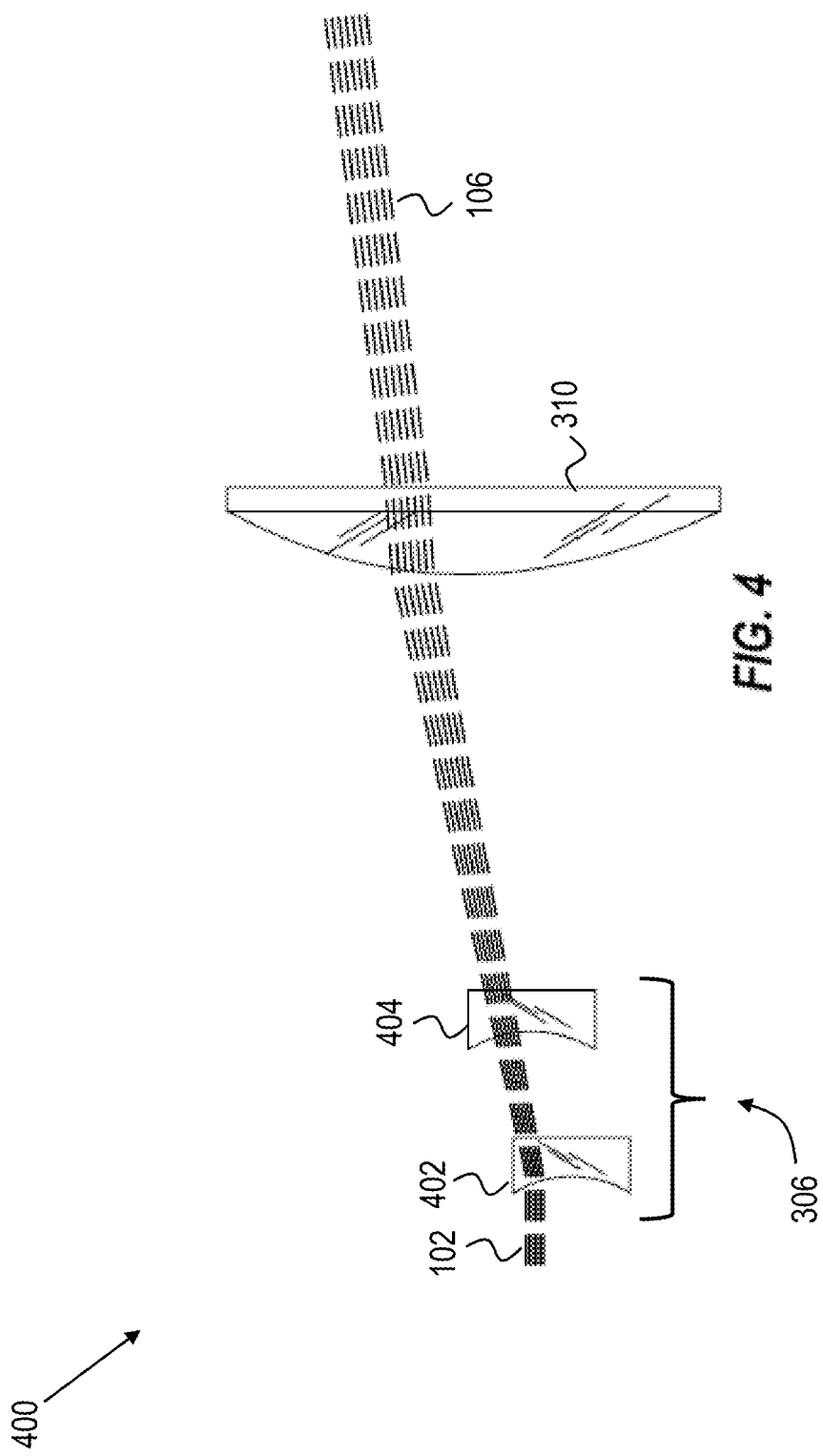
FIG. 4 is another schematic depiction of an example type 3 steering device.

Referencing FIG. 4, an example embodiment of a beam steering device 400 is schematically depicted. The example beam steering device 400 includes a steering layer 306 having two negative lenses 402, 406 that steer an incident beam 102 in two directions, providing the steered beam 106 from an emission lens. The example beam steering device 400 includes a selected telescopic magnification (e.g., the ratios of the focal lengths between the emission lens and the effective lens equivalent of the steering lenses 402, 404), and/or steering capability (e.g., movement capability of the steering layer 306 combined with telescopic magnification). The movement directions of the steering lenses 402, 404 may be perpendicular or offset from perpendicular, and/or may be aligned with steering directions (e.g., one lens 402, 404 controls a first steering direction, and the other lens 404, 402 controls a second steering direction) or offset from the steering directions (e.g., the lenses 402, 404 move in cooperation to provide the selected steering angle(s)).

The utilization of negative lenses 402, 404, as set forth herein, should be understood broadly. The negative lenses include a net effective concave aspect toward the incident light to be steered. While the negative lenses are depicted as concave lenses, it will be understood that the lenses may include any one or more of, without limitation: a concave lens, a net concave lens (e.g., having a concave and a convex portion, with a greater optical effect of the concave portion), a write-able lens (e.g., reference 36, 37, and the related description; also reference varifocal lens as described in PCT Patent Application PCT/US19/57616, entitled "SYSTEM, METHOD, AND APPARATUS FOR NON-MECHANICAL OPTICAL AND PHOTONIC BEAM STEERING" [EXCT-0004-WO], filed 23 Oct. 2019, which is incorporated herein by reference in the entirety for all purposes), and/or a Fresnel lens (e.g., having a net concave aspect).

The example beam steering system includes two of the negative lenses 402, 404 that steer in two directions that are referenced herein as an azimuthal direction (e.g., direction in a horizontal plane) and an elevation direction (e.g., direction in a vertical plane), although an example beam steering system may include only a single negative lens that steers in a selected direction (e.g., where steering in only a single axis is acceptable), a single negative lens that steers in two selected directions, or two of the negative lenses that steer in two selected directions. The two directions may be orthogonal, allowing for a continuous region of steering, or non-orthogonal, which will reduce the continuous region of steering, for example providing for gaps in the steering capability region, but may nevertheless provide for sufficient steering capability in certain embodiments. Additionally, or alternatively, the movement directions of the negative lenses may correspond to the steering directions (e.g., azimuthal and elevation movement corresponding to azimuthal and elevation steering), but they need not. For example, where the two negative lenses are capable to move orthogonally, then the lenses are capable of steering in a direction corresponding to azimuthal and elevation, but may have movement controlled in a transformed space to achieve the desired steering. It can be seen that the steering directions and the lens movement directions may correspond to any selected axes, including neither of the steering or lens movement occurring in a direction corresponding to "azimuthal" or "elevation," although these terms are used herein for convenience and clarity of the description.

In the example of FIG. 4, the size and optical function (e.g., negative optical effect) may be the same or similar, providing for equivalent telescopic magnification and steering capability in each direction. However, the negative lenses need not be identical, for example, if differential telescopic magnification in a given direction is acceptable (or desirable), and/or if anisotropy in the steering direction capability is also acceptable (or desirable). Additionally, the negative lenses may be distinct lens types (e.g., one lens a concave lens, with the other lens corresponding to a variaxial lens or a Fresnel lens), whether the negative lenses 402, 404 have the same functionality or distinct functionality.

In the example of FIG. 4, the negative lenses 402, 404 cooperate in providing an effective, or virtual, focal plane of the negative lenses, that is aligned with a corresponding focal plane of the positive lens, providing for a steered beam, with steering controlled in a first direction by movement of one of the negative lenses, and in a second direction by movement of the other one of the negative lenses 402, 404 (and/or controlled to a selected steering location in a transformed space relative to the movement directions, e.g., reference FIGS. 31-35 and the related descriptions).

It can be seen that FIG. 4 and described variations provide for a number of advantages over previously known steering systems. Further description of some of the features are described following, as well as additional aspects of certain embodiments. However, it is informative to note certain advantageous aspects of the embodiments of FIG. 4 as set forth thus far. Embodiments of FIG. 4 provide for improved resulting effective aperture sizes, as the steered beam is magnified by the cooperative operation the negative lenses 402, 404 and the positive lens 310. Additionally, the telescopic magnification of the embodiment of FIG. 4 serves to enhance the effective steering capability, rather than reduce the effective steering capability as in previously known steering systems. Accordingly, the net improvement in effective steering capability and aperture size is more than proportional to the magnification ratio of the corresponding systems. Further, as the negative lenses 402, 404 can be sized proportionally smaller than the first lens of previously known systems, and the telescopic magnification supports an increasing steering angle, the positive lens 310 can be provided at a reasonable size and still avoid vignette losses. Additionally, as the positive lens (emission lens 310) is not moved in the embodiment of FIG. 4, even where a large positive lens is utilized, it results in fewer disadvantages relative to previously known systems. Further still, the virtual focal plane (e.g., focal plane provided by the effective equivalent lens of the negative lenses 402, 404), and resulting focal point at a given operating configuration, provided by the negative lenses 402, 404 does not result in a physical focus, or concentration, of the steered beam. Instead, the beam experiences a smooth divergence throughout steering operations, with a net diffusion, but not convergence or divergence (i.e., the collimated light remains collimated if desired), after exiting the positive lens as a steered beam. Accordingly, the embodiment of FIG. 4 is capable of a higher power throughput than previously known systems, as there are no concentrations of the steered energy that may result in hot spots or other limitations due to the concentration of energy at a focal point. Additionally, the embodiment of FIG. 4 results in a reduced axial distance between the first and second lens portions (e.g., between the first lens and the second lens of previously known embodiments, or between the negative lenses and the positive lens of the embodiment of FIG. 4), for a given steering capability.

While the embodiment of FIG. 3 shows a compensating divergence of the negative lenses and convergence of the positive lens, it will be understood that net divergence or convergence of the steered beam 106 may be acceptable, or desirable, for certain systems and/or at certain operating conditions. Additionally or alternatively, the net convergence or divergence in each steered axis may be varied, if desired and/or acceptable, and/or may be eliminated for one axis but not the other.

For the embodiments of FIGS. 3 and 4, movement of the lenses of the steering layer 306 results in a steering amount as set forth in Equation 4:

$$\theta_i = \tan^{-1}\left(\frac{M\Delta_i}{f_n}\right).$$  Eq. 4

Steering angle for example embodiments

Equation 4 sets forth the displacement for a given steering axis, and may be separated into a first component for the first negative lens 402, and a second component for the second negative lens 404. The value M is the net telescopic magnification for the steering system, the value A, is the component displacement (for the respective negative lens 402, 404), and $f_n$ is the effective negative focal length, which is a composite of the individual focal lengths of the series negative lenses 402, 404.

It can be seen from Equation 4 that telescopic magnification in the embodiments of FIGS. 3 and 4 increases the steering capability of embodiments of the steering device herein, in contrast to previously known systems where magnification >1 reduces the steering capability.

An example system includes two negative lenses each having an $f_n$ of −40 mm, and a radius of 7.5 mm, and a larger positive lens having a focal length of 50 mm and a radius of 18.867 mm. In the example arrangement, an axial distance between the positive lens and a closest negative lens may be about 24.876 mm, which may be readily determined by one of skill in the art contemplating a particular system, and having selected appropriate negative lenses and positive lenses, and aligning the effective focal plane of the negative lenses with the focal plan of the positive lens. In the example wherein one of the negative lenses provides a displacement of 1 mm, application of Eq. 4

$$\left(\tan^{-1}\left(\frac{18.67*1}{7.5*40}\right)\right) \text{ of } +/- 0.063 \text{ radians,}$$

or 3.62° of steering. If the magnification is increased to 5, then 1.5 mm of displacement provide $$\left(\tan^{-1}\left(\frac{5*1.5}{1*40}\right)\right) +/- 0.185 \text{ radians,}$$

or 10.62 degrees. Note that, in the example, the other negative lens may have a slightly different configuration and resulting steering performance. For example, in one embodiment the first negative lens may have a radius of 7.5 mm, and the second negative lens may have a slightly larger radius (e.g., 7.596 mm, or ~7.6 mm), which may result in slightly different values for the component performance of Eq. 4 corresponding to the second steered axis. In certain embodiments, the positive lens may have an anisotropic characteristic (e.g., an elliptical shape, anisotropic focal length—e.g., utilizing an anisotropic optical material, a configured Fresnel lens, and/or a configured variaxial lens, or the like) to deliver equivalent performance in each steering direction, and/or a steering controller may utilize movement commands for each negative lens that compensate for variabilities in steering commands. In certain embodiments, for example when any of the parameters of Eq. 4 have a frequency dependency (e.g., a frequency of the electromagnetic radiation of the steered beam), a temperature dependency, a voltage dependency, or the like, a steering controller may compensate for those dependencies in the provision of steering commands.

Figure 5:
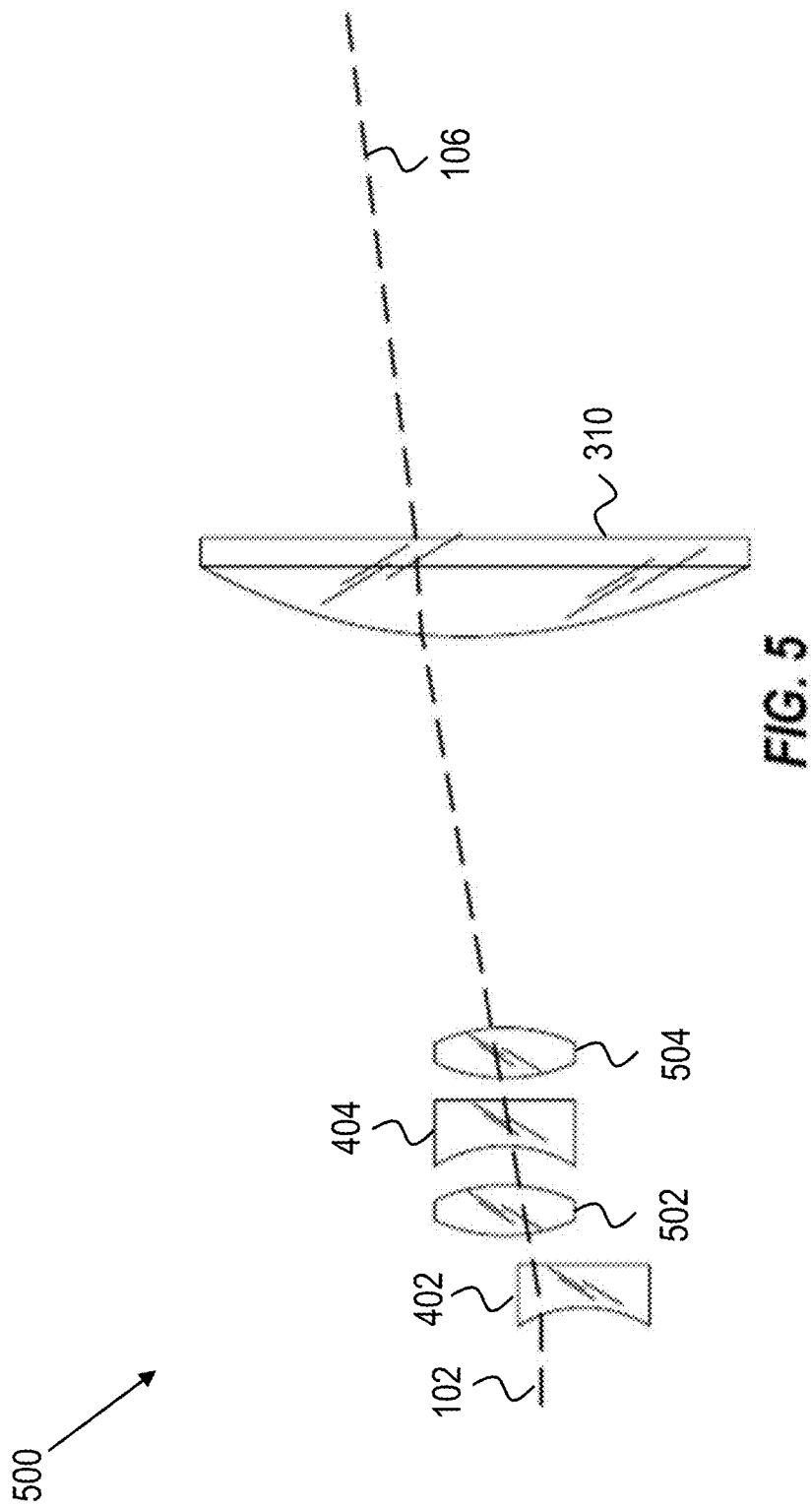
FIG. 5 is another schematic depiction of an example type 3 steering device.

Referencing FIG. 5, an example beam steering device 500 includes one or more field lenses 502, 504 may be provided, allowing for a reduction in the size of the positive lens 310, and a minor reduction in the axial length of the steering system. The field lenses 502, 504 are depicted as closely coupled to the negative lenses 402, 404, but the field lens(es) 502, 504 may be positioned anywhere downstream of the negative lenses 402, 404, and/or individually downstream of the corresponding negative lens (e.g., field lens 502 downstream of negative lens 402), but upstream of the emission lens 106. The close coupling of the field lens(es) to the steering lenses may allow for a reduction in the size of the field lens(es). In certain embodiments, it may be desirable to tune the focal lengths of the lenses (e.g., steering lenses, negative lenses, field lens(es), and/or positive/emission lens) based on the presence of the field lens(es) relative to embodiments without the field lens(es), and/or based on the size and/or position of the field lens(es).

Field lenses 502, 504 may be positioned as shown in FIG. 5, with a single field lens (e.g., one of the depicted field lenses), and/or with an additional field lens upstream of the negative lenses. Example and non-limiting arrangements are described following, to illustrate some of the adjustments that may be made in certain embodiments having one or more field lenses. The examples illustrate some of the parameters that may be adjusted, but are not limiting descriptions.

An example includes a single field lens positioned between the negative lenses, with the first negative lens having a radius of 7.5 mm and a focal length of −40 mm, the field lens having a radius of 7.547 mm and a focal length of 141.277 mm, the second negative lens having a radius of 7.58 mm and a focal length of −40 mm, and the positive lens having a radius of 16.714 mm and a focal length of 51.65 mm. In the example, an axial distance between the positive lens and a closest negative lens may be about 23.225 mm.

Another example includes two field lenses, arranged as depicted in FIG. 4, with a first negative lens having a radius of 7.5 mm and a focal length of −40 mm, the first field lens having a radius of 7.547 mm and a focal length of 157.503 mm, the second negative lens having a radius of 7.582 mm and a focal length of −40 mm, the second field lens having a radius of 7.664 mm and a focal length of 107.865 mm, and the positive lens having a radius of 13.494 mm and a focal length of about 52.286 mm. In the example, an axial distance between the positive lens and a closest negative lens may be about 22.59 mm.

It can be seen that the embodiments set forth in FIGS. 3-5 provide for high capability steering, with relatively small displacement of the negative lens(es). The example embodiments described magnification ranges between about 2.5 to 5, with steering capabilities between about 3 degrees per mm displacement to about 6 degrees per mm of displacement. Magnification ranges can be readily provided below about 2.5 (e.g., to increase steering accuracy where high steering capability is not required or desired) and/or to values of 10, 20, or greater, with corresponding increases in the steering capability and resulting effective aperture size. The magnification value may be selected based upon input light density, output light density targets, steering capability desired, aperture size desired, or the like. Additionally or alternatively, a number of steering assemblies such as those depicted in FIGS. 3-5, or as described herein, may be provided (e.g., as a lenslet array). In certain embodiments, embodiments of a steering device can readily be provided having a steering capability of +/−5 degrees, +/−10 degrees, +/−15 degrees, +/−20 degrees, and/or +/−30 degrees. In certain embodiments, a steering device can be designed with greater than 30 degrees of capability, including up to about 60 degrees of steering capability.

It will be understood, as described in further detail following, that certain steering capability values interact with frequency response values of mechanical steering components, providing for a reduced steering frequency capability at high steering capability angles (e.g., >20 degrees, >30 degrees, or more), and/or requiring a high degree of magnification at high steering capability angles. High magnification requirements can result in large components (e.g., of the positive lens), increased footprint of the beam steering device, and/or reduced steering precision. Accordingly, the steering capability, steering frequency capability, and magnification requirements are related in a multi-dimensional space, where any one of the capabilities (e.g., aperture size, steering capability, power throughput capability, and/or steering frequency capability) can be provided at almost any value, while at extreme capability values, one or more of the other capabilities and/or the telescopic magnification requirement become more constrained. In certain embodiments, steering capability values up to about +/−20 degrees can be provided with modest magnification requirements (e.g., 5× to 20×, without limitation) and high frequency capability (e.g., up to at least several kHz), where extreme steering capabilities (e.g., greater than +/−30 degrees) are possible at more limited frequency capabilities (e.g., up to about 100 Hz) and/or with greater magnification (e.g., 20× to 50×) and consequent increases in the beam steering system footprint and/or reduction in steering precision. One of skill in the art, having the benefit of the present disclosure, can readily design a steering system as set forth herein to meet desired capabilities within the multi-dimensional space, in accordance with Eq. 4 and other considerations set forth herein, and that will be understood to that person having knowledge of available optical components, mechanical steering components, and information about the contemplated system. Certain considerations for determining a particular configuration for a system include, without limitation, optical characteristics of available lenses, mechanical displacement capabilities and constraints, available footprint for the steering system (e.g., axial size; diameter; weight; power provision; cooling provision; and/or control capabilities including I/O, available sensors, and/or available actuators), capital cost considerations, operating cost considerations, and/or manufacturing constraints (e.g., tolerances of components, available materials, available operations such as machining, coating, finishing, etc.).

It will be understood that the aperture size and final steered beam size can be configured according to the incident beam size 102, the applied telescopic magnification (e.g., as described in relation to type 3 steering devices herein), and/or the lens sizes of steering components. Certain aspects that increase the emitted beam size relative to the aperture size (e.g., where aperture size corresponds to the emission lens 310, where emitted beam size to aperture size may be referenced as aperture utilization) include aspects that increase a common area between steering lenses (e.g., determined according to a maximum displacement, size, and/or axial displacement of the steering lenses; and/or further determined according to an inclusion of field lens(es) between steering lenses). Accordingly, one or more design aspects can increase the aperture utilization include: increasing the size of one or both of the steering lenses; increasing a telescopic magnification (e.g., type 3) of the beam steering device (e.g., which reduces the required displacement to achieve a given steering capability, and increases the beam size through magnification); utilizing a field lens between the steering lenses (e.g., reference FIG. 5) which increases the effective common area between the steering lenses; and/or increasing a radial magnification (or virtual displacement; e.g., type 1) of the beam steering device (e.g., which reduces the required displacement to achieve a given steering capability).

For convenient reference, embodiments of a beam steering device according to FIGS. 3-11 and the related descriptions may be referenced as a type 3 steering device. Any one or more aspects of the following embodiments may be incorporated with or combined with any one or more of embodiments set forth throughout the present disclosure, including aspects of a type 3 steering device combined with aspects of another type of steering device (e.g., type 1 such as described in reference to FIGS. 12-14, and/or type 2 such as described in reference to FIGS. 15-25). The description utilizing types is provided for clear illustration of certain concepts of the present disclosure, and is not limiting to embodiments described herein. Accordingly, a beam steering device may include elements from one or more of the types, for example utilizing type 3 components for steering in a first direction, and type 1 components for steering in the second direction. Type 2 beam steering devices may include steering elements each configured according to a type 3 configuration, a type 1 configuration, combinations of these, and/or configurations of steering components using elements described herein regardless of the relationship of the steering components to a type 3 and/or type 1 configuration. In certain embodiments, a type 3 steering device utilizes telescopic magnification to enhance steering operations of the beam steering device. In certain embodiments, a type 1 steering device utilizes radial magnification (and/or displacement of a virtual image) to enhance steering operations of the beam steering device. Additionally, or alternatively, one or more aspects of the preceding embodiments may be incorporated with or combined with any one or more aspects of embodiments described throughout the present disclosure.

Figure 6:
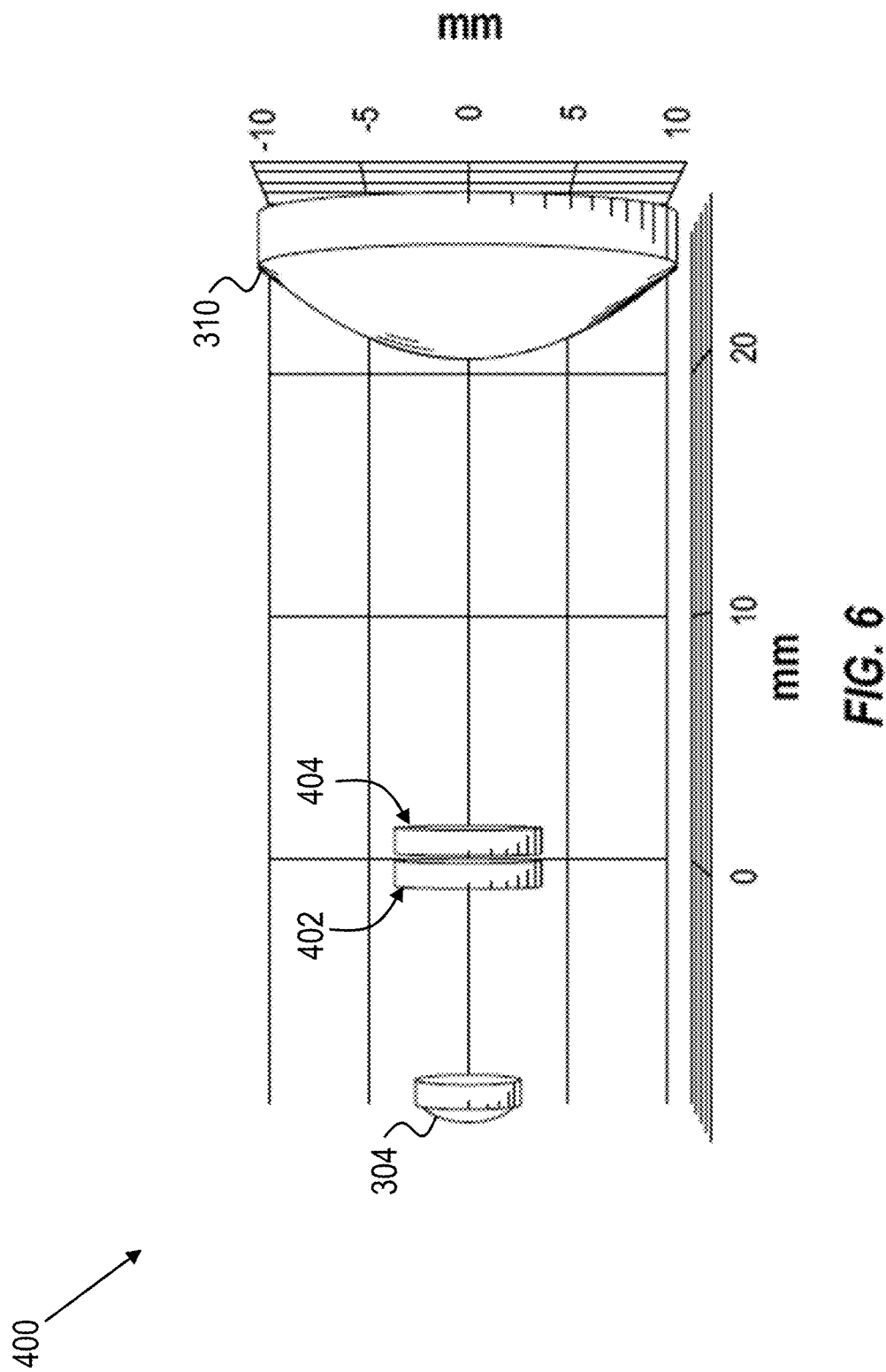
FIG. 6 is another schematic depiction of an example type 3 steering device.

FIG. 6 depicts an embodiment as an example type 3 beam steering device 400, consistent with aspects of embodiments set forth in FIG. 4 and the related description. As seen in FIG. 6, the steerer consists of three lenses; two small moving negative lenses 402, 404 and one fixed larger positive lens 310. Displacement of those two negative lenses 402, 404 can be done by a variety of methods, such as small electromagnetic motors, piezoelectric actuators, and/or changing a position of a write-able lens as one or both of the negative lenses 402, 404. An example beam steering device 400 further includes a collimator lens 304, having selected optical power to adjust the convergence/divergence characteristic of the incident beam 102, including for example an aspherical lens to adjust a fiber laser EM source into a collimated beam.

Figure 7:
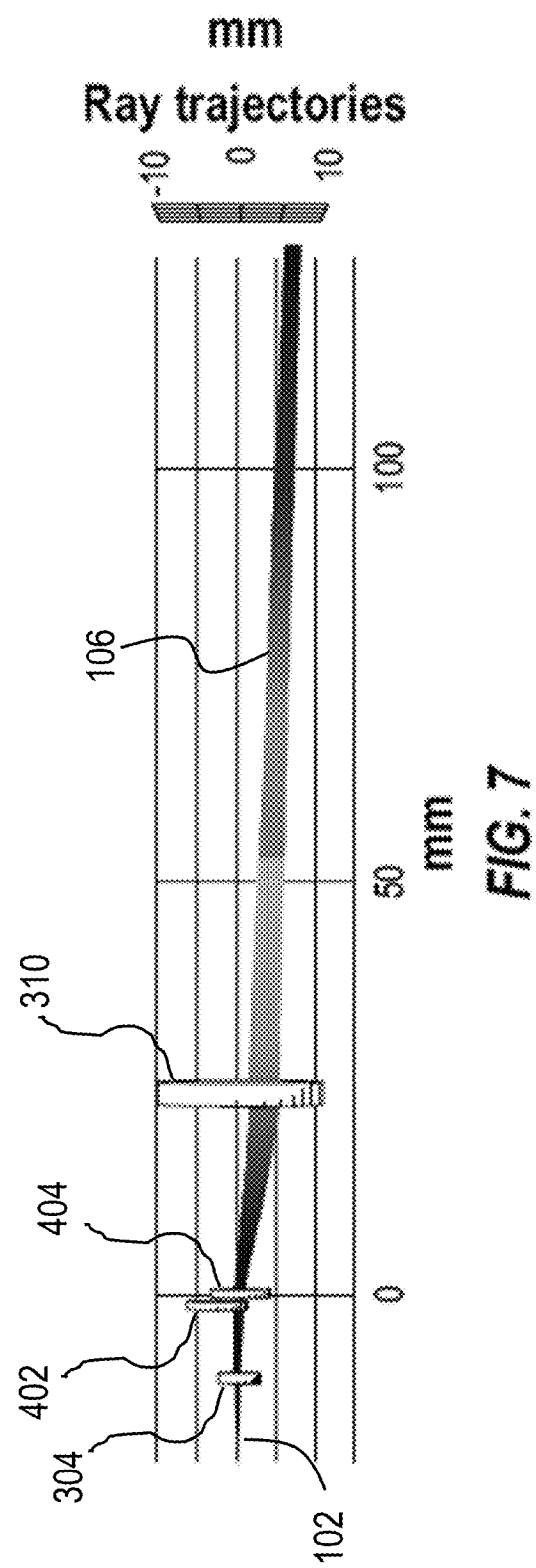
FIG. 7 is an illustrative capability of a type 3 steering device.

According to any aspect of the present disclosure, the steering lenses 402, 404 can be estimated as an equivalent lens having effective optical activity equivalent to the steering lenses 402, 404. For example, a single negative lens with a moving focal point may be considered as an estimate for the two moving negative lenses 402, 404. The focal plane of the equivalent conceptual lens coincides with a focal plane of the emission lens 310. An example performance of the example beam steering device of FIG. 6 is depicted in FIG. 7, where the example steering is depicted in only a single direction (via displacement of negative lens 402, in the example) for clarity of the present description.

The angle of deflection in x and y axes (e.g., where the x axis aligns with a movement direction of a first steering lens, and where the y axis aligns with a movement direction of a second steering lens) are related to the displacement in those directions ($\Delta_x$ and $\Delta_y$), and the focal length ($f_r$) of the recollimator lens 310 as follows in Equations 5 and 6:

$$\theta_x = \pm\tan^{-1}\left(\frac{\Delta_x}{f_r}\right) \quad \text{Eq. 5}$$

Deflection angle of steered beam in the "x" direction $$\theta_y = \pm\tan^{-1}\left(\frac{\Delta_y}{f_r}\right) \quad \text{Eq. 6}$$

Deflection angle of steered beam in the "y" direction

As set forth throughout the present disclosure, the x and y directions of the two steering lenses may be aligned with the logical steering axes of the beam steering device (e.g., the desired direction reference frame for steering nomenclature), and/or may be un-aligned with the logical steering axes. Additionally or alternatively, the x and y directions may be perpendicular, and/or may be mis-aligned. In certain embodiments, the mis-alignment of the x and y directions, and/or the perpendicularity of the x and y directions, may be due to design considerations (e.g., positioning of actuators in a confined space, ease of accommodation of movement, etc.), and/or due to manufacturing considerations (e.g., allowing for manufacturing tolerances of installation of actuators and/or lens movement direction; allowing for installation with lens movement within a range and/or at arbitrary directions—for example to simplify installation and/or integration; and/or allowing for a change of the logical steering axes after the installation and/or integration of the beam steering device into a system).

Figure 8:
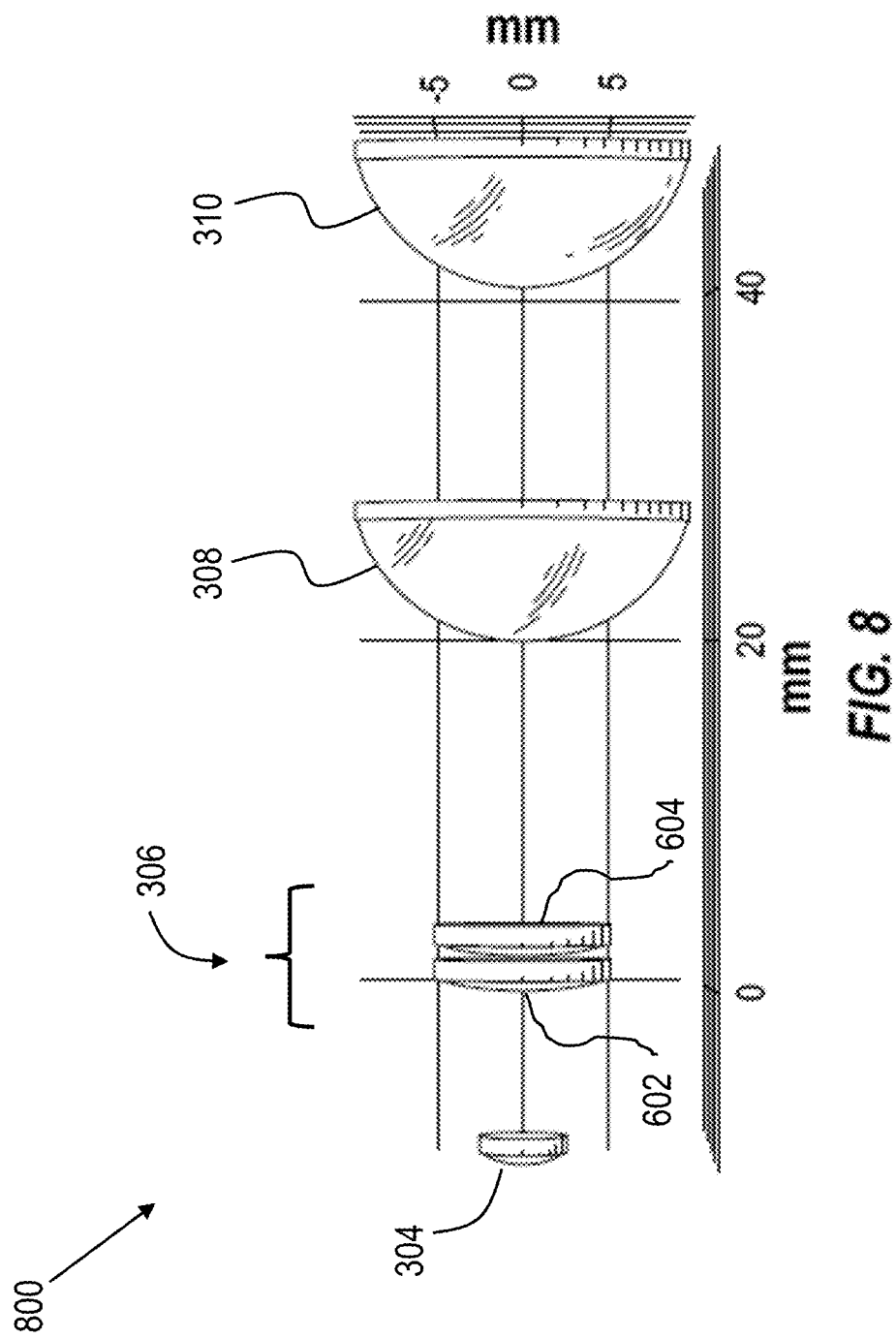
FIG. 8 is another schematic depiction of an example type 3 steering device.

Referencing FIG. 8, an example beam steering device 800 including a steering layer 306 having a first positive lens 602 and a second positive lens 604. As seen in this FIG. 8, the beam steering device 800 includes four lenses, two small moving positive lenses 602, 604, one fixed positive field lens 308, and one fixed positive recollimator/emission lens 310. An actuator displaces each positive moving lens 602, 604 in the respective movement direction (e.g., perpendicular or not, and aligned with logical steering axes, or not). In certain embodiments, a collimator lens 304 is provided to provide a selected convergence/divergence characteristic to the incident EM beam 102.

In the example of FIG. 8, the positive lenses 602, 604 may be estimated as an equivalent positive lens, with a moving focal point equivalent to the two moving positive lenses 602, 604. The focal plane of that effective equivalent positive lens and the focal plane of the fixed positive recollimator/emission lens 310 coincide. The fixed positive field lens 308 is located at the focal plane of the fixed positive recollimator lens 310 (and, accordingly, at the focal plane of the effective equivalent positive lens). The example beam steering device 800, having an equivalent steering capability and beam size for a corresponding beam steering device 400, 500 (e.g., reference FIGS. 4-6), may have a greater axial footprint relative to the corresponding beam steering device 400, 500—for example the focal plane of the effective equivalent positive lens of FIG. 8 will be downstream of the steering layer 306, compared to the focal plane of the effective equivalent negative lens of FIG. 4, which will be upstream of the steering layer 306. The position of the focal plan of the effective equivalent lens (positive or negative) contributes to the axial footprint of the beam steering device 400, 800. An example performance of the example beam steering device of FIG. 8 is depicted in FIG. 9, where the example steering is depicted in only a single direction (via displacement of negative lens 602, in the example) for clarity of the present description.

Figure 9:
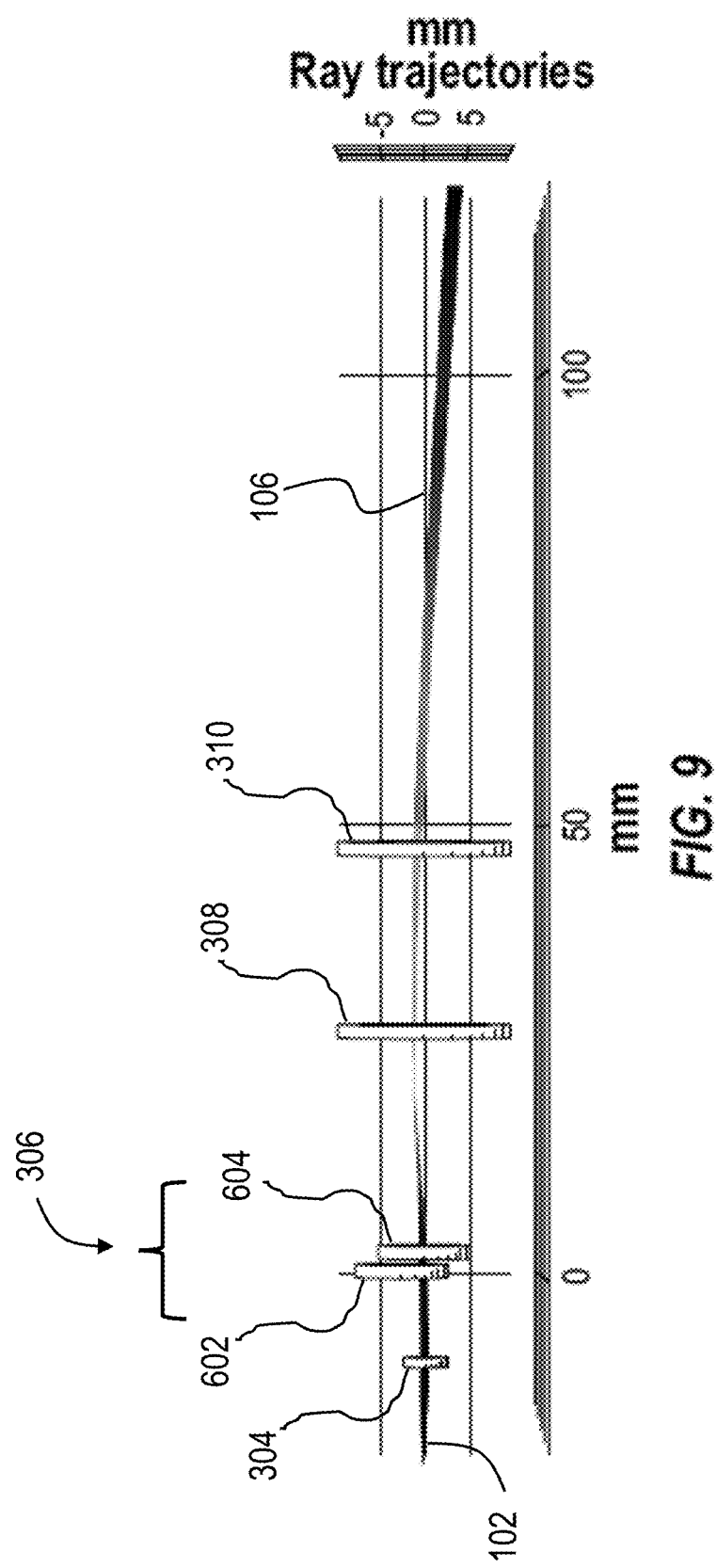
FIG. 9 is an illustrative capability of a type 3 steering device.
Figure 10:
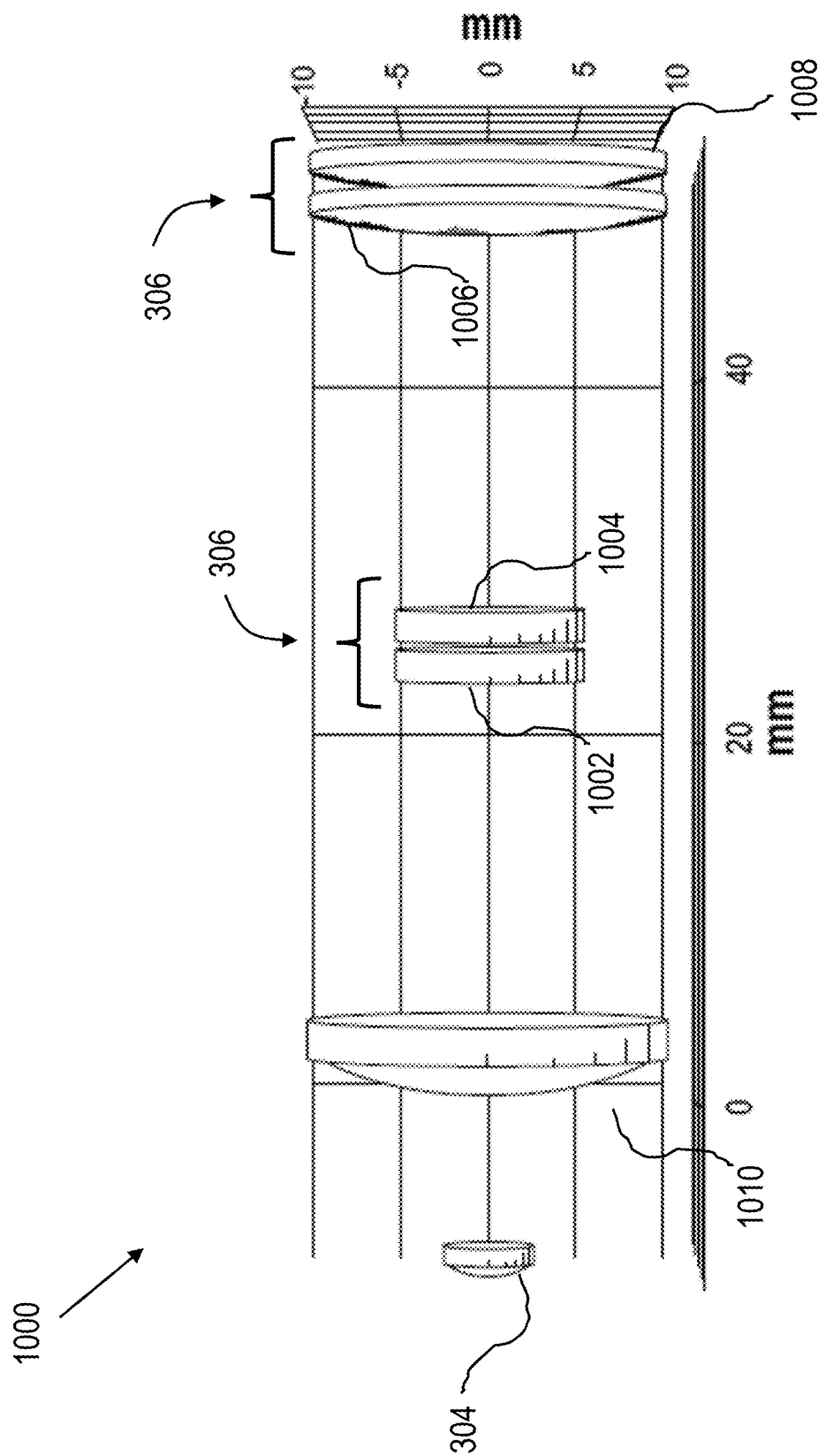
FIG. 10 is another schematic depiction of an example type 3 steering device.

With regard to the example of FIGS. 8 and 9, the angle of deflection in the x and y axes (e.g., corresponding to a movement direction of the first and second steering lens, respectively) is related to the displacement in each of the x and y directions, and the focal length of the recollimator lens as described in Equations 5 and 6. Referencing FIG. 10, an example beam steering device 1000 includes two steering layers 306, each having one or more steering lenses coupled to respective actuators. The steering lenses and actuators may be of any type as set forth throughout the present disclosure. The example steering device 1000 includes the first steering layer 306 (e.g., left-most steering layer) including two negative steering lenses 1002, 1004, and the second steering layer 306 (e.g., right-most steering layer) including two positive steering lenses 1006, 1008). In the example of FIG. 10, one of the positive steering lenses 1008 further operates as an emission lens 310, although an additional emission lens 310 may be provided if desired. The example beam steering device 1000 includes a fixed positive lens 1010 provided upstream of the two negative steering lenses 1002, 1004. The example beam steering device 1000 may further include an optional collimator lens 304, for example to configure the incident EM beam 102. The beam steering device 1000 displaces each negative steering lens and each positive steering lens, utilizing actuators (not shown) operatively coupled to each steering lens 1002, 1004, 1006, 1008. The movement of each pair of steering lenses may be aligned (e.g., with the logical steering axis, and/or with each other) or un-aligned, and additionally one or both steering layers 306 may include perpendicular movement of each steering lens (e.g., 1002 movement direction ⊥ to 1004 movement direction, and/or 1006 movement direction ⊥ to 1008 movement direction), or non-perpendicular movement for one or both steering layers.

In the example of FIG. 10, the first steering layer 306 (e.g., left side negative lens pair in the example of FIG. 10) can be estimated with an equivalent effective negative lens having a moving focal point, and the second steering layer 306 (e.g., right side positive lens pair) can be estimated with an equivalent effective positive lens also having a moving focal point. The fixed positive lens 1010 sits at an axial displacement of ½ $F_{fp}$ (the focal length of the fixed positive lens 1010) from the equivalent effective negative lens, and at an axial displacement of $F_{fp}$ from the equivalent effective positive lens. In the example of FIG. 10, the focal length of the equivalent effective positive lens is equal to the focal length of the fixed positive lens 1010, and the focal length of the equivalent effective negative lens is equal to $$\frac{-F_{fp}}{4}.$$

Figure 11:
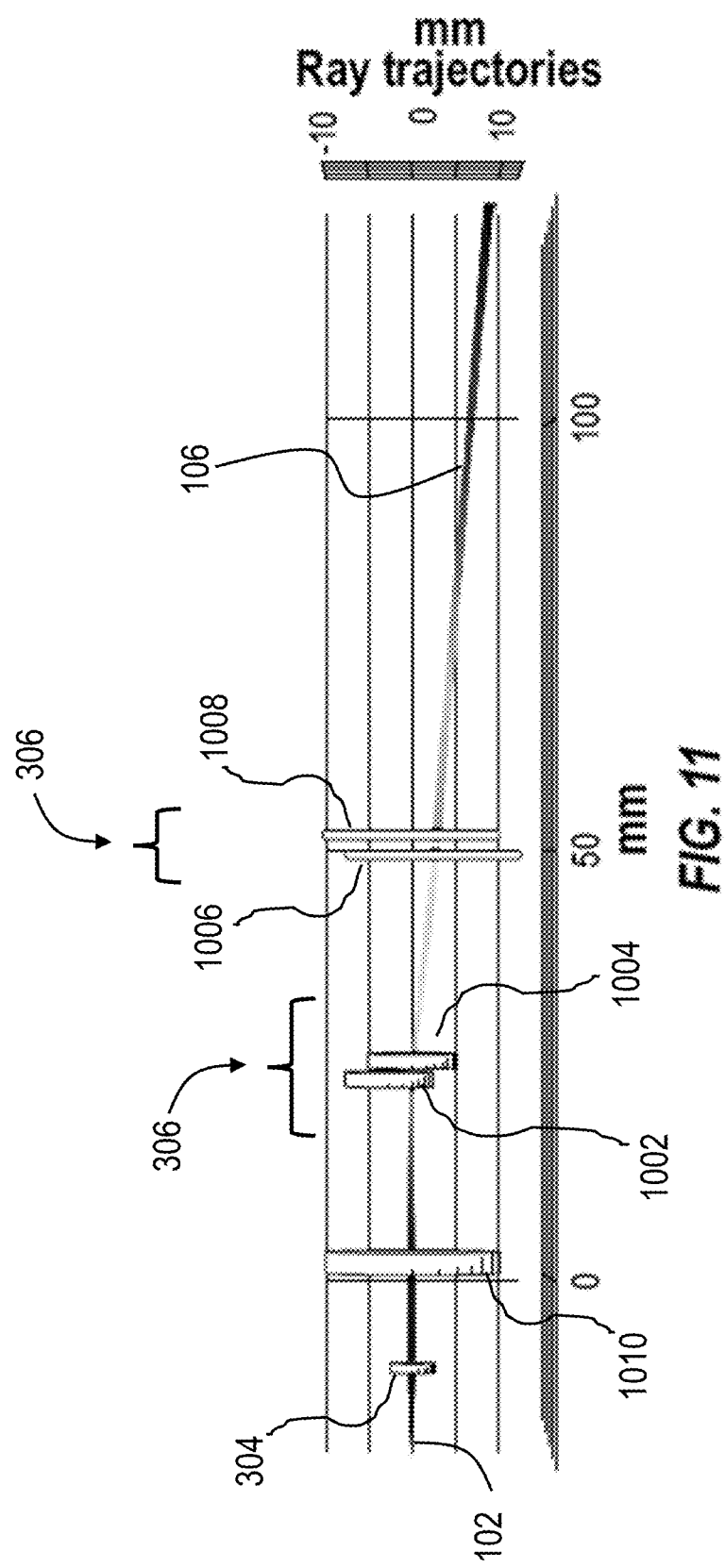
FIG. 11 is an illustrative capability of a type 3 steering device.

Accordingly, the fixed positive lens 1010 is located at the focal plane of the equivalent effective positive lens. An example beam steering device 1010 includes the focal length of each moving negative lens 1002, 1004 as half of the focal length of the fixed positive lens 1010. An example beam steering device 1010 includes the focal length of each moving positive lens as twice the focal length of the fixed positive lens 1010. The example beam steering device 1000 is non-limiting, and each steering layer 306 may include positive lenses, negative lenses, or combinations thereof. In certain embodiments, the first beam steering layer 306 (the left layer) has a net negative optical power, and the second beam steering layer 306 (the right layer) has a net positive optical power. An example performance of the example beam steering device of FIG. 10 is depicted in FIG. 11, where the example steering is depicted in only a single direction (via displacement of negative lens 1002 and positive lens 1006, in the example) for clarity of the present description. The steering capability of the example beam steering device 1010 in each direction is a function of the telescopic magnification (e.g., determined according to the optical power of the lenses steering in the given direction) and the displacement. Accordingly, for equivalent steering capability in each direction and with equivalent displacement capability of steering lenses, the lens focal power in each direction should be equivalent. If steering capability is distinct (e.g., different in each direction) and/or if displacement capability is distinct, the lens power in each direction may likewise be distinct.

In the example of FIG. 10, the moving negative and positive lenses are depicted moving in opposite directions to support steering in a given direction (e.g., lenses of the steering layers are moving cooperatively). In the example of FIG. 10, the steering layers 306 utilize corresponding steering lenses (e.g., first negative lens 1002 and first positive lens 1006) to cooperate and provide steering capability for a given direction. It will be understood that movement may be in the same or opposing directions (e.g., depending upon the positive/negative optical power of the corresponding lenses, and/or the control scheme selected that may utilize counter movement during at least certain operating conditions). It will be understood that movement between layers may be in the same direction (e.g., first negative lens 1002 and first positive lens 1006 aligned) and/or in distinct directions (e.g., a first steering target pursued by operations of the first steering layer, and a second steering target pursued by operations of the second steering layer, where the overall first steering target and second steering target provide steering to a selected position according to a final steering target for the beam steering device 1000). It will be understood that corresponding steering lenses may include similarly positioned steering lenses (e.g., first negative lens 1002 cooperates with first positive lens 1006 to provide steering for a given direction) and/or non-similarly positioned steering lenses (e.g., first negative lens 1002 cooperates with second positive lens 1008 to provide steering for a given direction). It will be understood that transformations between lens steering movement directions and/or a final steering target of the beam steering device 1000 may be performed according to each steering layer (e.g., the final steering target is transformed into a first steering target for the first layer, and a second steering target for the second layer), according to each cooperating lens pair (e.g., the final steering target is transformed into a first steering target for a lens pair such as 1002, 1006, and a second steering target for the other lens pair such as 1004, 1008), and/or according to any other operations set forth herein. Distribution of steering responsibility between cooperating lens pairs (e.g., burden of steering in a given direction shared between lens 1002 and cooperating lens 1006) and/or between the steering layers (e.g., burden of steering shared between (left) first steering layer 306 and (right) second steering layer 306) may be performed according to any operations set forth in the present disclosure, for example reference FIGS. 29-35 and the related description). Without limitation to any other aspect of the present disclosure, operations to distribute steering responsibility between available steering components (e.g., between cooperating lens pairs, between lens layers, and/or between actuators where more than one steering solution is available, such as when movement directions are not aligned with logical steering axes, and/or when movement directions are not fully perpendicular) include one or more operations such as: utilizing a first one of the components before utilizing the second one of the components (e.g., utilizing a faster one of the components during transient operations, utilizing one of the components until saturated and/or at a threshold actuation amount, then utilizing the other one of the components); utilizing a first one of the components alternated with the other one of the components (e.g., utilizing a piece-wise scheduling of the components, alternated through the steering range); utilizing both components simultaneously (e.g., according to a look-up table or other stored steering information, which may include target steering angles and corresponding actuator positions for each of the components, where both actuators are moved from a present position to the corresponding actuator position for the target steering angle); and/or combinations of these. Without limitation to any other aspect of the present disclosure, operations to distribute steering responsibility between available steering components include trimming the actuator positions after the target steering angle is achieved, and/or adjusting the actuator positions for the same target steering angle at a different time or operating condition. Example operations include utilizing a first distribution scheme to achieve a transient steering target, and utilizing a second distribution scheme to achieve the same steering target at a different time (e.g., with different starting conditions for the components when the same steering target is requested at the different time), and/or after a period of time where the steering target is held (e.g., changing the actuator positions as the steering target is held, for example to un-saturate a steering component, to adjust the conditions to allow for a more rapid exit from the steering target (e.g., utilizing a small lens to achieve the steering target, and sharing some of the steering burden to the larger lens as the steering target is held thereby extending the available range of the small lens for better response to future steering target changes).

The available angle of deflection in the x and y axes are related to the displacements of the steering lenses of the steering layers 306. Where the corresponding lenses in each layer have a same movement direction (e.g., lens 1002 and lens 1006 move in a same direction "x"), and where the (left) first steering layer 306 utilizes negative lenses and where the (right) second steering layer 306 utilizes positive lenses, the available angle of deflection in each of the x and y axes are set forth in Equations 7 and 8. Where the arrangement of beam steering device is different than the conditions described for Equations 7 and 8, adjustments to the equations may be readily made to determine the available angle of deflection in each direction. In Equations 7 and 8, $f_r$ is the focal length of the effective equivalent positive lens, $\Delta_1$ references movement of the steering lens from the (left) first steering layer 306, and $\Delta_2$ references movement of the steering lens from the (right) second steering layer 306.

$$\theta_x = \pm \tan^{-1}\left(\frac{2\Delta_{1x} + \Delta_{2x}}{f_r}\right). \quad \text{Eq. 7}$$

Deflection angle capability of an example steering device in an x direction $$\theta_y = \pm \tan^{-1}\left(\frac{2\Delta_{1y} + \Delta_{2y}}{f_r}\right). \quad \text{Eq. 8}$$

Deflection angle capability of an example steering device in a y direction

It can be seen that the example beam steering device 1000 depicted in FIG. 10 can be utilized to create a beam steering device 1000 having a compact axial extent. For example, the axial extent of the beam steering device 1000 between the fixed positive lens 1010 and the effective equivalent positive lens (e.g., between lenses 1006, 1008) is $f_r$, a distance which might be $2f_r$ in other embodiments. The example depicted in FIG. 10 additionally does not include focusing of the steered beam on any component (e.g., reference FIG. 13, wherein focusing occurs on a field lens 308), allowing for a greater range of power throughput, and/or a reduction in cooling or other heat transfer considerations. The example depicted in FIG. 10 includes four steering lenses and four corresponding actuators, with two of the actuators steering large, positive lenses (e.g., (right) second steering layer 306). In certain embodiments, disadvantages associated with movement of large lenses and/or multiple actuators can be mitigated utilizing one or more of the following: 1) distributing a greater portion of steering responsibility onto smaller lenses of cooperating lens pairs; 2) distributing a greater portion of steering responsibility onto the (left) first steering layer 306 relative to the (right) second steering layer 306; and/or reducing or eliminating steering capability in a selected direction (if applicable for the steering requirements of the given system).

One of skill in the art, having the benefit of the present disclosure and information ordinarily available when contemplating a particular system, can readily determine an arrangement of steering layer(s), corresponding actuator(s), a distribution of steering responsibilities between components (e.g., steering layers and/or steering lenses), and/or a configuration of supporting steering components (e.g., collimating lenses, field lenses, etc.). Determined arrangements may be provided in accordance with any embodiments herein, including utilization of portions thereof, an including, without limitation, utilization of type 3 characteristics, type 1 characteristics, and/or combinations of these. Certain considerations to determine an arrangement of steering layer(s), corresponding actuator(s), distribution of steering responsibility between components, and/or configuration of supporting steering components include, without limitation: the cost and availability of lens types; the manufacturing tolerances of system aspects (e.g., lens characteristics; actuator position and alignment, including for the actuator during operation and/or installation); the available footprint for lenses and/or actuators (e.g., geometry, weight, and/or interfaces such as cooling, electrical power, communicative coupling, etc.); capital costs for a design (e.g., cost of components, cost of integration and/or engineering work, cost of tools to make a particular design, etc.); operating costs for a design (e.g., efficiency/power losses; wear and/or maintenance of components such as actuators; reliability and/or down-time considerations, etc.); and/or required and/or desired steering capability considerations (e.g., steering angle magnitudes, steering angle precision, steering speed, directional aspects of these; and/or steering duty cycle as expected or defined).

Figure 12:
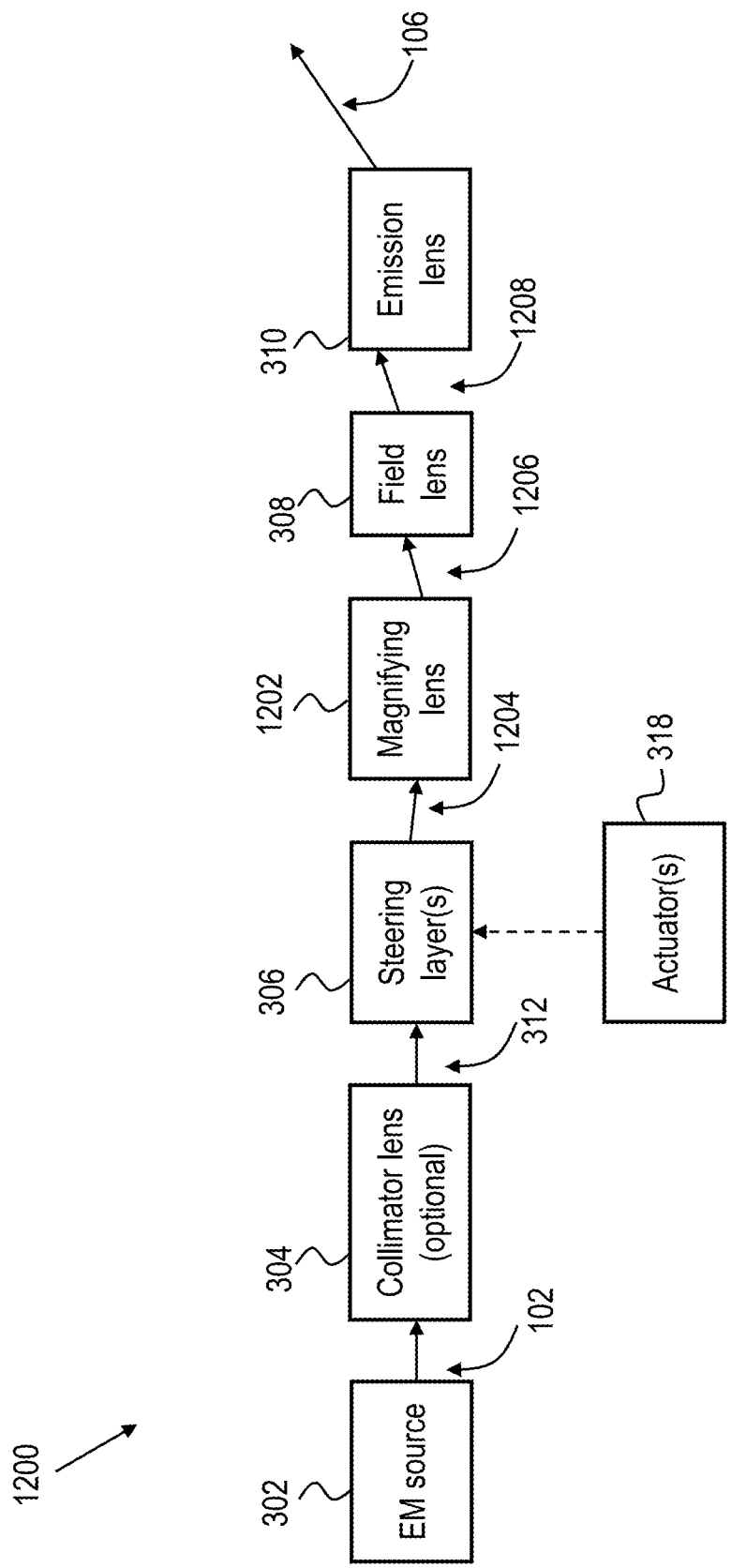
FIG. 12 is a schematic depiction of an example type 1 steering device.

Referencing FIG. 12, an example beam steering device 1200 is schematically depicted, having a number of aspects as set forth throughout the present disclosure. The example beam steering device 1200 overcomes and/or mitigates a number of drawbacks of previously known steering systems, including at least small steering angles, small steering apertures, low steering speeds (and/or frequencies), and/or a requirement for high capability actuating elements for steering lenses.

Aspects of the example beam steering device 1200 are similar to the beam steering device 300 depicted in reference to FIG. 3, with certain changes as described following for certain embodiments, and adjustments to common features (e.g., actuator 318) according to the capabilities and aspects of the example beam steering device 1200. The example beam steering device 1200 may be referenced as a type 1 steering device herein for convenience of the description. A given beam steering device may include aspects of a type 3 steering device and/or a type 1 steering device, without limitation to examples set forth herein to illustrate certain principles of the present disclosure. An example type 1 steering device, as utilized herein, includes utilization of radial magnification (or virtual image displacement) to enhance the steering capability of the beam steering device 1200. The enhancement of steering capability, as described herein and without limitation to any aspect of the present disclosure, and whether utilizing principles of a type 3 steering device, a type 1 steering device, other principles described herein, or combinations of these, may reference any one or more of: enhancement of steering angle capability (e.g., steering to a greater angle than previously known systems), enhancement of steering speed and/or frequency (e.g., utilizing a reduced lens size and/or actuator displacement, thereby allowing for greater steering speed relative to previously known systems), reduction of steering device footprint (e.g., reduced weight, size, axial extent, power requirements, etc.), reduction in cost of components and/or fabrication (e.g., utilizing smaller lenses, reduced cost and/ or capability of an actuator, and/or supporting aspects such as integration requirements, support requirements, active cooling requirements, etc.), enhanced aperture size/steered beam size, etc. Accordingly, in certain embodiments, a beam steering device of the present disclosure may have enhanced steering capability, while having the same or a lower steering angle capability relative to a previously known steering device.

The example beam steering device 1200 includes the steering layer(s) 306 providing a steered beam 1204 to a magnifying lens 1202, where the magnifying lens 1202 increases the steered angle (e.g., as depicted schematically with steered beam 1206) of the beam 1206 incident on the field lens 308. The magnifying lens 1202, in coordination with lens(es) of the steering layer 306 provides for radial magnification, or displacement of a virtual image (or virtual object)—which is the displacement of a focal point of an equivalent lens of the lens(es) of the steering layer 306. An example steering layer 306 includes one or more moving negative lenses, each of which may be aligned with a steering axis or offset from a steering axis (e.g., reference FIGS. 6, 8, 10, 11, 30-35, and the related descriptions), and which may be arranged to move perpendicularly to each other, or offset from each other whether perpendicular or otherwise. An example steering layer 306 includes one or more positive lenses, and/or a combination of a negative lens with a positive lens. An example steering layer 306 includes the lenses of the steering layer 306 positioned in close proximity to each other, and positioned between one to two focal distances from the magnifying lens 1202. The emission lens 310, in an example, is a fixed positive lens, where the field lens 308 is positioned at a focal plane of the emission lens 310. The emission lens 310 is positioned one focal distance away from the image plane of the magnifying lens 1202.

Figure 13:
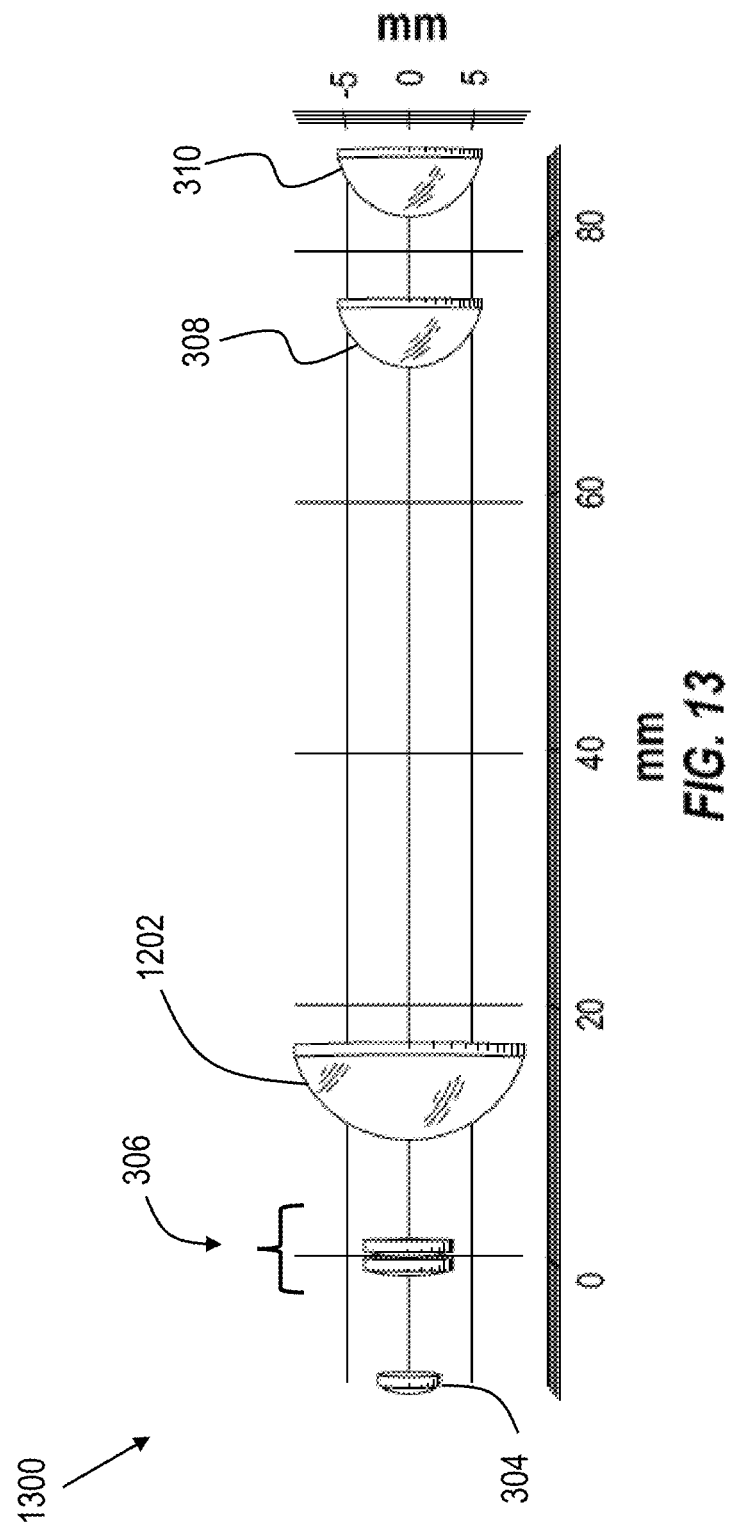
FIG. 13 is another schematic depiction of an example type 1 steering device.

Referencing FIG. 13, an example beam steering device 1300 utilizing aspects of a type 1 steering device as set forth herein is schematically depicted. The example beam steering device 1300 includes a steering layer 306 having two moving negative lenses and a magnifying lens 1202. It will be understood that the steering layer 306 may utilize positive lenses (which may increase the axial extent of the beam steering device), and/or a combination of a positive steering lens and a negative steering lens (e.g., having distinct optical power). The steering layer 306 is positioned between one and two focal lengths away from the magnifying lens 1202. The magnifying lens 1202 may be a spherical lens, or an aspherical lens (e.g., where the lenses of the steering layer 306 have different optical power). The utilization of negative lenses for the steering layer 306 provides for a moving virtual source point (e.g., upstream of the steering layer 306), which can reduce the axial extent of the beam steering device 1300, while the utilization of positive lenses for the steering layer 306 provides for a moving real source point (e.g., downstream of the steering layer 306), which may increase the required axial extent of the beam steering device 1300.

An example beam steering device 1200, 1300 does not require a field lens 308, although the utilization of the field lens 308 allows for a more compact device (e.g., reduced size of the emission lens 310) and/or reduces vignetting losses that may otherwise be present. The example type 1 beam steering device 1200, 1300 creates a focus (concentration) of the beam energy on the field lens 308. In certain embodiments, for example with a beam steering device 1200, 1300 having a high power throughput, heat transfer from the field lens 308 may be considered in designing the beam steering device 1200, 1300. For example, the transparency of the field lens 308, the material selection of the field lens 308, the heat transfer environment of the field lens 308, and/or active cooling thermally coupled to the field lens 308 may be provided to account for expected thermal performance of the field lens 308. It can be seen that the field lens 308 is relatively large (in most embodiments) relative to other lenses (e.g., lenses of the steering layer 306), providing for a thermal sink that distributes heat throughout the field lens 308. The focusing characteristic of the type 1 beam steering device can be managed to accommodate large power throughput devices (e.g., greater than 55 kW). Further, beam steering devices having high power throughput may generally have a larger field lens 308 (e.g., providing for a larger thermal sink and/or heat transfer area), and further have a greater surface area around the field lens 308 (e.g., allowing for the inclusion of passive and/or active heat transfer capabilities), therefore allowing for management of higher power throughput devices.

An example type 1 steering device can be designed considering an equivalent lens with a moving focal point that is equivalent to the steering lens(es) of the steering layer 306 (e.g., with two steering lenses, an equivalent can be determined whether two negative lenses, two positive lenses, and/or one of each are present in the steering layer 306). That moving focal point is the virtual object of the beam steering device 1200, 1300. The size of the virtual object is $\Delta_x$ in a first direction (according to actuator displacement of a steering lens in direction x) and $\Delta_y$ is a second direction (according to actuator displacement of a steering lens in direction y). As described throughout the present disclosure, x and y are in the movement direction(s) of the steering lens(es), which may be aligned or not with the steering directions, and which may be perpendicular or not. An example description provided for clarity of the present disclosure utilizes x as a first steering direction and y as a second steering direction. Magnification (e.g., radial magnification) of the virtual object is provided by positioning the moving focal point of the equivalent lens between $f_m$ and $2f_m$, where $f_m$ is the focal distance of the magnifying lens 1202. The magnification (M) provides for displacement of the virtual object as $M\Delta_x$ in the x direction, and $M\Delta_y$ in the y direction. The magnification M, which may be distinct in each direction (e.g., as $M_x$ and $M_y$, but is described herein as the same for clarity of the present description), is determined as M=z'/z, where z' is the distance between the image of the virtual object and the magnifying lens 1202, and where z is the distance between the virtual object and the magnifying lens 1202. The axial distance between the emission lens 310 and the magnifying lens 1202 is $z'+f_r$ (or $Mz+f_r$), where $f_r$ is the focal length of the emission lens 310. The field lens 308, where present, is positioned at $f_r$. The emission lens 310 has a selected optical power to recollimate the beam converged on the image plane of the magnifying lens 1202, thereby providing a steered beam 106 having a selected collimation characteristic (e.g., collimated, and/or having a diverging and/or converging characteristic according to the requirements and/or application of the beam steering device 1200, 1300).

In the present description, the virtual object may be understood as the focal point (e.g., of small negative steering lens(es)), and the image of the virtual object is a real image formed on another lens (e.g., a real image formed by a magnifying lens 1202 on a field lens 308). Thus, the movement of the virtual object tracks movement of a focal point on a focal plane, and movement of the image of the virtual object tracks movement of the real image of the virtual object onto a lens of interest.

The steering capability of a beam steering device 1200, 1300 utilizing a type 1 configuration is set forth in equations 9 and 10. The example of equations 9 and 10 utilizes a single magnification M for both steering directions. It will be understood that the magnification M may vary between the steering directions, and/or transformations may be made where the steering directions and movement directions are not aligned, and/or where the movement directions are not linear (e.g., one or more actuator(s) 318 do not provide linear, or completely linear, motion of a steering lens).

$$\theta_x = \pm \tan^{-1}\left(\frac{M\Delta_x}{f_r}\right).$$ Eq. 9

Deflection angle capability of an example steering device in an x direction $$\theta_y = \pm \tan^{-1}\left(\frac{M\Delta_y}{f_r}\right).$$ Eq. 10

Deflection angle capability of an example steering device in a y direction

Figure 14:
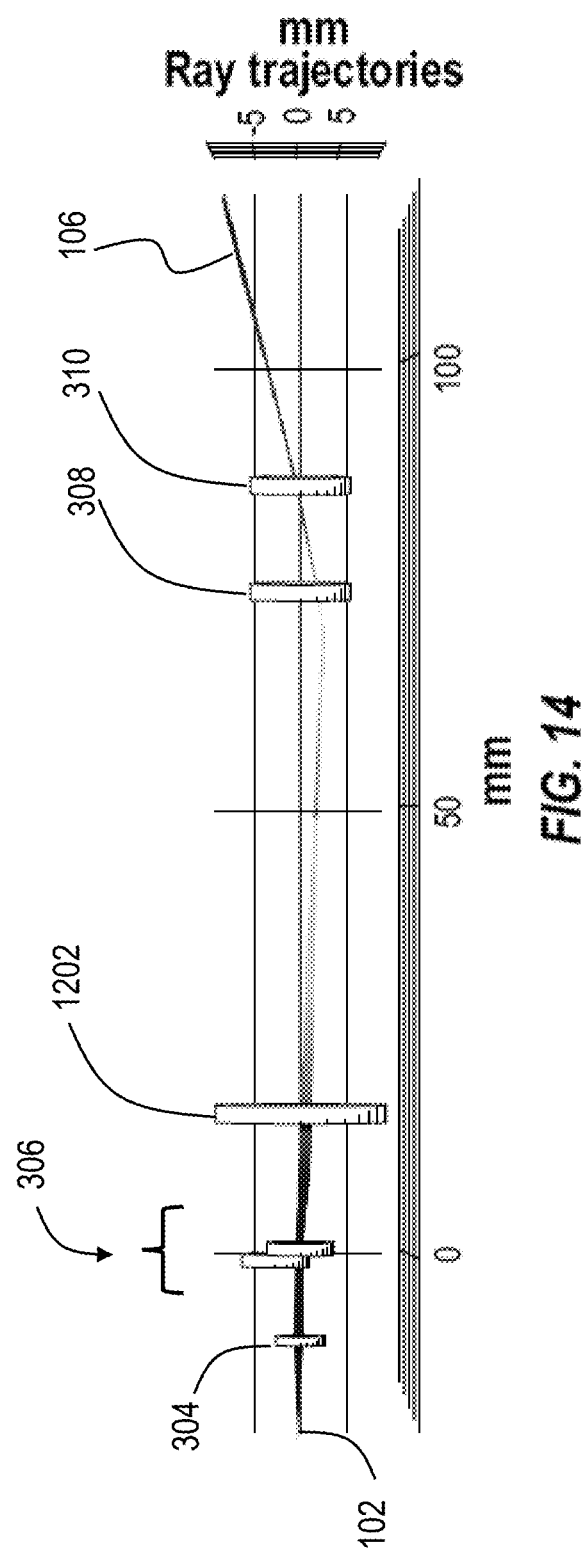
FIG. 14 is an illustrative capability of a type 1 steering device.

Referencing FIG. 14, an illustrative performance of a beam steering device 1300 is schematically depicted. Steering performance is illustrated in a single steering direction for clarity of the present description.

Example embodiments herein utilizing a type 1 steering device to create a virtual displacement that is much larger than the real displacement (e.g., the angle of the final steered beam 106 is multiplied relative to the steered angle of the beam 1204 incident on the magnifying lens 1202). An example beam steering device 1200 is readily capable to steer a beam 106 at large steering angles (e.g., >+/−60 degrees, >+/−45 degrees, and/or >+/−30 degrees) with modest displacement of the actuator 318. Additionally, and without limitation to any other aspect of the present disclosure, the beam steering device 1200 enhances numerous aspects over previously known beam steering devices, for example reducing vignetting losses (e.g., reduced actuator displacement allows for reduction in moving lens sizes, field lens size, and/or greater ease in creating a common area between lenses of the steering layer 306; thereby reducing moving lens sizes and/or field lens size that would otherwise be required to reduce vignetting losses for previously known beam steering devices), and/or enabling arbitrarily large apertures. For example, a beam steering device 1200 capable to produce a steered beam 106 having a size of 50 cm or greater can readily be constructed. The enhancements of the type 1 steering device can be utilized to increase capability of beam steering in other dimensions beyond a significant steering angle capability. For example, the type 1 steering device produces a high steering angle relative to the displacement amount of steering lens(es), allowing for reduced cost and/or capability of an actuator 318 moving the lens(es); an increased steering speed and/or frequency (e.g., putting a reduced mechanical strain on the system to move the steering lens(es)); increased common area of the steering lens(es) (e.g., increasing the supported beam size relative to aperture size of the emission lens 310—resulting in a larger supported emission beam size relative to previously known systems); and/or a reduction in the steering lens size(s) (e.g., the smaller displacement reduces the required steering lens size(s) that preserve a given common area of the steering lens(es)).

An example beam steering device 1300 includes a focal length of the equivalent negative lens (e.g., steering lenses of steering layer 306) of 40 mm, a focal length of the magnifying lens 1202 of 20 mm, and a focal length of the emission lens 310 and field lens 308 of 12 mm. The example steering device is capable to provide the steered beam 106 deflected to +/−15 degrees at a speed of 0.2 KHz. The example steering device is based on modeling, simulation, and experience, and is believed to be representative of capabilities within the range (without limitation) of embodiments as set forth herein. The example steering device depicts steering in only a single axis for purposes of illustration.

In certain embodiments, the optical components and configuration of a beam steering device (e.g., any type 3 steering device, type 1 steering device, and/or any other beam steering device as disclosed herein) are configurable to achieve a selected steered beam 106 size and/or convergence/divergence characteristic. An example configuration includes providing a type 3 steering device having a telescopic magnification selected to provide a steered beam 106 size, for example as a multiple of the incident beam 102 size according to the magnification of the optical components arranged within the beam steering device. Further configuration options for a type 3 steering device to accommodate a larger steered beam 106 size include one or more of: increasing a common area of steering lenses of the steering layer 306; including and/or increasing a size of a field lens (e.g., as in FIG. 3 or 8); and/or including and/or increasing a size of additional field lens(es) (e.g., as in FIG. 5). An example configuration includes providing a type 1 steering device having a telescopic magnification selected to provide a steered beam 106 size, for example as a multiple of the incident beam 102 size according to the telescopic magnification (e.g., as opposed to a radial magnification) of the optical components arranged within the beam steering device. Further configuration options for a type 1 steering device to accommodate a larger steered beam 106 size include one or more of: reducing a size of the field lens (if present); positioning the field lens closer to the magnification lens; increasing an F # of the emission lens; increasing a common area between steering lenses of the steering layer 306 (e.g., adjusting lens size, displacement, and/or utilizing field lens(es) associated with the steering lenses, such as in FIG. 5); and/or utilizing a positive/negative lens pair as the emission lens (e.g., which may reduce the steering capability, but increase the beam size). The convergent-divergent-collimated characteristic of the steered beam 106 depends upon the optical characteristic(s) of components throughout the optical path of a given beam steering device (e.g., each lens layer and/or optically active component layer), and the initial characteristics of the incident EM beam 102.

It can be seen that certain features of the optical arrangement of a beam steering device compete in certain arrangements. For example, telescopic magnification and steering angle capability compete for a type 1 beam steering device. In another example, steering lens common area competes with one or more of: steering lens size; steering angle capability (e.g., reduced steering lens displacement limits steering angle capability but improves steering lens common area); and/or axial extent of the beam steering device compete for either a type 3 beam steering device or a type 1 beam steering device. It can be seen that certain features of the optical arrangement of a beam steering device cooperate in certain arrangements. For example, telescopic magnification and steering angle capability cooperate for a type 3 beam steering device. In another example, steering lens common area cooperates with a low-displacement steering lens arrangement, which may be desirable in certain embodiments: reduced displacement benefits cost considerations of the actuator(s), power consumption of the beam steering device, and steering speed through the displacement range of the beam steering device. Embodiments herein provide for a greater maneuverability through the optical arrangement space of a beam steering device, allowing for improved outcomes, capability, cost, and/or performance of a resulting beam steering device relative to previously known beam steering devices.

Without limitation to any other aspect of the present disclosure, embodiments herein provide for: high steering angle capabilities per unit of steering lens displacement; a high ratio of emitted beam size relative to the size of emitting optics (e.g., field lens(es), emission lens(es), etc.); a reduced and/or eliminated moving mass of actuated components (e.g., reduced size steering lens(es), and/or writeable lens(es) that eliminate physical movement); and/or a reduction in an axial extent of the beam steering device (e.g., utilizing negative steering lenses, and/or a net negative steering layer). Without limitation to any other aspect of the present disclosure, embodiments herein provide for numerous options to adjust the trade-off space of the arrangement of steering components, such as: utilization of telescopic magnification to enhance steering angle capability; dividing steering displacement burdens between multiple steering layers (e.g., compare arrangements of FIGS. 6, 8, 10, and 13); utilization of a focusing (e.g., type 1 beam steering device with a field lens) or non-focusing (e.g., type 3 beam steering device) arrangement; compensation for non-aligned steering lens movement with logical steering axes (e.g., allowing for trade-offs between actuator positioning options, actuator types, manufacturing and/or alignment tolerances, etc.); and/or utilization of standardized or customized components (e.g., lens type and power selections, reduction or increase in actuator capability allowing for a broader range of acceptable actuator components, etc.). One of skill in the art, having the benefit of the disclosure herein and information ordinarily available when contemplating a beam steering device, can readily determine a configuration to meet the desired capability for a given application, while balancing component cost, manufacturability, and footprint characteristics of the beam steering device. Certain considerations for configuring a beam steering device to meet a desired capability, and/or to adjust the trade-off space of the arrangement of steering components include, without limitation: movement capability (displacement and/or speed) of available actuators; orientation of movement directions (to each other, and/or to steering axes); the target steering envelope (e.g., magnitude and/or direction of steering); the available axial footprint of the beam steering device (e.g., axial extent of the steering components and/or a housing defining the steering components); a beam size of the incident beam; a beam size of the steered beam; optical characteristics and/or relative costs of lens components (e.g., spherical, aspherical, anisotropic, astigmatic, positive and/or negative lenses, cylindrical lenses, and/or write-able lenses—e.g. reference FIGS. 36, 37); power throughput of the incident beam and/or an observed beam; heat transfer characteristics and/or active cooling characteristics available for components of the beam steering device (e.g., capital costs, integration costs, footprint costs (e.g., size, weight, systems, interfaces, controls), operating costs, and/or performance effects or limitations); the focusing characteristic of the steered beam progressing through the beam steering device; the number and geometry of available steering paths relative to the number and geometry of steered beams (e.g., where switching of steering responsibility between paths can enhance steering capability, steering response time, heat generation, and/or component utilization—e.g., reference FIGS. 15-25, 39-42, and 44); duty cycles of steering operations (e.g., steering angles and/or frequencies, and or power throughput; including a description of operating times corresponding to these; including consequent effects on steering actuators, component time-at-temperature, cooling system, and the like); mechanical displacement capabilities and constraints, available footprint for the steering system (e.g., axial size; diameter; weight; power provision; cooling provision; and/or control capabilities including I/O, available sensors, and/or available actuators), capital cost considerations, operating cost considerations, and/or manufacturing constraints (e.g., tolerances of components, available materials, available operations such as machining, coating, finishing, etc.).

Figure 15:
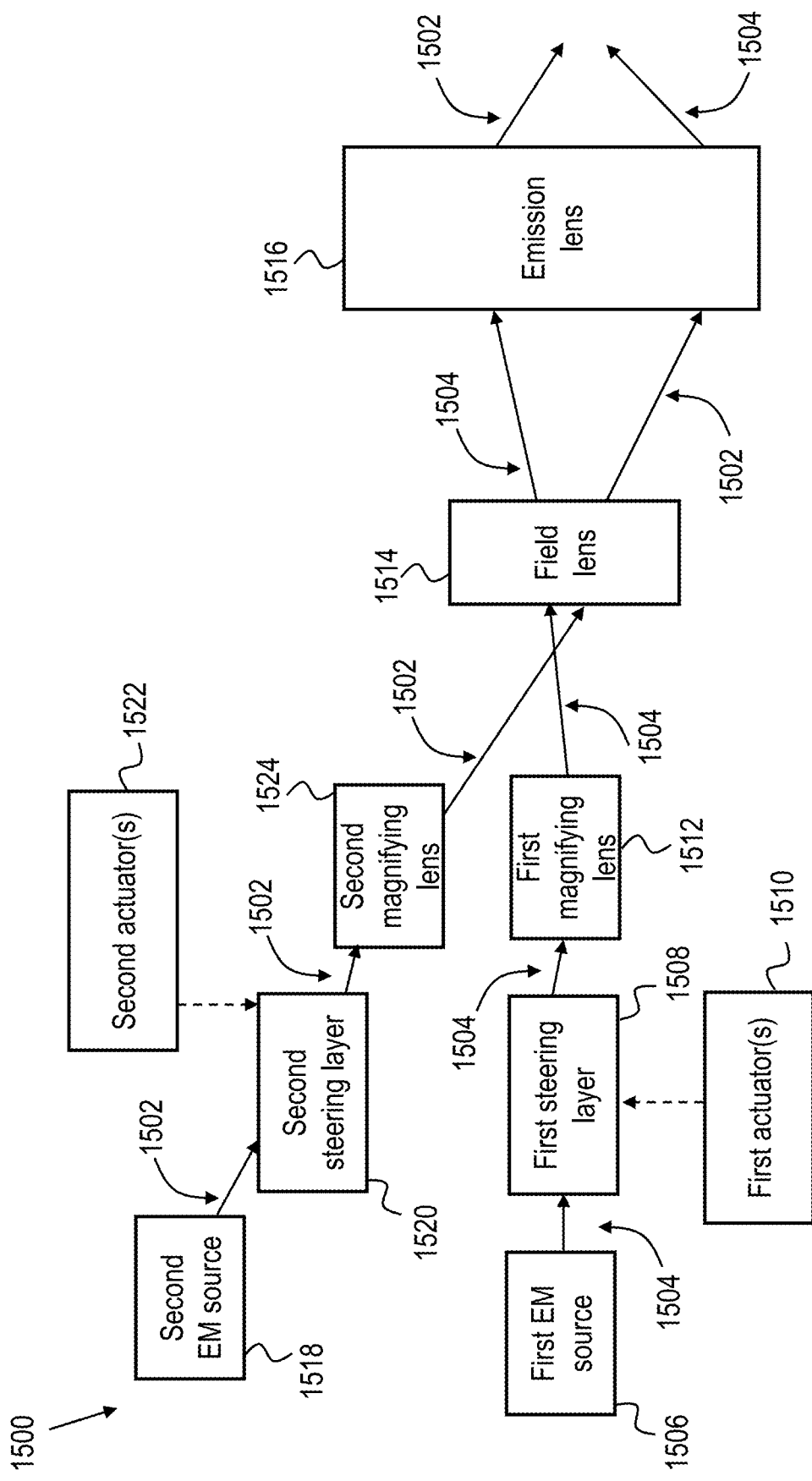
FIG. 15 is a schematic depiction of an example type 2 steering device.

Referencing FIG. 15, an example beam steering device 1500 that steers a number of EM beams 1502, 1504 simultaneously is depicted. For convenient reference herein, multiple beam steering arrangements such as those depicted in the examples of FIGS. 15-18, and 22, are referenced as a type 2 beam steering device. In the example of FIG. 15, the final steering optics include a shared field lens 1514 and a shared emission lens 1516. The upstream steering components are consistent with a type 1 beam steering device for each EM beam 1502, 1504, for example each including a steering layer and a magnifying lens. However, the upstream steering components for any one or all of the EM beams 1502, 1504, which may be referenced as an individual steering device, may additionally or alternatively include an individual steering device consistent with a type 3 beam steering device (e.g., reference FIGS. 4, 5, 8, and 10, and the related descriptions). The shared field lens 1514 may be in addition to any field lens (not shown) provided for an individual steering device, and/or may be provided as an additional steering component after the initial steering is performed by the given individual steering device. Additionally or alternatively, a given individual steering device may include an emission lens (not shown) that emits an individually steered beam from the individual steering device that is incident on the shared field lens 1514, and/or may be omitted (e.g., as depicted in the example of FIG. 15). Additionally or alternatively, an individual steering device may include a combination of type 3 beam steering device and type 1 beam steering device components.

In the example of FIG. 15, each individual beam steering device includes a nominal optical line that passes through approximately the center of the shared field lens 1514, where steering of the individual beam (e.g., EM beam 1502) move the incidence of the individual beam around the center of the shared field lens 1514, which is then emitted from the shared emission lens 1502 as a final individual steered beam. It can be seen that, where one of the individual steering devices is provided at a centerline of the field lens 1514—emission lens 1516 pair (e.g., the individual steering device that is steering EM beam 1504 in the example of FIG. 15), all other individual steering devices will be offset by some angle. The amount of the offset will depend upon the size of the lenses (e.g., the magnifying lens(es) 1512, 1524, where present, and/or lenses of the steering layers 1508, 1520), the positioning and configuration of the actuator(s) 1510, 1522, and/or any other components (not shown) such as housing or support structures, cooling interface(s), power connections, control connections, or the like. The example of FIG. 15 includes a centerline individual beam steering device (e.g., the individual steering device that is steering EM beam 1504 in the example of FIG. 15), but a given beam steering device 1500 may not include a centerline individual beam steering device (e.g., where all individual beam steering devices are offset, for example to provide a similar steering environment for each, and/or to reduce a total offset amount for all of the individual steering devices in the beam steering device 1500). The example of FIG. 15 depicts an arrangement capable to steer two EM beams 1502, 1504 as an illustration of certain features of the beam steering device 1500, but a beam steering device 1500 may include a number of individual beam steering devices (e.g., reference FIGS. 16-18 and 22, and the related description, for additional examples).

In the example of FIG. 15, a first individual steering device includes a first steering layer 1508 that receives an incident beam 1504 from a first EM source 1506, and a first magnifying lens 1512 that receives the incident beam 1504 from the first steering layer 1508 and provides it to the shared field lens 1514. Operations of the first steering layer 1508 move the EM beam 1504 about the field lens 1514, resulting in a final steered beam 1504 emitted from the emission lens 1516.

In the example of FIG. 15, a second individual steering device includes a second steering layer 1520 that receives an incident beam 1502 from a second EM source 1518, and a second magnifying lens 1524 that receives the incident beam 1502 from the second steering layer 1520 and provides it to the shared field lens 1514. Operations of the second steering layer 1520 move the EM beam 1502 about the field lens 1514, resulting in a final steered beam 1502 emitted from the emission lens 1516. Further to the example of FIG. 15, the EM beams 1502, 1504 may be steered independently and/or simultaneously.

The example of FIG. 15 depicts the EM beams 1502, 1504 received from EM sources 1506, 1518 and selectively steered to a desired location (e.g., a steering value, which may include separate values for each EM beam 1502, 1504). However, the beam steering device 1500 may additionally or alternatively be targeted to a desired location to receive EM radiation from the target location back to a detector (e.g., in addition to or as a replacement for an EM source 1506, 1518) such as a photonic array. In certain embodiments, one or more individual steering devices may be dedicated to emitted beam steering, and other ones of the individual steering devices may be dedicated to received EM radiation. Additionally or alternatively, a same individual steering device may be utilized to steer an emitted beam at a first time, and to guide received EM radiation at a second time. In certain embodiments, further upstream optical components (e.g., a beam splitter, and/or further steering components—not shown) may manage the provision of the EM source 1506, 1518 and/or final steering to a detector, allowing for the same individual steering device to perform steering operations without regard to whether the steering is performed for emission or receiving purposes, and/or allowing for simultaneous steering of emission and receiving (e.g., where a same target location is a target for both emissions and receiving of EM radiation at the same time).

The components and/or type of each individual steering device may be the same or distinct, and/or the capability of each individual steering device may be the same or distinct. A device configured according to the example of FIG. 15 can steer more than one EM beam 1502, 1504 simultaneously and in more than one dimension (e.g., azimuth and elevation). In certain embodiments, one or a number of the individual steering devices may be configured to steer in two dimensions, with other ones of the individual steering devices capable only to steer in one dimension.

Figure 16:
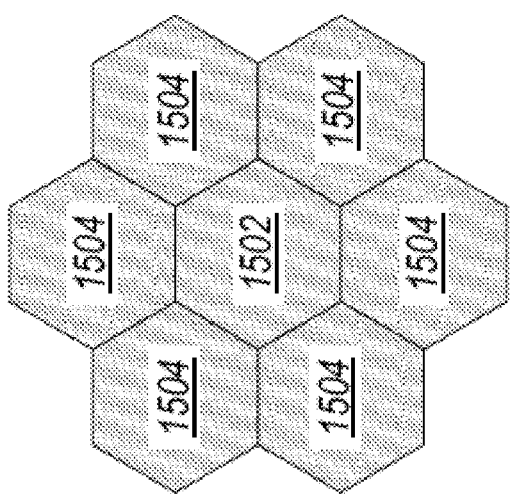
FIG. 16 is a schematic depiction of an example arrangement of individual beam steering devices.

Referencing FIG. 16, an example arrangement of a beam steering device is depicted, for example consistent with aspects of the beam steering device 1500 of FIG. 15. In the example of FIG. 16, one individual steering device steers a centerline beam 1502, and a hexagonal arrangement of individual steering devices steer a number of beams 1504 on an offset steering path (e.g., consistent with the example of FIG. 15, with multiple additions of the second individual steering devices). In the example of FIG. 16, each offset steering path is offset from the centerline by a same amount (although this need not be the case), but each offset steering path has a distinct steering environment—for example a left-most one of the offset individual steering devices will have a different overall steering window relative to a right-most one of the offset individual steering devices, in an embodiment where the left-most one and the right-most one otherwise have a sufficiently similar overall steering capability (e.g., +/−15 degrees, +/−20 degrees, etc.).

The capabilities and arrangements (e.g., type 3, type 1, and/or combinations) of the individual steering devices may vary, providing the selected number of steering devices and capabilities according to the desired capability of the type 2 beam steering device and/or application. It can be seen that the offset beams 1504 are not on the centerline, and even with a same capability (e.g., nominal +/−45 degrees for each of the individual steering devices), there will be some loss in the available steered range. For example, reference FIGS. 19-22 for additional details. The amount of the offset from the centerline will depend upon the size of each individual steering device and other considerations (e.g., reference FIG. 15 and the related description), and will further depend upon the axial extent available for providing the type 2 steering device (e.g., a longer device with a fixed geometric offset results in a lower offset angle). The individual steering devices and/or the corresponding components (e.g., steering layers, magnifying lenses, etc.) may be arranged in any manner, such as on a plane, the frustum of a curved surface (e.g., a sphere, paraboloid, elliptical versions of these, hyperbolic versions of these, and/or may be positioned on a concave or a convex portion of such a surface, etc.), and/or may be arranged arbitrarily in three-dimensional space (e.g., to minimize collision of components such as actuators and/or magnifying lenses), with each of the individual steering devices having a selected optical line relative to the shared field lens 1514. The description of a curved surface, a plane, or other arrangements are utilized to describe a general logical arrangement, and not positioning on the individual steering devices on an actual surface. However, depending upon the configuration, the individual steering devices may be positioned on an actual surface having the selected shape (or combination of shapes), for example a housing wall, structural support (e.g., a wall, bulkhead, and/or scaffold having the selected shape), or the like.

The provided examples are non-limiting. In certain embodiments, the steering capability of the individual steering devices is sufficiently high such that non-steering considerations, such as ease of fabrication, integration of actuators, simplified geometry and/or footprint for the type 2 beam steering device, or the like, are utilized to determine the arrangement of the individual steering devices and components thereof. In certain embodiments, complex shapes and geometries of the individual steering devices are justified to preserve steering capability of the devices. In certain embodiments, a subset of the individual steering devices are maintained with high steering capability, such as: a selected number of individual steering devices, a related group of individual steering devices, and/or a distributed group of individual steering devices (e.g., to provide for distributed capability across the array of individual steering devices). The example of FIG. 16 includes a centerline individual steering device steering the EM beam 1502, but a given embodiment need not include any centerline individual steering device.

Figure 17:
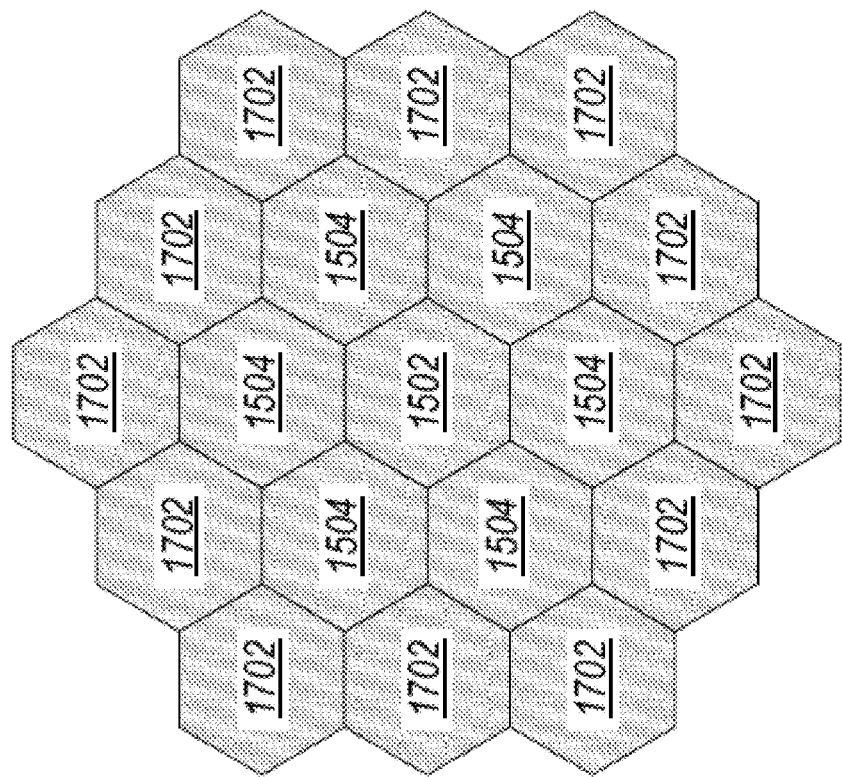
FIG. 17 is a schematic depiction of an example arrangement of individual beam steering devices.

Referencing FIG. 17, for example consistent with aspects of the beam steering device 1500 of FIG. 15. In the example of FIG. 17, one individual steering device steers a centerline beam 1502, a hexagonal arrangement of individual steering devices steer a number of beams 1504 on an offset steering path (e.g., consistent with the example of FIG. 15, with multiple additions of the second individual steering devices), and a further hexagonal arrangement of individual steering devices steer a number of beams 1702 on a second offset steering path. The individual steering devices for the number of beams 1702 are further offset from the centerline relative to the individual steering devices for the number of beams 1504, but the considerations and description of FIG. 16 otherwise generally applies to the embodiment of FIG. 17. It will be seen that the variance in the steering environment for the individual steering devices for the number of beams 1702 will be greater than the variance in the steering environment for the individual steering devices for the number of beams 1504.

An example tier arrangement includes a hex geometry of beams approaching the field lens, with the central beam being on axis, or near on axis, and a ring of 6 apertures around the central ring to form a hex 7 arrangement, another ring of 12 around the hex 7 array to form a hex 19 array, and so on for larger hex arrangements.

For convenience of description, each similarly positioned group of individual steering devices may be referenced as a tier of individual steering devices. For example, the centerline individual steering device (and/or a group of least offset individual steering devices) may be referenced as a first tier, the individual steering devices for the number of beams 1504 (and/or a group of next-least offset individual steering devices) may be referenced as a second tier, and the individual steering devices for the number of beams 1702 (and/or a group of next-least offset individual steering devices) may be referenced as a third tier. It can be seen that the difference in the overall steering environment for each tier will have a greater variance than a previous tier, at least for embodiments where the extent of a given tier is utilized. For example, an arrangement such as depicted in FIG. 17 includes a left-most member of the third tier and a right-most member of the third tier having a greater offset difference therebetween than a left-most member of the second tier and a right-most member of the second tier. However, an embodiment such as that depicted in FIG. 17, but where the third tier is not fully utilized (e.g., where only two adjacent members of the third tier are present, but the entire second tier is present), there may be members of the second tier having a greater difference in the overall steering environment. In the example, while the two adjacent members of the third tier have a greater offset, the steering environment between the two adjacent members of the third tier will nevertheless have a similar environment relative to each other. The greater variance of steering environments within each subsequent tier, where present, may lead to operational gaps in the steering space of the type 2 beam steering device—for example a left-most member of the third tier may not be able to achieve steering to a portion of a target steering window (e.g., a left-most or right-most portion, depending upon the optical steering arrangement of the individual steering member, and/or the related actuator positioning and capability).

An example type 2 beam steering device is configured to manage such operational gaps, for example utilizing target swapping (e.g., reference FIGS. 24, 38-42, and 44, and the related description), and/or utilizing type selection and/or actuator arrangement of one or more individual beam steering devices (e.g., recognizing that a type 3 arrangement steers the beam in the direction of the steering lens movement, and that a type 1 arrangement steers the beam in the opposite direction of the steering lens movement). The example of FIG. 17 depicts three tiers of individual beam steering devices, but any number of tiers (e.g., four tiers, five tiers, etc.) and/or arrangement of individual beam steering devices is contemplated herein. The example of FIG. 17 depicts a hexagonal arrangement of individual beam steering devices, but any arrangement is contemplated herein, including a grid, a pattern of any type, and/or arbitrarily positioned individual beam steering devices. Provided tiers may include a full tier (e.g., all available positions occupied by individual beam steering devices), partial tiers (e.g., a number of individual beam steering devices provided for the tier with some positions unoccupied, for example where a count of individual beam steering devices are sufficient without all positions occupied, to provide space for a support structured, power coupling, cooling, control coupling, etc.).

Figure 18:
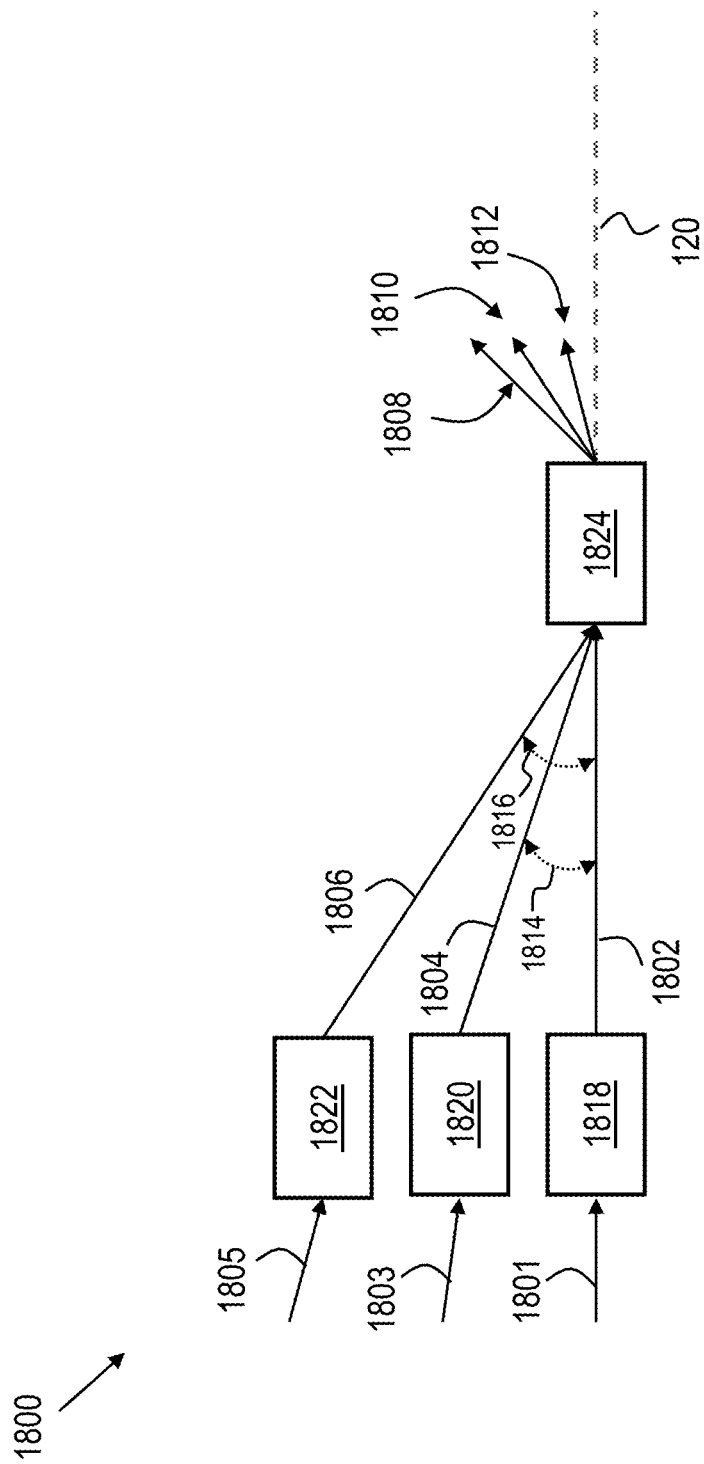
FIG. 18 is another schematic depiction of an example type 2 steering device.

Referencing FIG. 18, an example type 2 beam steering device 1800 is schematically depicted. The example of FIG. 18 includes a first tier individual beam steering device 1818, a second tier individual beam steering device 1820, and a third tier individual beam steering device 1822. The example of FIG. 18 includes an example device 1818, 1820, 1822 from each tier for clarity of description for certain concepts of the present disclosure. However, a given tier may include any number of devices according to the selected arrangement. In certain embodiments, individual beam steering devices may have circular symmetry with regard to an optical axis 120 (e.g., devices within a tier have a same offset angle). In certain embodiments, individual beam steering devices may additionally or alternatively be distributed symmetrically about the optical axis 120 (e.g., where each individual beam steering device 1818 in a given tier has an opposing individual beam steering device 1818 positioned in an opposite location mirrored across the optical axis 120). It will be understood that alternate arrangements of each tier of a type 2 beam steering device are also contemplated here, for example with non-symmetrical and/or unbalanced arrangements of individual beam steering devices in a given tier. Additionally, it will be understood that a type 2 beam steering device 1800 may be provided without tiers—for example with a number of distributed individual beam steering devices each having an offset angle (and/or with a single one of these centered on the optical axis 120), and/or combinations such as certain individual beam steering devices provided in one or more tiers, and additional individual beam steering device(s) provided at arbitrary values for the offset angle.

The example beam steering device 1800 includes common optics 1824 (e.g., a field lens and an emission lens), where the first tier device 1818 steers a first EM beam 1801, where the second tier device 1820 steers a second EM beam 1803, and where the third tier device 1822 steers a third EM beam 1805. The example beam steering device 1800 includes the first tier device 1818 as a centerline device (e.g., with the first EM beam 1801 provided in-line with an optical axis 120). However, the beam steering device 1800 may not include a centerline device, and the devices 1818, 1820, 1822 may have distinct offsets from the optical axis 120 for any reason, regardless of whether the devices 1818, 1820, 1822 are provided as members of separate tiers. In the example of FIG. 18, the first device 1818 steers the first EM beam 1801, providing a steered EM beam 1802 to the common optics 1824, which is then emitted as a first steered beam 1808. The second device 1820 steers the second EM beam 1803, providing a second steered EM beam 1804 to the common optics 1824, which is then emitted as a second steered beam 1810. The third device 1822 steers the third EM beam 1805, providing a third steered EM beam 1806 to the common optics 1824, which is then emitted as third steered beam 1812.

The steered beams 1808, 1810, 1812 are depicted schematically, and are provided to illustrate that, where the devices 1818, 1820, 1822 otherwise have similar steering capability, that devices 1818, 1820, 1822 having a further offset from the optical axis 120 have a reduced capability for maximum steering in at least one direction. For example, a nominal optical axis for the second device 1820 is offset by an angle 1814 from the optical axis 120, and a nominal optical axis for the third device 1822 is offset by a larger angle 1816 from the optical axis 120. The reduction in the maximum steering capability includes the offset angle 1814, 1816 (e.g., steering "against" the offset angle requires that angle to be overcome in addition to the target steering value), but also includes a degradation of the overall capability of the offset device 1820, 1822 due to the engagement angle of the steered beam (e.g., 1804, 1806) with the common optics 1824. The degradation of the overall capability due to the engagement angle is not linear—for example, a mild offset of a few degrees may result in a capability loss of just a few degrees, but a larger offset (e.g., 20 degrees) will result in a more significant offset of the maximum capability. For example, where the first device 1818 includes a capability of +/−45 degrees, an otherwise similar second device 1820 having an offset angle 1814 of less than about 5 degrees may preserve an overall capability of +/−40 degrees, while an otherwise similar third device 1822 having an offset angle 1816 of less than about 10 degrees may preserve an overall capability of +/−30 degrees. The recited examples are non-limiting and illustrate the basic concept. The offset angles and capability degradation depend on a number of factors, which can be mitigated in the design details, for example utilizing axial distancing and/or arrangements of the individual beam steering devices 1818, 1820, 1822 to reduce offset angles, increased capability of the offset individual beam steering devices 1820, 1822 (e.g., utilizing radial and/or telescopic magnification, intermediate field lenses, and/or enhanced displacement capability of the related actuator(s), etc.) to make up for lost capability due to the nominal geometric arrangement of the devices 1818, 1820, 1822.

Figure 19:
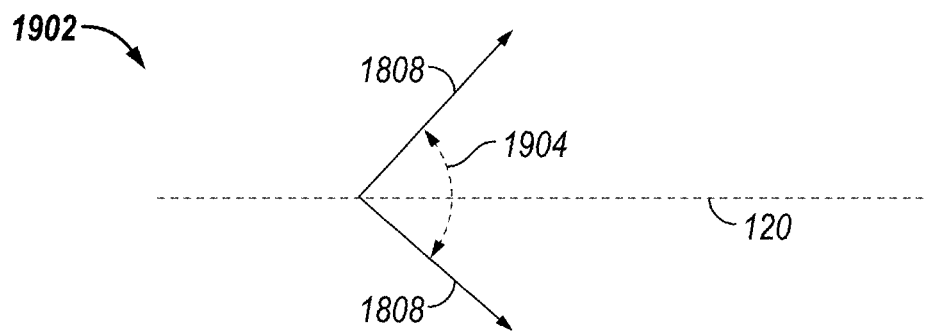
FIG. 19 is an illustrative steering capability of an individual beam steering device.
Figure 20:
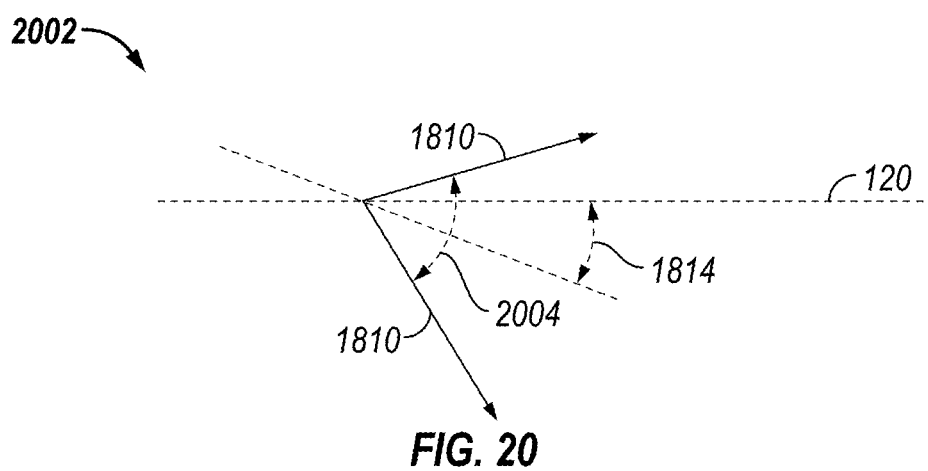
FIG. 20 is an illustrative steering capability of an individual beam steering device.
Figure 21:
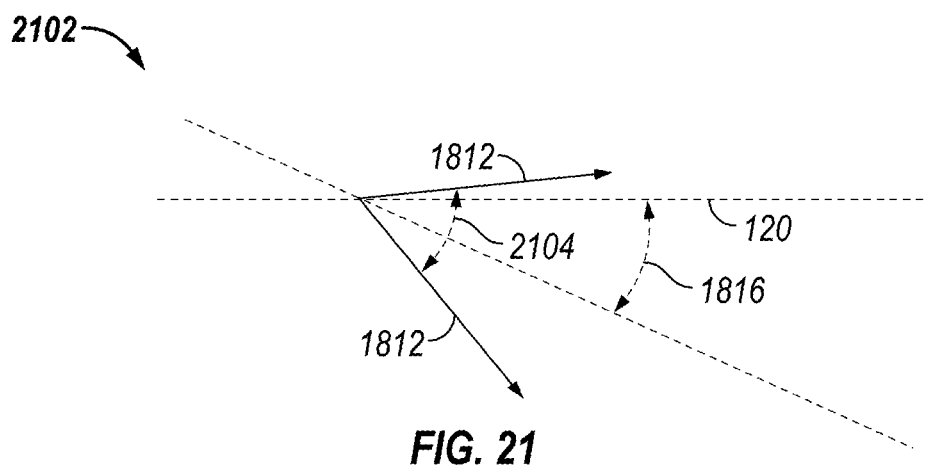
FIG. 21 is an illustrative steering capability of an individual beam steering device.

Referencing FIG. 19, an example steering capability 1902 of a first tier steering device (e.g., a centerline device) is schematically depicted. It can be seen that the steered beam 1808 includes a first range 1904, which may be +/−30 degrees, +/−40 degrees, +/−45 degrees, etc. The example of FIG. 19 is a schematic depiction for purposes of comparison with the other tiers of a type 2 beam steering device, such as that depicted in FIGS. 15-18. The comparison between FIGS. 19-21 is provided to illustrate performance of steering devices from distinct tiers (and/or otherwise having distinct offset angles) but otherwise having similar steering capability (e.g., magnification, displacement, etc.). In certain embodiments, one or more steering devices in higher tiers and/or having a greater offset may be provided having greater steering capability, thereby reducing the differences depicted in the comparison of FIGS. 19-21. In certain embodiments, one or more steering devices in higher tiers and/or having a greater offset may be provided having a reduced steering capability (e.g., where outer tier devices are sufficient to meet the desired steering targets and/or application mission regardless of the reduced capability), thereby increasing the differences depicted in the comparison of FIGS. 19-21.

Referencing FIG. 20, an example steering capability 2002 of a second tier steering device (e.g., having an offset angle 1814) is schematically depicted. It can be seen that the steered beam 1810 includes a second range 2004. The second range 2004 is reduced in magnitude relative to the first range 1904, and is additionally offset by angle 1814. Accordingly, steering in one direction (e.g., above the optical axis 120 in the depiction of FIG. 20, or the disfavored direction) is greatly reduced in capability relative to the steering capability 1902, while steering in the other direction (e.g., below the optical axis 120 in the depiction of FIG. 20, or the favored direction) is less degraded (and/or may be enhanced, depending upon the offset angle 1814 and the magnitude of the reduction of 2004 relative to 1904).

Referencing FIG. 21, an example steering capability 2102 of a third tier steering device (e.g., having an offset angle 1816) is schematically depicted. It can be seen that the steered beam 1812 includes a third range 2104. The third range 2104 is reduced in magnitude relative to the second range 2004, and is additionally offset from the optical axis 120 by angle 1816. Accordingly, steering in one direction (e.g., above the optical axis 120 in the depiction of FIG. 21) is greatly reduced in capability relative to either the steering capability 1902 or the steering capability 2002, while steering in the other direction (e.g., below the optical axis 120 in the depiction of FIG. 21) is less degraded (and/or may be enhanced, depending upon the offset angle 1816 and the magnitude of the reduction of 2104 relative to 1904, 2004) relative to one or both of the steering capabilities 1902, 2002. In the example of FIG. 21, the upper range of the steering capability 2102 is above the optical axis 120, and accordingly target swapping (e.g., reference FIGS. 24, 39-42, and 44, and the related description) may be utilized to provide full capability, or near-full capability (e.g., depending upon the extent of the steering capability 2102 in the favored direction) of steering from the third tier of steering device(s). It will be understood that target swapping may be utilized to preserve steering capability, but certain operating conditions may nevertheless result in loss of steering capability—for example when a large enough group of the third tier steering devices are instructed to steer in a disfavored direction, where not enough swappable third tier steering devices are available to achieve the desired steering targets for multiple steered beams. In certain embodiments, a target swap may extend through device tiers—for example where a second tier device is utilized to achieve a steering target that is nominally commanded for a third tier device.

The examples of FIGS. 19-21 depict example capabilities for devices from multiple tiers (and/or for devices having selected offset values). One of skill in the art, having the benefit of the present disclosure, can readily design a multi-tiered (and/or multi-offset) type 2 beam steering device having a desired steering capability range with the desired number of steered beams. Certain considerations for designing a type 2 beam steering device having an arbitrary steering capability with an arbitrary number of steered beams include, without limitation: the available footprint for the type 2 beam steering device (e.g., axial extent, radial extent, volume, weight, etc.); the fungibility of EM sources (e.g., determining which devices from which tiers have an equivalent EM source, such as beam energy, diameter, frequency, phase, etc.); the availability of steering capability enhancements for devices in selected tiers; and/or the availability of multiple type 2 beam steering devices (e.g., having distinct optical axes 120, tier arrangements, etc.).

Figure 22:
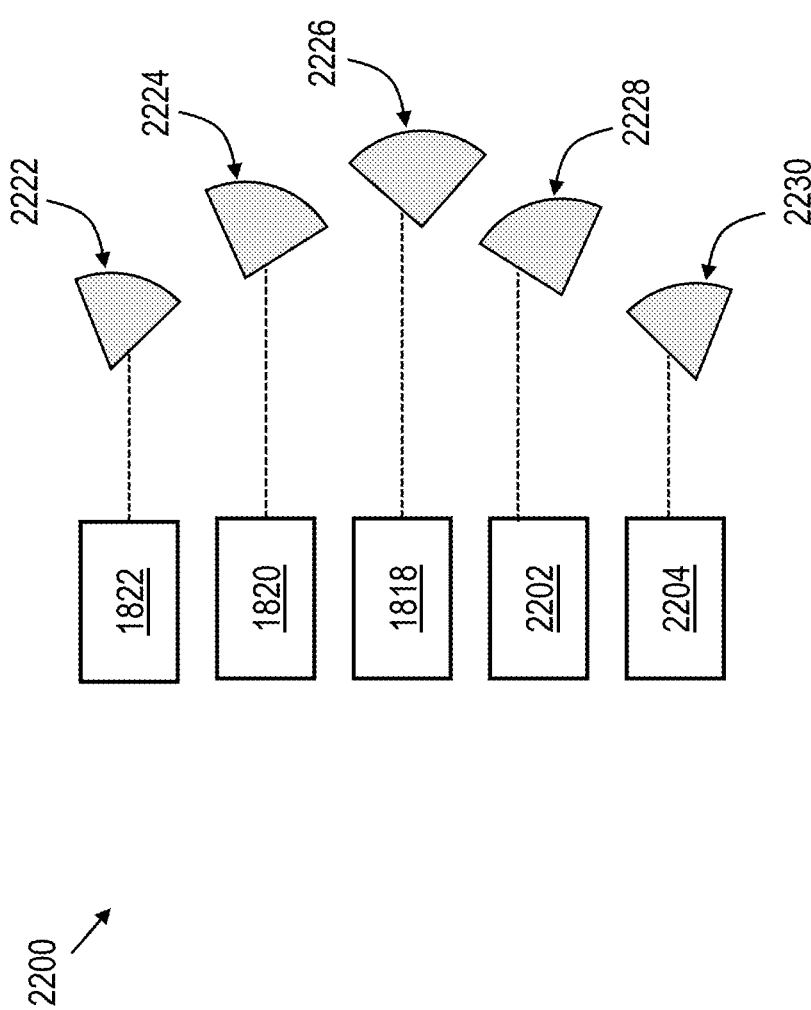
FIG. 22 is an illustrative comparison of steering capability for a number of individual beam steering devices.

Referencing FIG. 22, an example type 2 beam steering device 2200 includes a number of individual steering devices provided in a number of tiers—for example a first device 1818 in a first tier (which may be a centerline device), second devices 1820, 2202 in a second tier, and third devices 1822, 2204 in a third tier. In the example of FIG. 22, each individual steering device includes an associated capability (e.g., device 1818 with capability 2226, device 1820 with capability 2224, device 1822 with capability 2222, device 2202 with capability 2228, and device 2204 with capability 2230). It can be seen that devices 1822, 2204, in the example, have overlapping capabilities 2230, 2222, such that the devices 1822, 2204 can cooperate (e.g., utilizing target swapping) to cover the entire range (e.g., from the top of 2230 to the bottom of 2222, in the example of FIG. 22). Additionally or alternatively, an out-of-range steering target for a given device (e.g., 1822, 2204) may be met by swapping to a device in another tier (e.g., 1820, 2202, or 1818). The examples of FIGS. 19-22 are non-limiting, and are illustrative of the type of information, utilizable by one of skill in the art having the benefit of the present disclosure and information ordinarily available when contemplating a type 2 beam steering device 2200, to ensure that the beam steering device 2200 will have sufficient capability to meet the application mission.

Figure 23:
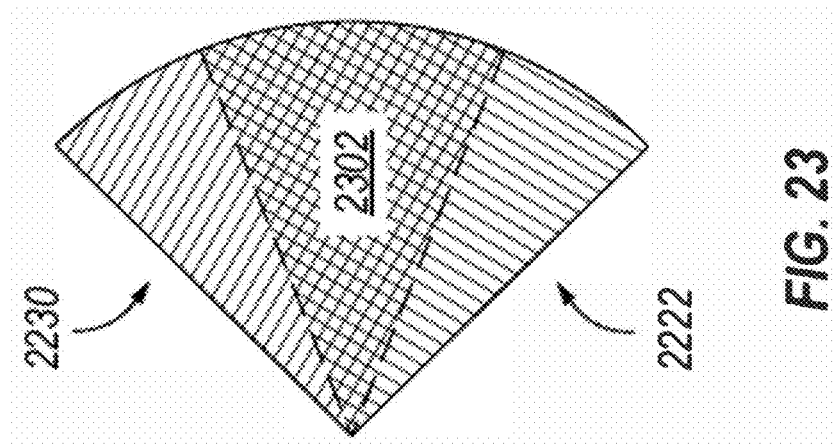
FIG. 23 is an illustrative comparison of steering capability for two individual beam steering devices, showing an overlap region.

Referencing FIG. 23, an illustrative range overlap 2302 is depicted, for example consistent with the steering capabilities 2222, 2230 depicted in FIG. 22. For steering commands in the overlap range 2302, either or both of the devices 1822, 2204 can achieve the target steering, and steering operations can be performed by a default device 1822, 2204 and/or by either or both devices 1822, 2204. For steering commands outside the overlap range 2302, the appropriate one of the devices 1822, 2204 may be utilized to achieve the target steering. In certain embodiments, for example when a steering command shifts from outside the overlap range 2302 into the overlap range 2302, steering can be shifted from a swapped device (e.g., 1822 substituting for 2204) to a default device, and/or management techniques such as application of a hysteresis may be applied (e.g., to prevent dithering or rapid swapping between devices 1822, 2204 performing the steering operations). It can be further seen that swapping operations may be performed to improve steering response time (e.g., utilizing a device 1822, 2204 that is already close to a target steering location), to reduce system power consumption (e.g., utilizing the overlap range 2302 to reduce aggregate actuator power consumption), or for any other purpose. It will be understood that the capabilities, swapping, and other operations described in relation to FIGS. 19-23 may be utilized for multiple steering directions (e.g., the description herein has been described in the context of a single steering axis for clarity of the description) and/or for swapping operations performed between tiers.

Figure 24:
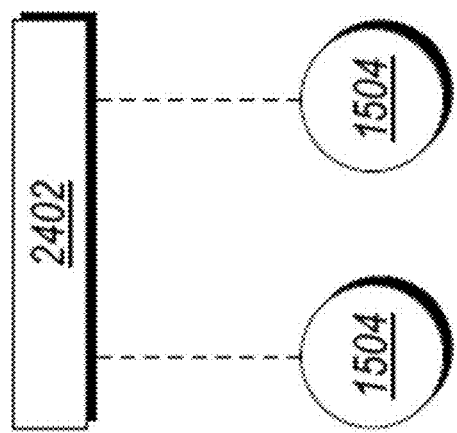
FIG. 24 is a schematic depiction of an actuator coupled to steering layers of more than one individual beam steering device.

Referencing FIG. 24, an example actuator 2402 is depicted as coupled to more than one individual steering device, for example steering an EM beam 1504 associated with a given tier of the type 2 beam steering device. In certain embodiments, it may be desired to provide steering for more than one individual steering device to the same steering target (e.g., one device steering an emitted beam and the other device steering received EM radiation; one device steering a first emitted beam with a first characteristic and the other device steering a second emitted beam with a second characteristic, etc.). In the example of FIG. 24, a single actuator can thereby steer more than one individual steering device, reducing the complexity of the overall type 2 beam steering device. In a further example, the first characteristic and the second characteristic may be any aspect of the EM beams, including a frequency difference, a phase difference, an energy difference, etc. In a further example, the first characteristic and the second characteristic may not have any differences—for example when the two (or more) beams are utilized to provide a selected amount of EM energy to the targeted location utilizing the combined steered EM beams 1504.

Figure 25:
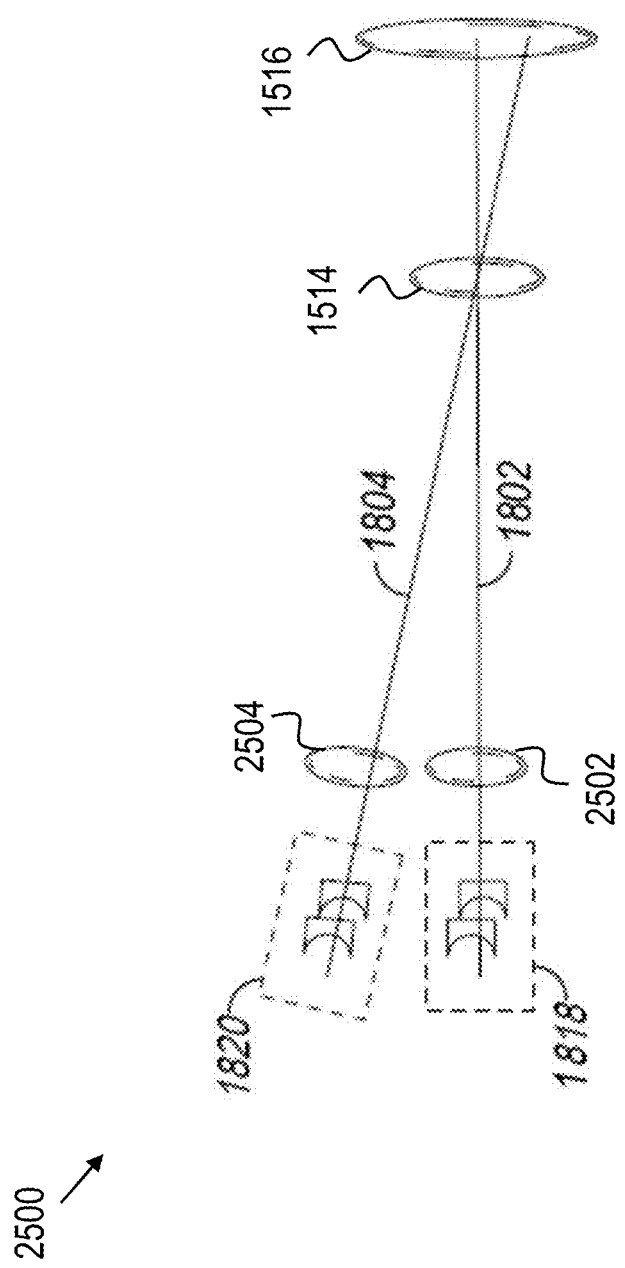
FIG. 25 is another schematic depiction of an example type 2 steering device.

Referencing FIG. 25, an example type 2 beam steering device 2500 is schematically depicted. The example beam steering device 2500 includes a first individual steering device 1818 performing steering operations for a first beam 1802, and a second individual steering device 1820 performing steering operations for a second beam 1804. The example beam steering device 2500 includes a common field lens 1514 and emission lens 1516. In certain embodiments, individual beam steering device(s) 1818, 1820 may have an individually associated field lens (not shown) and/or a subset of the individual beam steering device(s) may share a common field lens, while other individual beam steering device(s) have an individually associated field lens, and/or share a different common field lens. In certain embodiments, common shared optics between individual beam steering device(s) 1818, 1820 may be limited to the common emission lens 1516.

The example beam steering device 2500 further includes a first lens 2502 interposed between the first individual steering device 1818 and the common field lens 1514, and a second lens 2504 interposed between the second individual steering device 1820 and the common field lens 1514. The lenses 2502, 2504 may be magnifying lenses, for example to implement a type 1 beam steering device for steering one or more of the number of beams to be steered by the type 2 beam steering device 2500. The lenses 2502, 2504 may additionally or alternatively include optical characteristics to apply selected adjustments to the steered beam, for example a lens 2502, 2504 may be an additional field lens (e.g., ensuring that the steered beams impinge on a common field lens 1514 and/or on a common emission lens 1516), and/or convergence lenses configured to provide a selected convergence characteristic to the steered beams.

Figure 27:
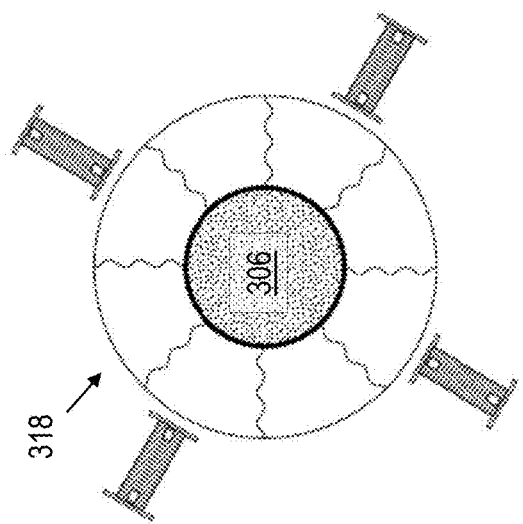
FIGS. 26-28 provide example schematic depictions of an actuator for a beam steering device.
Figure 28:
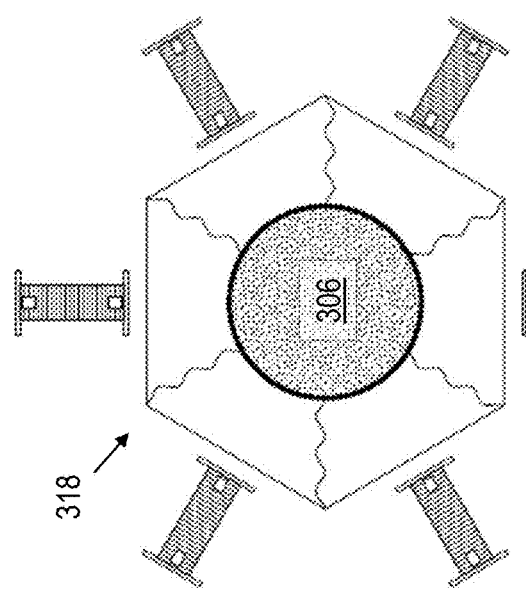
Figure 26:
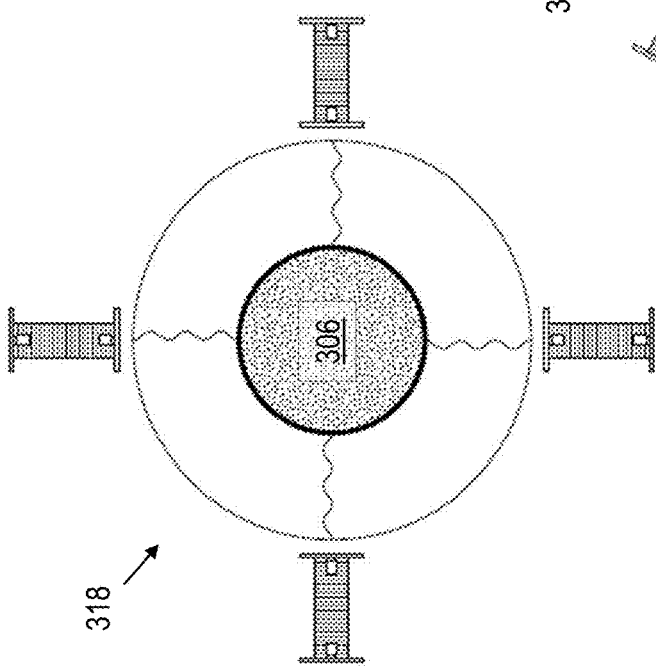

In the examples of FIGS. 26-28, a number and arrangement of electromagnetic actuators 318 including biasing members are depicted as examples. The steering layer 306 of the example embodiments includes a lens is surrounded by a metallic ring (e.g., a permanent magnet and/or a ferromagnetic material, and which may include and/or be replaced by features configured to respond to applied EM fields) responsive to EM fields produced by the actuators. The biasing members may be tension or compression biasing members, and may be formed from a non-magnetic material (or may be a magnetic material, for example where the magnetic response of the biasing member is negligible compared to the response of the lens, and/or where the magnetic response of the biasing member is accounted for in the actuation scheme). The number and arrangement of biasing members and actuating members is selectable. It will be understood that for steering in a single axis, at least a single actuating member having a force component, when activated, in the single steering axis (and/or associated movement direction) is provided. It will be understood that for steering in two axes, at least two actuating members are provided, with net force components in each of the steered axes. However, multiple actuating elements, such as those depicted, may be present. In certain embodiments, actuators 318 may operate in a pull arrangement on the lens, a push arrangement on the lens, or selectively in both arrangements (e.g., where an actuator on one side pushes and the opposing actuator, or a net composite of other actuators, also push on a second side). The selection of actuators, such as AC solenoids, DC solenoids, or other EM actuators, may be of any type, and may depend upon the characteristics desired for steering the given embodiment, such as desired response times, available actuating power, space available, or the like. In the embodiments of FIGS. 26-28, a single steered lens is depicted. Additionally or alternatively, more than one steered lens for example to provide steered lenses having distinct steering characteristics (e.g., steering speed, steering precision, steering displacement capability, or the like), and/or due to other system characteristics making the presence of more than one steering lens desirable (e.g., cooperative steering to achieve an increased steering capability or response time, separating steering control for each axis, and/or due to constraints on a number or arrangement of actuators associated with one or more steering lenses, such as available space, EMI noise considerations, power delivery considerations, or the like).

In certain embodiments, piezoelectric devices provide a number of advantages, such as rapid response times (e.g., allowing for rapid steering operations, scanning, or the like), low degradation over a high number of operating cycles, and convenient control through electronic commands. However, piezoelectric devices utilized in previously known systems have a number of drawbacks limiting their utility, such as a limited displacement capability and sensitivity to certain frequency. Embodiments herein provide enhanced displacement capabilities for the lens(es) using piezoelectric devices, and/or enhanced steering capability mitigating a limited available displacement of the lens(es).

Referencing FIG. 29, an example arrangement of steering lenses 2902, 2904 with associated actuators 2402, 2404 is depicted. An example embodiment includes the steering lenses 2902, 2904 making up a steering layer for any beam steering device as described throughout the present disclosure. The example of FIG. 29 depicts the actuators 2902, 2904 providing perpendicular motion to the steering lenses 2902, 2904, which may be aligned with the logical steering axes of the beam steering device, or not. The actuators 2402, 2404 may be of any type as set forth throughout the present disclosure.

Referencing FIG. 30, an example arrangement of actuators 2402, 2404 moving respective steering lenses (not shown) in a first movement direction 3002 or a second movement direction 3004 are depicted. The example arrangement of FIG. 30 is consistent, for example, with the arrangement of steering lenses 2902, 2904 depicted in FIG. 29. The movement directions 3002, 3004 are depicted for purposes of illustration as both perpendicular and linear. However, the movement directions 3002, 3004 may be non-perpendicular, including an offset of up to about 45 degrees. It will be understood, for example referencing FIGS. 32, 34, 35 and the related description, that utilizing non-perpendicular movement directions 3002, 3004 reduces the overall steering envelope available for a given actuator movement amount. Nevertheless, the utilization of non-perpendicular movement directions 3002, 3004 may be desirable for other reasons (e.g., to accommodate installation tolerances, blind installations of one or more components, to accommodate actuator position options within the beam steering device, etc.), and the utilization of non-perpendicular movement directions 3002, 3004 can be accommodated. Further, the movement directions 3002, 3004 may be non-linear, including a curve (e.g., imposed by motion of the actuator, to accommodate a housing curvature, to provide space for other components, etc.). The utilization of a curved motion trajectory for one or more movement directions 3002, 3004 may result in multiple steering solutions—for example more than one actuator 2402, 2404 position set to achieve a specified steering target value. The utilization of a curved motion trajectory for one or more movement directions 3002, 3004 can be accommodated, for example as described in relation to FIGS. 32, 34, 35 and the related description. Additionally or alternatively, the movement directions 3002, 3004 may align with the logical steering axes or not (e.g., reference FIGS. 32, 34 and the related description). The non-alignment of the movement directions 3002, 3004 with the logical steering axes reduces the overall steering envelope available for a given actuator movement amount. Nevertheless, the utilization of non-aligned movement directions 3002, 3004 with the logical steering axes may be desirable for other reasons (e.g., to accommodate installation tolerances, blind installations of one or more components, to accommodate actuator position options within the beam steering device, etc.), and the utilization of non-aligned movement directions 3002, 3004 with the logical steering axes can be accommodated. In certain embodiments, enforcement of perpendicular movement directions 3002, 3004 may be easier to accomplish (e.g., utilizing a steering layer assembly that is installed as a unit into the beam steering device) than alignment of the movement directions 3002, 3004 with the logical steering axes.

Referencing FIG. 31, an example arrangement of actuators 2402, 2404 moving respective steering lenses (not shown) in a first movement direction 3002 or a second movement direction 3004 are depicted. The example movement directions 3002, 3004 of the example in FIG. 31 are not perpendicular.

Figure 32:
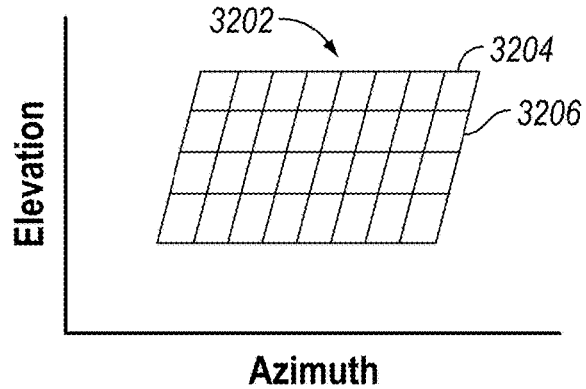
FIGS. 32-35 are illustrative operating diagram(s) for a beam steering device.

Referencing FIG. 32, an example operating diagram 3202 for a beam steering device is depicted. The example operating diagram 3202 maps actuator positions (example horizontal lines 3204 corresponding to positions of a first actuator, and vertical/diagonal lines 3206 corresponding to positions of a second actuator) to logical steering axes values (e.g., elevation and azimuth, in the example). The diagonal nature of the lines 3206 in the example of FIG. 32 indicates that one of the actuators provides a movement direction that is not aligned with a steering axis, and the lack of perpendicularity of the lines 3204, 3206 indicates that the movement directions 3002, 3004 are not perpendicular. Nevertheless, the operating diagram 3202 may be utilized to determine actuator positions to provide selected steering solutions. It can be seen in the example of FIG. 32 that the lack of alignment between the movement directions and the logical steering axes, and the lack of perpendicularity between the movement directions, provides for a reduced steering envelope (e.g., the unachievable steering solutions in the upper left and lower right of the operating diagram 3202) relative to perfectly aligned and perpendicular movement directions. Nonetheless, the operating space can be sufficiently sized (e.g., utilizing actuators having sufficient movement, and/or increasing an appropriate magnification according to the beam steering device type) such that an arbitrary steering angle capability can be achieved. In certain embodiments, information such as the operating diagram 3202 may be stored on a computer readable medium, for example as an equation, look-up table, or the like, for reference and execution by a controller, circuit, processor, or other functional execution component as described herein. In certain embodiments, the line spacing (e.g., distance between horizontal lines 3204) may indicate actuator position values to achieve the desired steering solution. In certain embodiments, operating lines (e.g., horizontal lines 3204) may be curved—for example representing a non-linear motion of the corresponding actuator. It can be seen that if the lines are sufficiently curved, more than one actuator position solution may be available for a given target steering value. Where more than one actuator position solution is available, operations to determine an actuator position to achieve the target steering value may include, without limitation: progression to a closest actuator position (e.g., based on a current actuator position), progression to an actuator position that is furthest from saturation (e.g., keeping the actuators with operating room rather than saturating an actuator), and/or proceeding to a first actuator position and then adjusting to another actuator position (e.g., proceeding to a closest position first, and then adjusting to a different desired actuator position, such as to provide both high transient capability and operating margin for a later steering adjustment).

Figure 33:
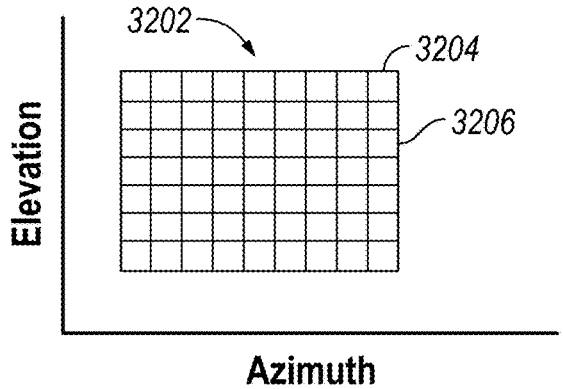
Figure 34:
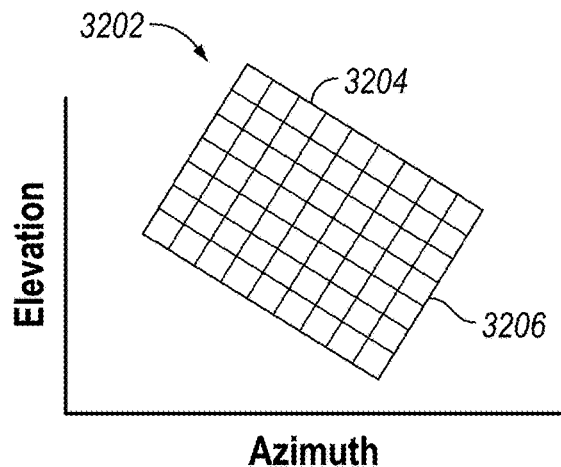
Figure 35:
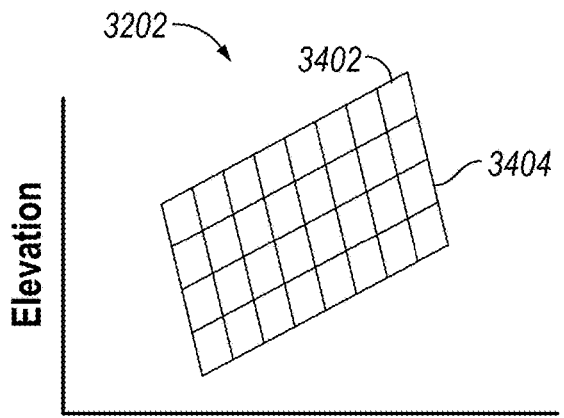

Referencing FIG. 33, an example operating diagram 3202 is provided, wherein the actuators provide for perpendicular movement directions, which are additionally aligned with the logical steering axes. It can be seen in the example of FIG. 33 that both alignment and perpendicularity maximize the steering capability envelope for a given actuator movement range. Referencing FIG. 34, an example operating diagram 3202 is provided, wherein the actuators provide for perpendicular movement directions, which are significantly not aligned with the logical steering axes. It can be seen in the example of FIG. 34 that significant mis-alignment of the movement directions with the logical steering axes significantly reduces the steering capability envelope for a given actuator movement range. Nonetheless, the operating space can be sufficiently sized (e.g., utilizing actuators having sufficient movement, and/or increasing an appropriate magnification according to the beam steering device type) such that an arbitrary steering angle capability can be achieved. Referencing FIG. 35, an example operating diagram 3202 is provided wherein the actuators do not provide perpendicular movement directions, and where neither of the movement directions are aligned with the logical steering axes.

Figure 36:
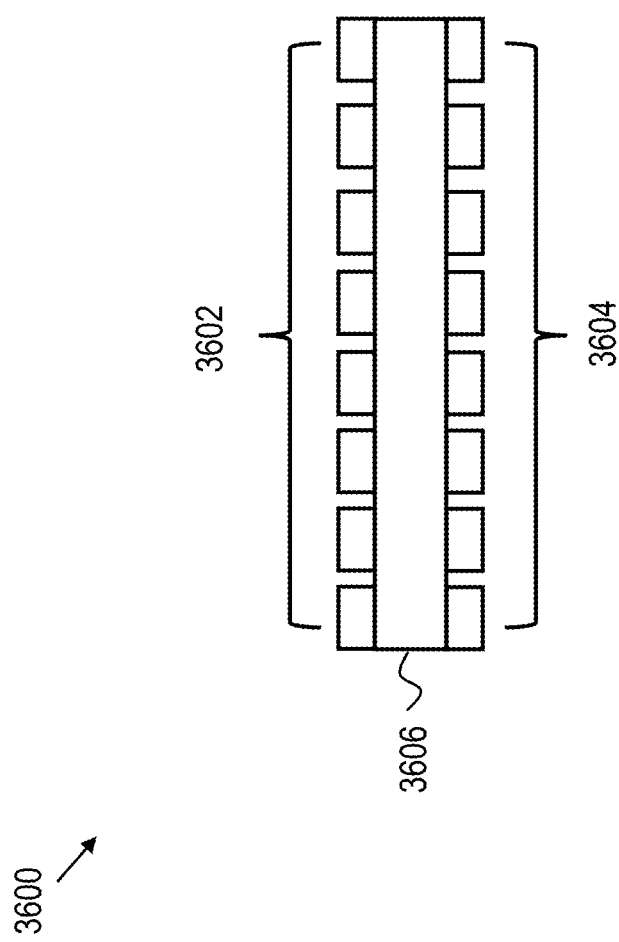
FIG. 36 is a schematic depiction of a variaxial lens utilizable as a steering lens for embodiments of the present disclosure.

Referencing FIG. 36, an example variaxial lens 3600 is schematically depicted. The example variaxial lens 3600 is depicted in an end view—for example where the EM beam to be steered passes vertically through the variaxial lens 3600 as depicted. The example variaxial lens 3600 includes a number of discrete high side electrodes 3602 that have controllable voltages, and a number of opposing discrete low side electrodes 3604 that may be a ground voltage, a low voltage (including a non-zero and/or a negative voltage). The variaxial lens 3600 includes an electro-optical substrate 3606, for example having a refractive index (and/or birefringence) that changes in response to an applied electric field. An example variaxial lens 3600 may be provided as a steering lens—for example, the voltages of the high side electrodes 3602 (and/or the low side electrodes 3604) are adjusted to "move" the lens to a selected location on the variaxial lens 3600. Accordingly, the variaxial lens 3600 is a writeable lens suitable as both a steering lens and actuator as a part of a steering layer of a beam steering device. Typically, the maximum voltage is held constant (e.g., providing a same focal length of the variaxial lens 3600 during operations), with a voltage trajectory on either side of the maximum voltage position to provide the full writeable lens. In certain embodiments, the low side electrodes 3604 may be continuous. The utilization of a variaxial lens 3600 for one or more of the steering lenses provides for rapid response time and elimination of moving mechanical parts for at least a portion of the beam steering device.

Figure 37:
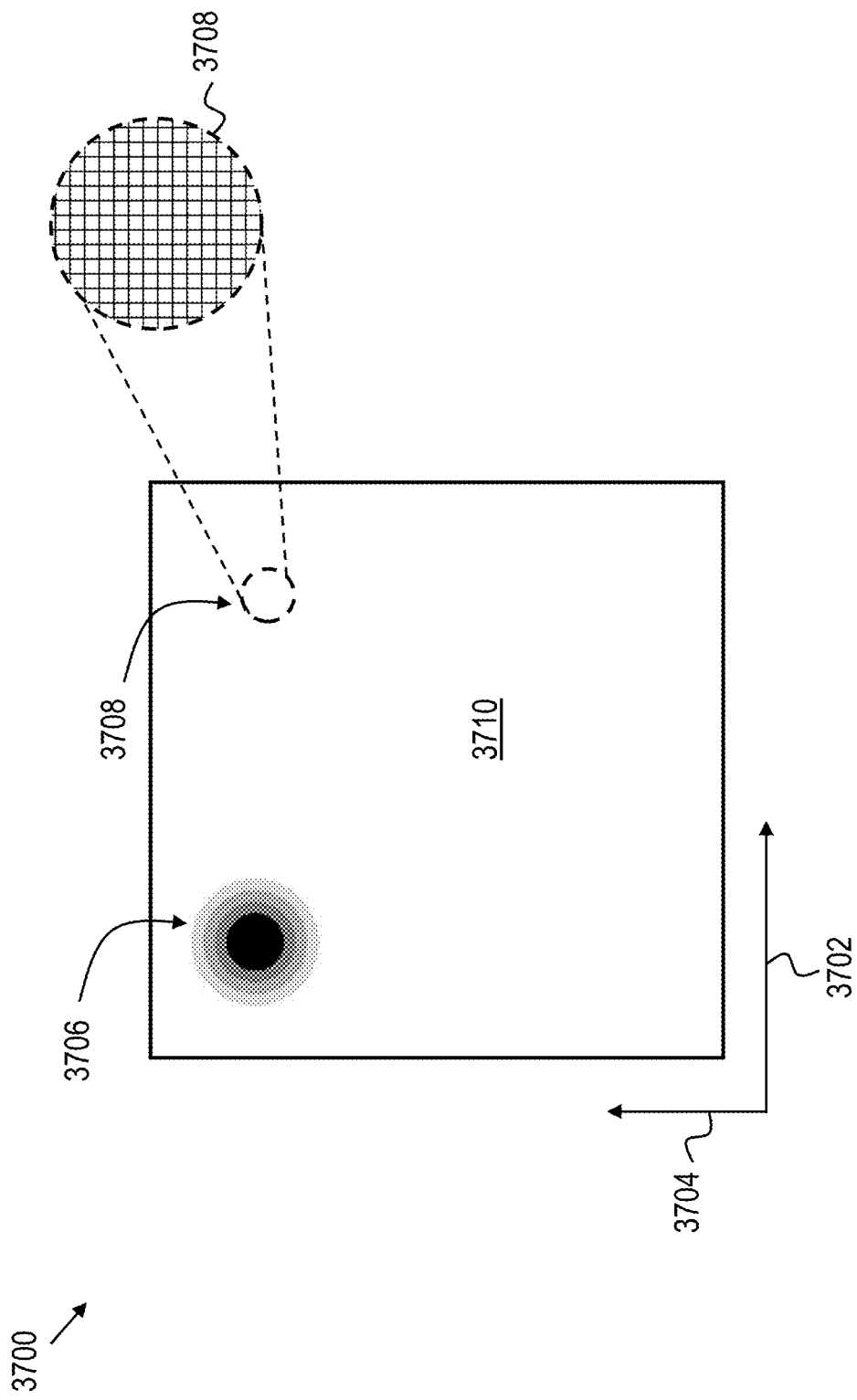
FIG. 37 is a schematic depiction of a write-able lens for embodiments of the present disclosure.

Referencing FIG. 37, a writeable lens 3700 is schematically depicted. The example writeable lens 3700 includes a pixel grid 3708 of high side electrodes on a first side (the front side which is showing, in the example of FIG. 37), and either a corresponding pixel grid or a continuous low side electrode on a second side (the back side which is not showing, in the example of FIG. 37). The writeable lens 3700 includes an electro-optical substrate 3710 throughout at least an active area of the lens, for example having a refractive index (and/or birefringence) that changes in response to an applied electric field. The electrodes in the example are transparent electrodes, and the EM beam to be steered passes through the writeable lens 3700 into or out of the face of the writeable lens 3700 as depicted. Accordingly, the writeable lens 3700 is suitable as both a pair of steering lenses and actuator as a part of a steering layer of a beam steering device. Typically, the maximum voltage is held constant (e.g., providing a same focal length of the variaxial lens 3600 during operations), with a voltage trajectory surrounding the maximum voltage position to provide the full writeable lens, forming the lens portion 3706. The utilization of a writeable lens 3700 such as that depicted provides for steering in both a first axis 3702 and a second axis 3704 (e.g., the position of the lens portion 3706 can be moved through voltage changes), that may be moved rapidly and without moving mechanical parts for at least a portion of the beam steering device.

Figure 38:
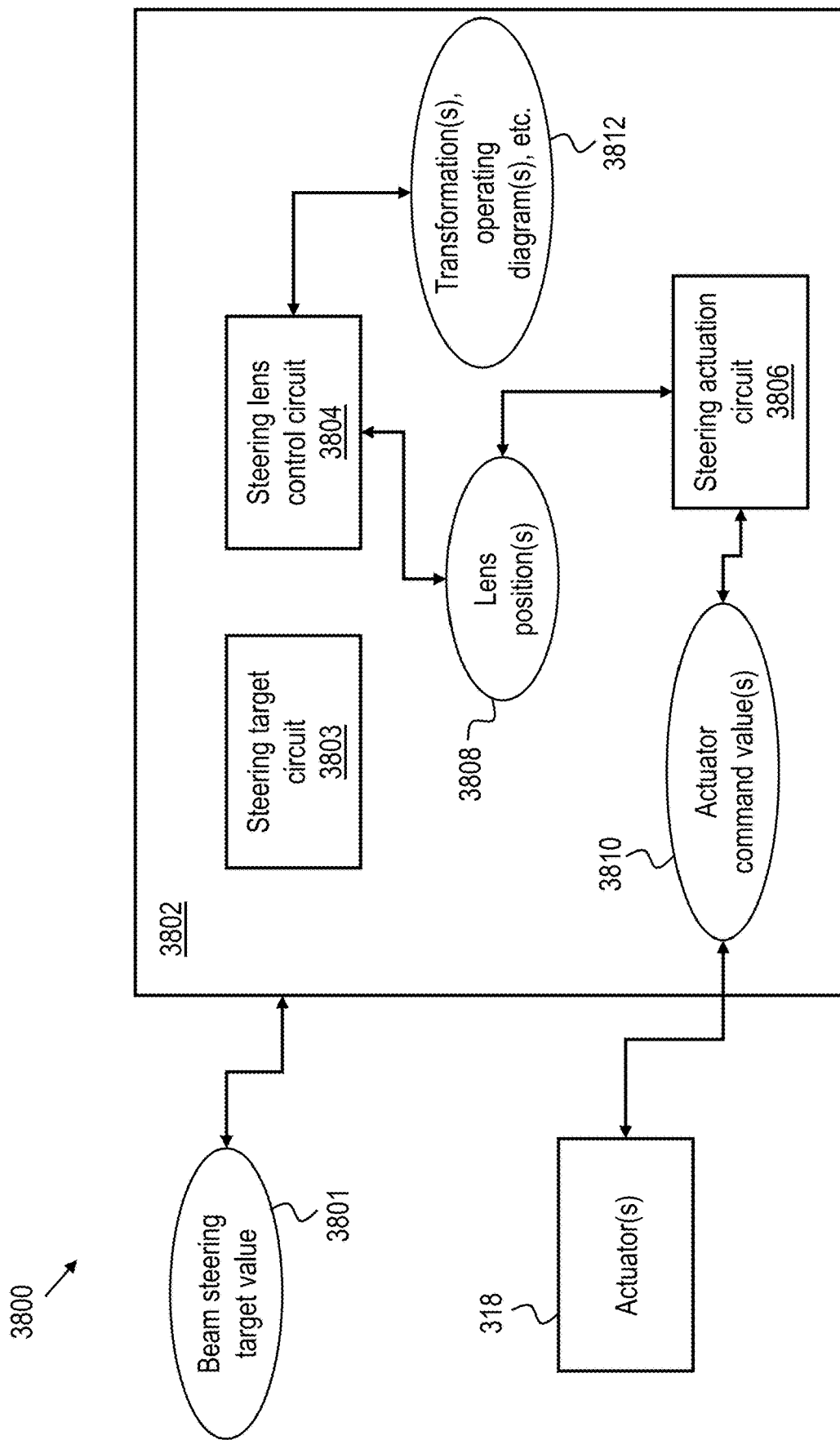
FIG. 38 is a schematic block diagram of a beam steering controller.

Referencing FIG. 38, an example apparatus 3800 to control beam steering is schematically depicted. The example apparatus 3800 may be utilized with any beam steering device described throughout the present disclosure. The example apparatus 3800 may be included as a part of a beam steering device, as a part of a system including a beam steering device, and/or may be provided in communication with one or more aspects of a beam steering device, such as but no limited to actuator(s) 318, active or write-able lenses (e.g., reference FIGS. 36, 37, and the related description), sensors (not shown, but including, for example, temperature determinations for various components, actuator feedback sensors, etc.), and/or active cooling components (not shown). The example apparatus 3800 may be communicatively coupled to any component of a beam steering device, and may be configured to receive steering command value(s) (e.g., provided by an operator, a controller (not shown), as a data file, etc.) and/or fault condition values (e.g., confirming operations of any actuator, steering device, active cooling device, etc.), and may further be configured to provide commands to any active component of the system (e.g., actuators 318, active cooling devices, write-able lenses, etc.).

The example apparatus 3800 includes a beam steering controller 3802 having a number of circuits configured to functionally execute operations of the controller 3802. The example controller 3802 is depicted as a single device for clarity of description, but may be a distributed device, positioned on another device as a portion thereof (e.g., a system controller for a system including a beam steering device), or combinations of these. The example controller 3802 includes a steering target circuit 3803 that interprets a beam steering target value 3801 (e.g., a steering angle for a first beam, a steering target location for the first beam, a trajectory of these (e.g., relative to time, a scanning frequency, etc.), a steering lens control circuit 3804 that determines position(s) for steering lens(es) in response to the beam steering target value 3801, and a steering actuation circuit 3806 that provides actuator command value(s) 3810 for actuators 318 of a beam steering device.

An example steering target circuit 3803 makes the beam steering target value 3801 available to the steering lens control circuit 3804, and may configure the beam steering target value 3801 according to a selected steering scheme. For example, the beam steering target value 3801 may be provided as a steering command according to an application view (e.g., 15 degrees azimuth, and −2 degrees elevation), and/or as a steering command according to a transformed view relative to the application view (e.g., making the steered beam incident on the emission lens at a selected location of the emission lens).

The circuits 3803, 3804, 3806 are depicted as single devices for clarity of the present description. However, a given circuit 3803, 3804, 3806 may be: a distributed device; provided as a part of another device; provided, in whole or part, as computer readable instructions stored on a memory (not shown), wherein a processor (not shown) executing the instructions thereby performs at least a portion of the operations of the respective circuit 3803, 3804, 3806; and/or provided, in whole or part, as a logic circuit and/or hardware component(s) configured to perform at least a portion of the operations of the respective circuit. A circuit, as utilized herein, may include one or more of any actuator, sensor, or other component of a beam steering device, and/or may be in communication with any actuator, sensor, or other component of the beam steering device.

An example steering lens control circuit 3804 determines a first position of a first steering lens and a second position of a second steering lens (e.g., operating with a beam steering device including a steering layer having two steering lenses) in response to the beam steering target value 3801. Example operations to determine the positions of the steering lenses include one or more of: determining a lens offset for each respective axis (e.g., where the lens movement for each steering lens is aligned with a steering axis); transforming the steering target value 3801 to respective lens positions 3808 (e.g., utilizing an operating diagram 3202, transforming equation, or the like); and/or selecting positions consistent with the steering target value (e.g., where more than one available position set will achieve the steering, for example when an actuator has a curved movement path for a steering lens). An example steering lens control circuit 3804 can perform, without limitation, any operation as described herein to determine positions for a steering layer and/or for individual steering lenses, that provide steering according to the beam steering target value 3801. An example steering lens control circuit 3804 accesses stored data 3812, such as transformation parameters, operating diagrams 3202, or the like. The lens positions 3808 correspond to a displacement of a steering lens (e.g., 3 mm in "x" direction, and 1 mm in "y" direction), and/or to a location of a steering lens on a writeable lens (e.g., a position of a variaxial lens, and/or a position on a pixelated writeable lens, and which may be an absolute position and/or a relative position) that provide beam steering according to the beam steering target value 3801.

An example steering actuation circuit 3806 provides actuator command value(s) 3810 in response to the lens position(s) 3808, for example providing a first actuator command value in response to a first position, and a second actuator command value in response to a second position. The example of FIG. 38 is adaptable to steering multiple beams, for example with regard to a type 2 beam steering device, where multiple beam steering values 3801 are provided corresponding to each of a number of optical paths (e.g., each having an individual beam steering device, such as depicted in FIGS. 15-17 and 22).

Figure 39:
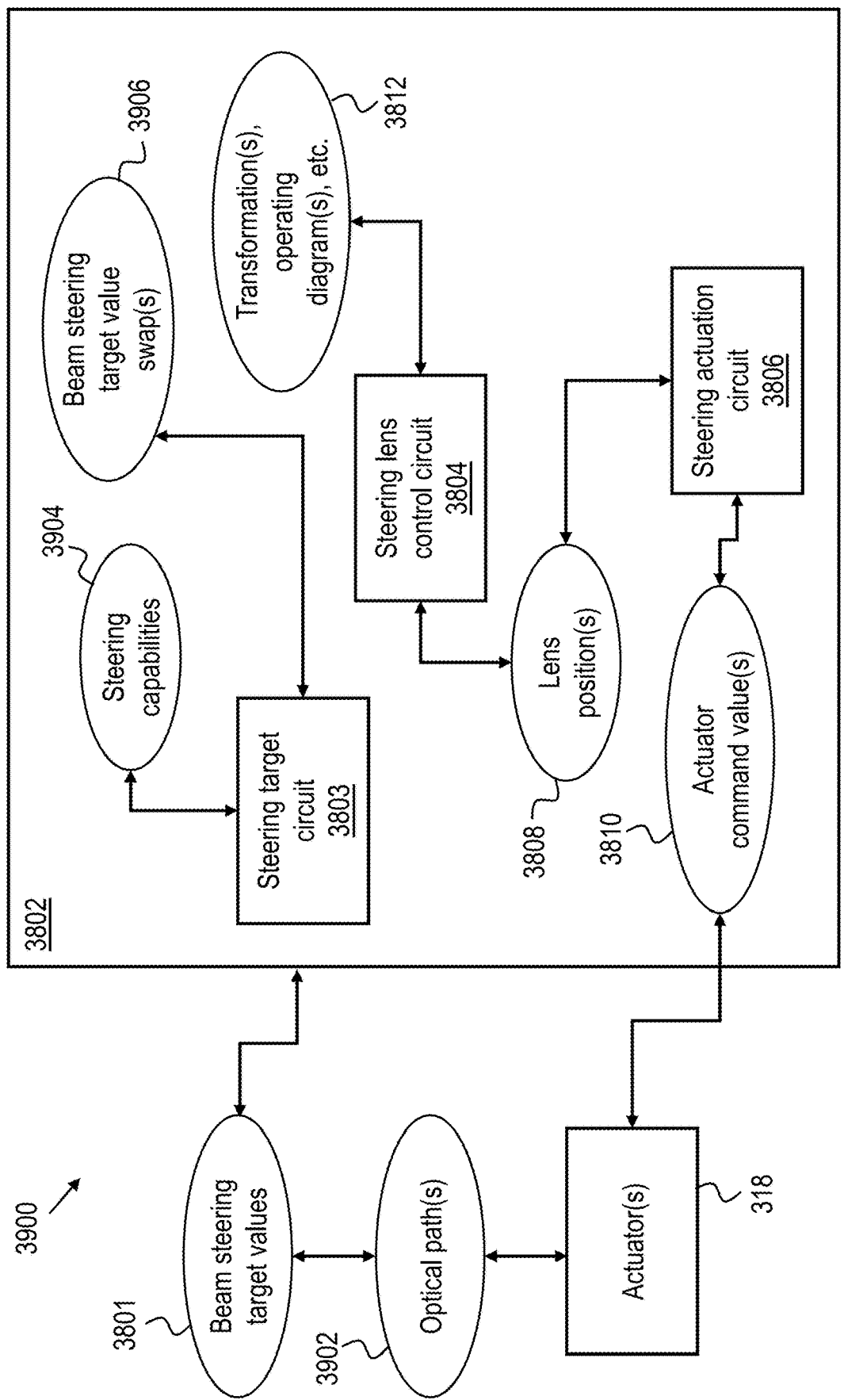
FIG. 39 is a schematic block diagram of a beam steering controller.

Referencing FIG. 39, another example apparatus 3900 to control beam steering is schematically depicted. The example apparatus 3900 includes a beam steering controller 3802 configured to steer a number of beams, which may be steered simultaneously (but need not be), with a number of beam steering target values 3801 each corresponding to one of a number of optical paths 3902 (e.g., each optical path having an individual beam steering device and/or devices, for example as depicted in FIGS. 15-17 and 22). In the example of FIG. 39, the steering target circuit 3803 is further capable to swap a beam steering target value 3801 from a first optical path 3902 to a second optical path 3902, for example in response to steering capability(ies) of the associated individual beam steering device(s) for those optical paths, and the beam steering target values 3801. In the example, the beam steering controller 3802 provides the swapped beam steering target value(s) 3906 to the steering lens control circuit 3804 as the beam steering target value 3801. Without limitation to any other aspect of the present disclosure, the swapped beam steering target value(s) 3906 may be determined to ensure capability of a type 2 beam steering device to meet all targeted steering operations, to reduce an aggregate amount of actuator movement across the individual beam steering devices (e.g., reducing power consumption, reducing a time to achieve the targeted steering operations, to preserve operating margin for one or more individual beam steering devices, and/or to reduce a maximum actuator movement from among the actuators being moved responsive to the steering commands). Operations to swap the beam steering target values may be performed during transient operations (e.g., rapid changes in steering angles), and/or during operations where one or more individual steering devices are commanded to steer to an angle that is not achievable by the nominal device (but a substitute individual steering device in the system is capable to steer to the commanded angle). Operations to swap the beam steering target values may be reversed (e.g., returning steering control for a specific steered beam to a nominal device) and/or changed (e.g., utilizing another substitute individual steering device) based on, without limitation, any one or more of: lack of capability of the initial substitute device to support updated steering commands (e.g., where another substitute device is capable to support the updated steering command); a change in the steering command where the nominal device is capable to support the steering command as changed; a change in steering operations from a highly transient operation to a lower transient operation (e.g., returning steering operation to a nominal device as operations approach steady state and/or a reduced transient); changes in operation to preserve operating margin (e.g., initially meeting steering operations with a first set of individual steering devices to respond to a first condition, such as the desired speed of steering operations; and updating steering operations with a second set of individual steering devices to respond to a second condition, such as preserving an operating margin of the entire system of individual steering devices, rotating utilization among individual steering devices, distributing heat generation throughout multiple individual steering devices, etc.).

Figure 40:
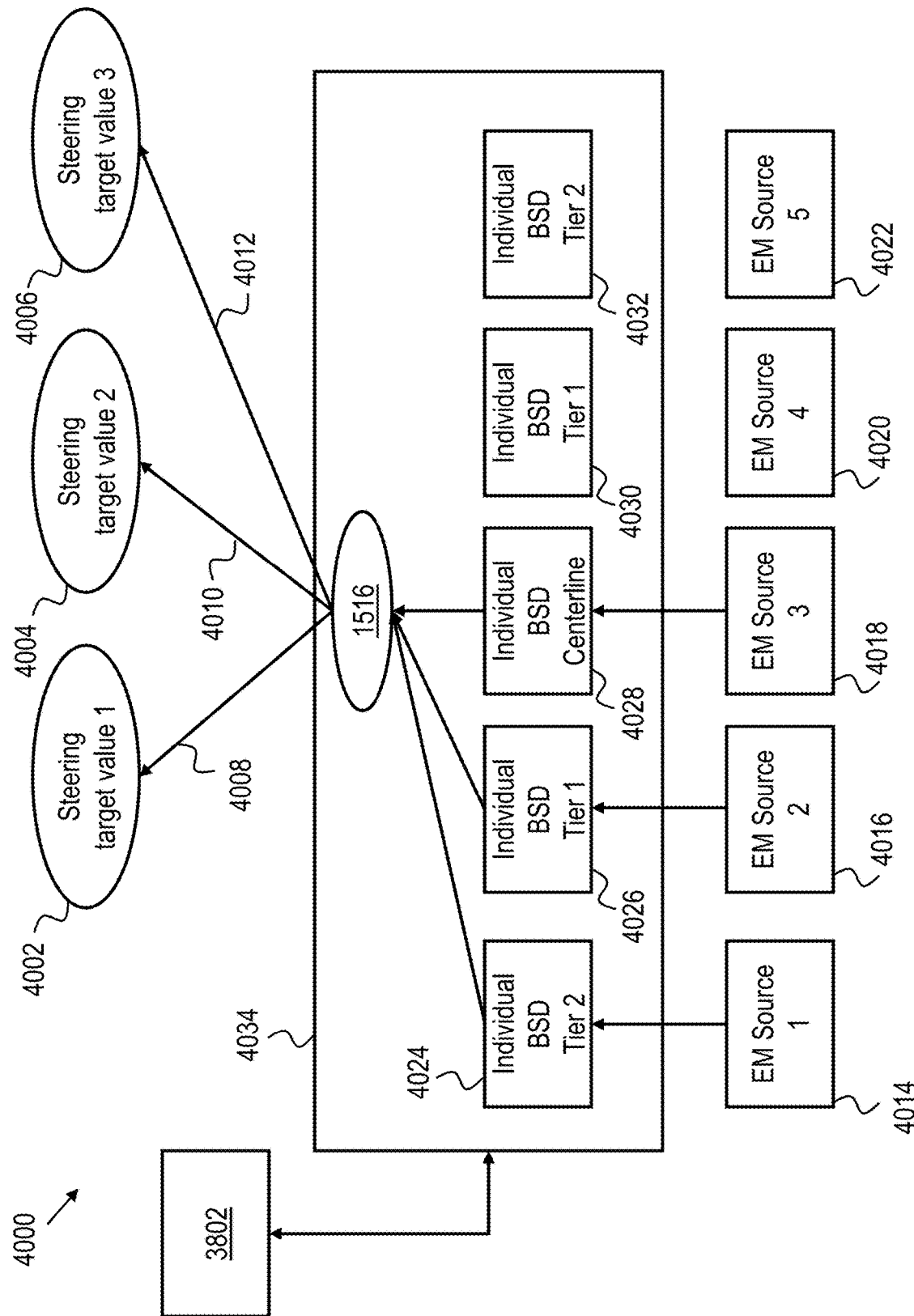
FIGS. 40-42 are schematic depictions of illustrative swapping operations for beam steering according to aspects of the present disclosure.
Figure 41:
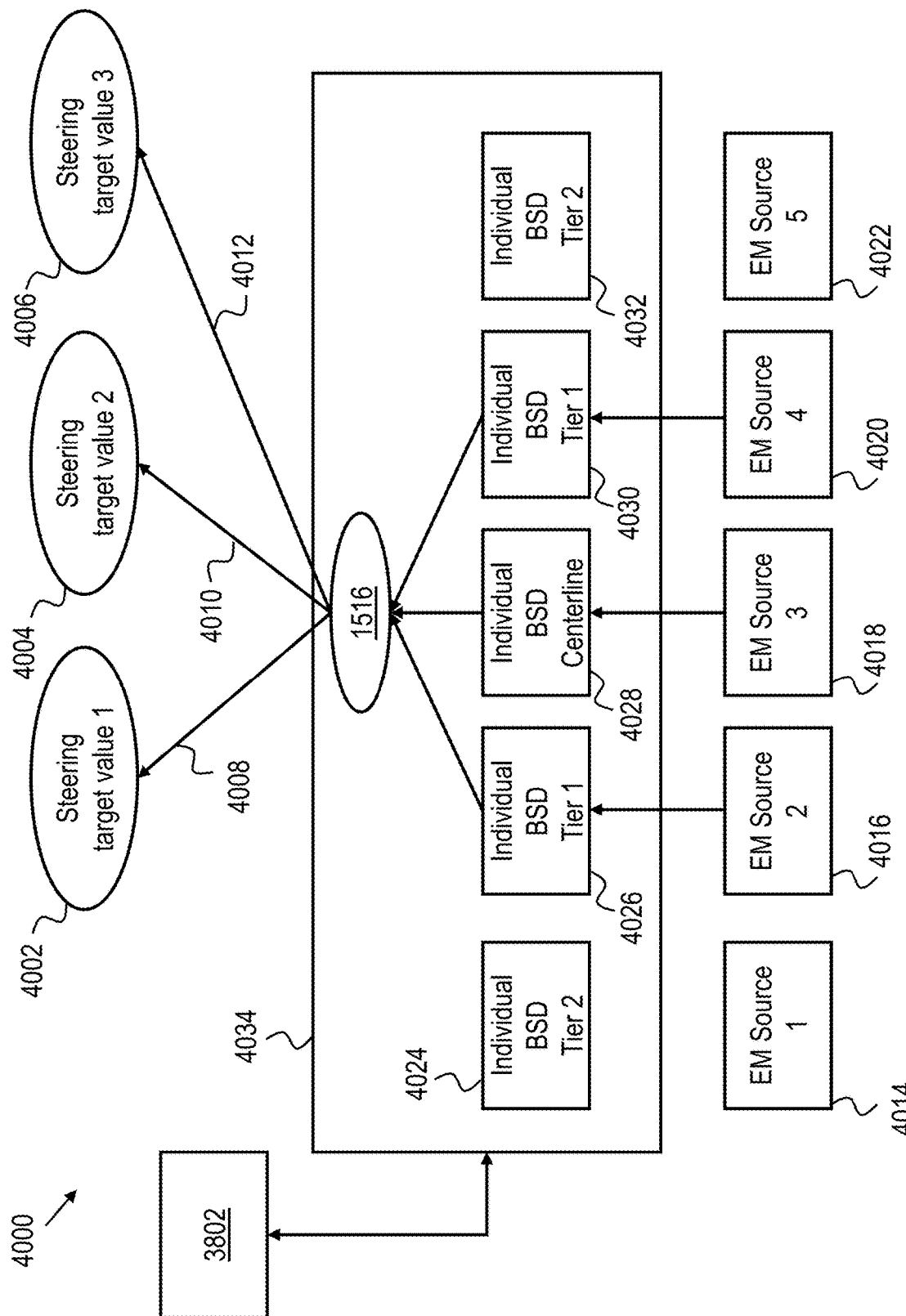
Figure 42:
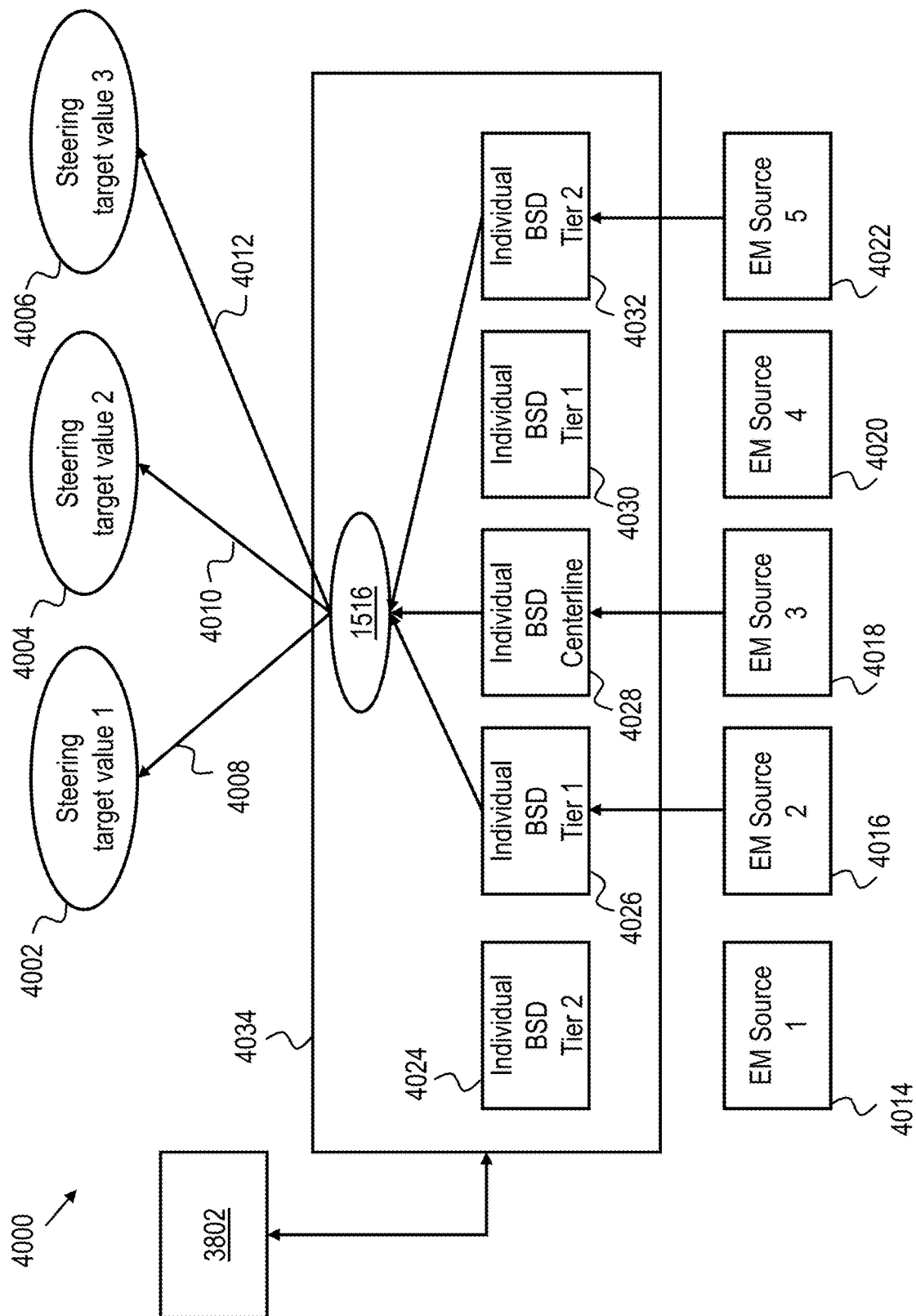

Referencing FIGS. 40-42, example and non-limiting swapping operations are schematically depicted. Referencing FIG. 40, an example system 4000 includes a type 2 steering device 4034 includes a number of optical paths, each having an individual steering device 4024, 4026, 4028, 4030, 4032, and configured to selectively steer a beam from a corresponding EM source 4014, 4016, 4018, 4020, 4022. In the example of FIG. 40, three steering target values 4002, 4004, 4006 are provided, with corresponding steered beams 4008, 4010, 4012 that are to be steered to the steering target values 4002, 4004, 4006. For purposes of illustration, steering target value 4002 is nominally commanded to an individual beam steering device 4024 provided in a second tier of individual beam steering devices, steering target value 4002 is nominally commanded to an individual beam steering device 4026 in a first tier of individual beam steering devices, and steering target value 4006 is nominally commanded to an individual beam steering device 4028 which is a centerline device in the example.

Referencing FIG. 41, operations of the beam steering controller 3802 have swapped the beam steering target values 4002, 4004, 4006, for example to be serviced by individual beam steering devices 4026, 4028, 4030, rather than nominal devices 4024, 4026, 4028 as depicted in FIG. 40. The swapping may be a single swap (e.g., individual steering device 4030 services steering for the first target steering value 4002 in the place of individual steering device 4024), a shift (e.g., device 4026 replaces device 4024, device 4028 replaces device 4026, and device 4030 replaces device 4028), swapping within a tier (e.g., a tier 2 device replaces another tier 2 device), across tiers (e.g., a tier 1 device replaces a tier 2 device), and/or any other swapping operations as described throughout the present disclosure. It can be seen that swapping may occur among any individual beam steering devices, among related devices (e.g., according to tier, steering capability envelope coverage, etc.), and/or among devices having compatible EM sources 4014, 4016, 4018, 4020, 4022 associated therewith (e.g., between devices having a same or similar EM source, and/or having a configurable EM source capable to provide an acceptable EM beam during swapping operations). The EM sources 4014, 4016, 4018, 4020, 4022, as described throughout the present disclosure, may additionally or alternatively include a detection array or the like, and swapping operations may be available among devices according to the characteristics of the detection devices (e.g., similar pixel resolution, etc.).

Referencing FIG. 42, operations of the beam steering controller 3802 have swapped the beam steering target values 4002, 4004, 4006, for example to be serviced by individual beam steering devices 4026, 4028, 4032, rather than nominal devices 4024, 4026, 4028 as depicted in FIG. 40. In the example of FIG. 42, the swapping is depicted as a swap from a nominal individual beam steering device 4024 to another individual beam steering device 4032 within the same tier. The illustration of FIG. 42 is a non-limiting example.

Figure 43:
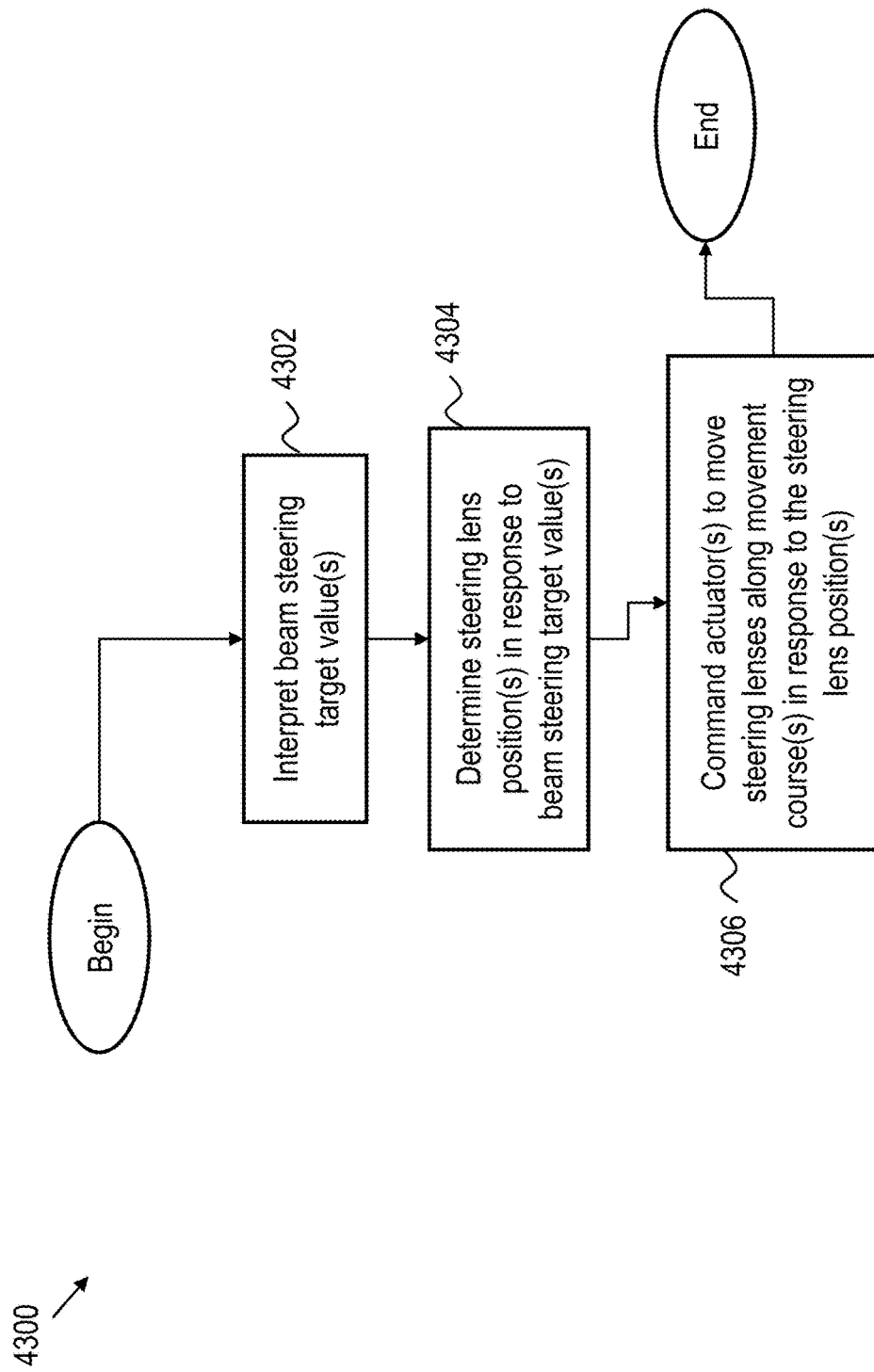
FIG. 43 is a schematic flow diagram of a procedure to command actuators of a beam steering device.

Referencing FIG. 43, an example procedure 4300 to steer one or more EM beams is schematically depicted. The example procedure 4300 includes an operation 4302 to interpret a beam steering value (e.g., a location, steering angle, and/or other steering description) for steering an incident EM beam, and an operation 4304 to determine steering lens position(s) in response to the beam steering value. Example operations 4304 include transforming between logical steering axes and movement axes (and/or a movement trajectory, movement course, etc.) of an actuator configured to perform steering lens movement operations for associated steering layer(s).

The example procedure 4300 further includes an operation 4306 to command an actuator to move steering lens(es) along movement courses (e.g., the movement trajectory of the lens enforced by the actuator) in response to the steering lens position(s). Operations of the example procedure 4300 may be performed to steer a single beam in a single axis, to steer the single beam along two axes (e.g., azimuth and elevation, or other steering nomenclature), and/or to steer more than one beam simultaneously, each having one or two steering axes. Example operations 4306 include providing an actuator command (e.g., a position, voltage, or other command), providing commands to a variaxial lens to move the lens to a selected portion of the EO active substrate, changing a position of an active lens portion of a configurable lens, and/or providing an actuator command to write a lens to a selected portion of a pixelated EO active substrate.

Figure 44:
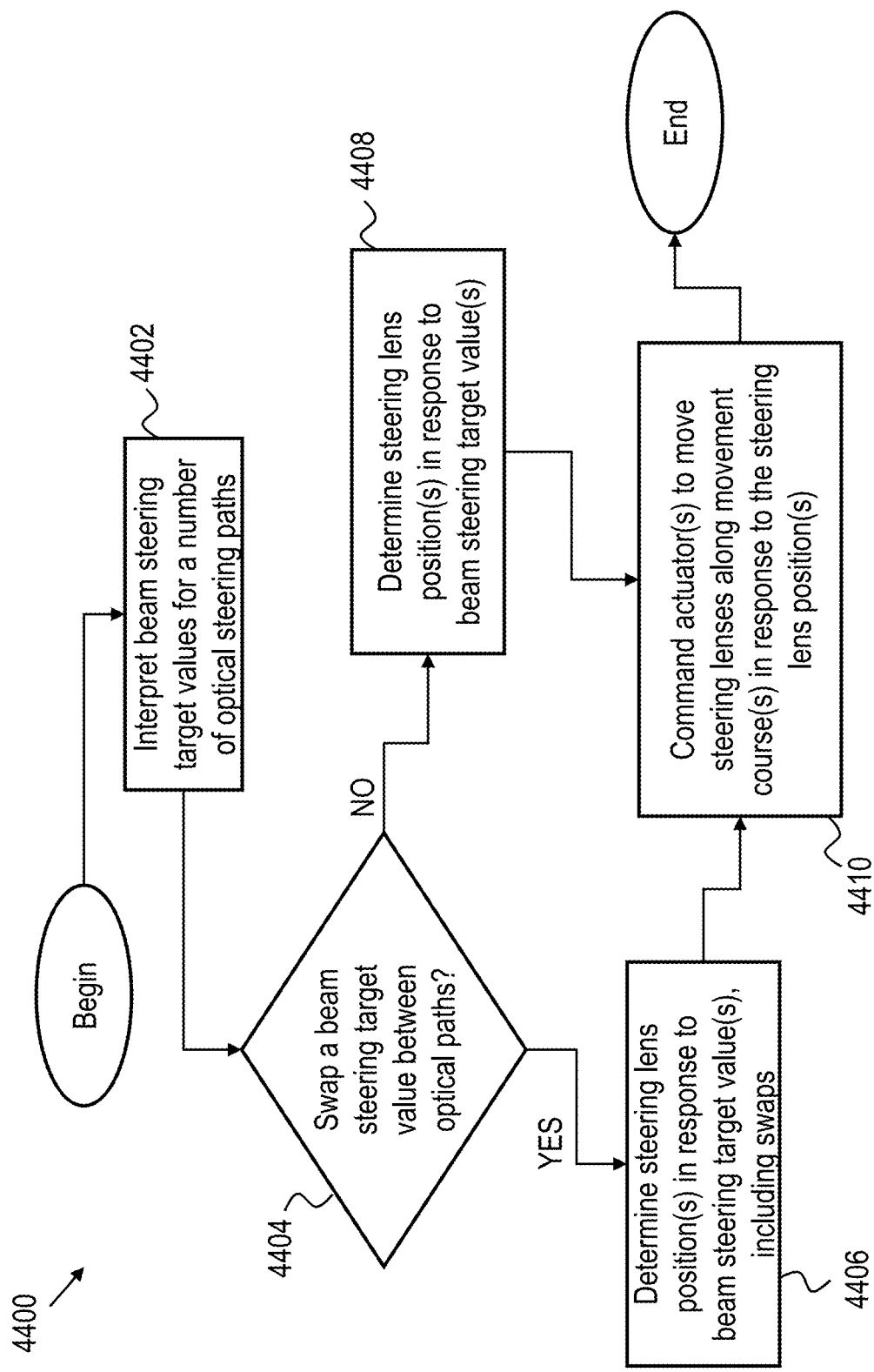
FIG. 44 is a schematic flow diagram of a procedure to command actuators, and swap optical paths, of a beam steering device.

Referencing FIG. 44, an example procedure 4400 includes an operation 4402 to determine a number of beam steering target values for a number of optical steering paths of a beam steering device—for example optical steering paths each having an individual beam steering device positioned therein. The example procedure 4400 includes an operation 4404 to determine whether to swap one or more beam steering target values between optical steering paths among the number of optical steering paths. In response to operation 4404 determining NO, the procedure 4400 includes an operation 4408 to determine steering lens position(s) for the individual beam steering devices in response to the beam steering target values, and an operation 4410 to command actuators to move steering lenses (e.g., along movement courses associated with each actuator) in response to the steering lens positions. In response to operation 4404 determining YES, the procedure 4400 includes an operation 4406 to determine steering lens position(s) for the individual beam steering devices in response to the swaps and the beam steering target values. Operations 4406 may additionally or alternatively include activating, de-activating, and/or configuring EM sources associated with the swapped individual beam steering devices such that the active steering devices receive an incident EM beam from the associated EM source, configured (e.g., frequency, phase, energy, trajectories of these, etc.) according to the intended steered beam characteristics. Without limitation to any other aspect of the present disclosure, operations 4406 to determine swaps among the individual beam steering devices include, without limitation, operations such as: providing an aggregate steering capability of the beam steering device to provide steered beams according to the beam steering target values; operations to reduce an aggregate movement amount of actuators of the beam steering device; operations to reduce an aggregate power consumption of the beam steering device; operations to reduce a time to achieve the beam steering target values; operations to reduce a maximum displacement of an actuator of the beam steering device (e.g., reducing a maximum displacement utilized to achieve a new steering target value); and/or operations to control reversion of steering operations to nominal individual beam steering devices (e.g., returning to nominal steering after a transient event is serviced; adjusting the swapping to increase a capability margin of an individual beam steering device and/or an overall capability margin of the beam steering device; and/or utilizing hysteresis to control swapping adjustments, return to nominal operations, etc., for example to reduce dithering, cycling, or the like).

An example system includes a first steering lens interposed between an electromagnetic (EM) source and a second steering lens; the second steering lens interposed between the first steering lens and a magnifying lens; the magnifying lens interposed between the second steering lens and a field lens; the field lens interposed between the magnifying lens and an emission lens; a first steering actuator coupled to the first steering lens, the first steering actuator configured to move the first steering lens along a first movement course; and a second steering actuator coupled to the second steering lens, the second steering actuator configured to move the second steering lens along a second movement course.

Certain further aspects of the example system are described following, any one or more of which may be present in certain embodiments. The example system includes one or more of: wherein an optical configuration of the first steering lens, the second steering lens, and the magnifying lens is configured to position a virtual object of the steering lenses at a position between $f_m$ and $2f_m$, wherein the position $f_m$, comprises a magnifying lens focal length displaced from the magnifying lens, and wherein the position $2f_m$ comprises twice the distance $f_m$; and/or wherein the optical configuration of the first steering lens, the second steering lens, and the magnifying lens comprises: an effective focal length of the combined first steering lens and second steering lens; the magnifying lens focal length; and an axial position of each of the first steering lens, second steering lens, and the magnifying lens.

Another example system includes a steering lens interposed between an electromagnetic (EM) source and a magnifying lens; the magnifying lens interposed between the steering lens and a field lens; the field lens interposed between the magnifying lens and an emission lens; and a steering actuator coupled to the steering lens, the steering actuator configured to move the steering lens along a movement course.

Certain further aspects of the example system are described following, any one or more of which are present in certain embodiments. An example system includes one or more of: wherein the movement course comprises selected movement along each of two axes; wherein a first one of the two axes comprises a first steering axis, and wherein a second one of the two axes comprises a second steering axis; wherein the two axes comprise perpendicular axes; wherein the steering actuator comprises a configurable lens element having an active lens portion, wherein the steering lens comprises the active lens portion, and wherein moving the steering lens along the movement course comprises changing a position of the active lens portion; wherein the steering lens comprises a positive lens, the system further comprising a second field lens positioned between the steering lens and the magnifying lens; and/or a source collimator lens interposed between the EM source and the steering lens.

An example system includes: an emission lens defining an optical emission end of a beam steering device; a field lens interposed between the emission lens and a plurality of optical steering paths; a first optical steering path of the plurality of optical steering paths, the first optical steering path comprising a first magnifying lens interposed between the field lens and a first steering layer, wherein the first steering layer is interposed between the first magnifying lens and a first electromagnetic (EM) source, a first steering actuator coupled to the first steering layer, the first steering actuator configured to move the first steering layer along a first movement course; a second optical steering path of the plurality of optical steering paths, the second optical steering path comprising a second magnifying lens interposed between the field lens and a second steering layer, wherein the second steering layer is interposed between the second magnifying lens and a second EM source, and a second steering actuator coupled to the second steering layer, the second steering actuator configured to move the second steering layer along a second movement course.

Certain further aspects of the example system are described following, any one or more of which may be present in certain embodiments. An example system includes wherein the first steering layer comprises a first steering lens interposed between the first EM source and a second steering lens, the second steering lens interposed between the first steering lens and the field lens, the first steering lens and the second steering lens having a combined first effective focal length, the field lens comprising a positive lens have a second focal length, wherein the first effective focal length is shorter than the second focal length, a first steering actuator coupled to the first steering lens, the first steering actuator configured to move the first steering lens along a first direction of the first movement course, and a second steering actuator coupled to the second steering lens, the second steering actuator configured to move the second steering lens along a second direction of the first movement course. An example system includes wherein the first steering layer comprises a steering lens interposed between the first EM source and the field lens, the steering lens having a first focal length, the field lens comprising a positive lens having a second focal length, wherein the first focal length is shorter than the second focal length, and a steering actuator coupled to the steering lens, the steering actuator configured to move the first steering lens along the first movement course. An example system includes wherein the first steering layer comprises, a first steering lens interposed between the first EM source and a second steering lens, the second steering lens interposed between the first steering lens and a magnifying lens, the magnifying lens interposed between the second steering lens and the field lens, a first steering actuator coupled to the first steering lens, the first steering actuator configured to move the first steering lens along a first direction of the first movement course, and a second steering actuator coupled to the second steering lens, the second steering actuator configured to move the second steering lens along a second direction of the first movement course. An example system includes wherein the first steering layer comprises a steering lens interposed between the first EM source and a magnifying lens, the magnifying lens interposed between the steering lens and the field lens, and a steering actuator coupled to the steering lens, the steering actuator configured to move the first steering lens along a first direction of the first movement course. An example system includes one or more of: wherein the first optical steering path comprises a centerline steering path, and wherein the second optical steering path comprises an offset steering path; wherein the first optical steering path comprises a centerline steering path, and wherein the second optical steering path comprises one of a plurality of offset steering paths; wherein the plurality of offset optical steering paths comprises six offset steering paths; wherein the first optical steering path comprises a centerline steering path, wherein the second optical steering path comprises one of a first plurality of offset steering paths surrounding the centerline steering path, the system further comprising a second plurality of offset steering paths surrounding the first plurality of offset steering paths; wherein the first plurality of offset steering paths comprises six offset steering paths; wherein the second plurality of offset steering paths comprises twelve offset steering paths; further comprising a third plurality of offset steering paths surrounding the second plurality of offset steering paths; wherein the first plurality of offset steering paths comprises six offset steering paths; wherein the second plurality of offset steering paths comprises twelve offset steering paths; and/or wherein the third plurality of offset steering paths comprises eighteen offset steering paths.

An example system further includes a controller having a steering target circuit structured to interpret a beam steering target value for each of the plurality of optical steering paths, a steering lens control circuit structured to determine a steering lens position for each of the plurality of optical steering paths in response to a corresponding beam steering target value for each of the plurality of optical steering paths, a steering actuation circuit structured to provide an actuator command value for a corresponding actuator for each of the plurality of optical steering paths in response to the corresponding steering lens positions, and where an actuator for each of the plurality of optical steering paths are responsive to the corresponding actuator command values. An example system further includes wherein the steering target circuit is further structured to swap a beam steering target value from a first one of the plurality of offset steering paths to a second one of the plurality of offset steering paths. An example system further includes one or more of: wherein the steering target circuit is further structured to swap a beam steering target value from a first one of the first plurality of offset steering paths to a second one of the first plurality of offset steering paths; wherein the steering target circuit is further structured to swap a beam steering target value from a first one of the first plurality of offset steering paths to a first one of the second plurality of offset steering paths; and/or wherein the steering target circuit is further structured to swap a beam steering target value from a first one of the second plurality of offset steering paths to a second one of the second plurality of offset steering paths.

The methods and systems described herein may be deployed in part or in whole through a machine having a computer, computing device, processor, circuit, and/or server that executes computer readable instructions, program codes, instructions, and/or includes hardware configured to functionally execute one or more operations of the methods and systems disclosed herein. The terms computer, computing device, processor, circuit, and/or server, as utilized herein, should be understood broadly.

Any one or more of the terms computer, computing device, processor, circuit, and/or server include a computer of any type, capable to access instructions stored in communication thereto such as upon a non-transient computer readable medium, whereupon the computer performs operations of systems or methods described herein upon executing the instructions. In certain embodiments, such instructions themselves comprise a computer, computing device, processor, circuit, and/or server. Additionally or alternatively, a computer, computing device, processor, circuit, and/or server may be a separate hardware device, one or more computing resources distributed across hardware devices, and/or may include such aspects as logical circuits, embedded circuits, sensors, actuators, input and/or output devices, network and/or communication resources, memory resources of any type, processing resources of any type, and/or hardware devices configured to be responsive to determined conditions to functionally execute one or more operations of systems and methods herein.

Certain operations described herein include interpreting, receiving, and/or determining one or more values, parameters, inputs, data, or other information ("receiving data"). Operations to receive data include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first receiving operation may be performed, and when communications are restored an updated receiving operation may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g. where the time delay of data for an operation to achieve a certain effect is important), but may not be required before that operation step in other contexts (e.g. where usage of the value from a previous execution cycle of the operations would be sufficient for those purposes). Accordingly, in certain embodiments an order of operations and grouping of operations as described is explicitly contemplated herein, and in certain embodiments reordering, subdivision, and/or different grouping of operations is explicitly contemplated herein.

The methods and systems described herein may transform physical and/or intangible items from one state to another. The methods and systems described herein may also transform data representing physical and/or intangible items from one state to another.

The methods and/or processes described above, and steps thereof, may be realized in hardware, program code, instructions, and/or programs or any combination of hardware and methods, program code, instructions, and/or programs suitable for a particular application. The hardware may include a dedicated computing device or specific computing device, a particular aspect or component of a specific computing device, and/or an arrangement of hardware components and/or logical circuits to perform one or more of the operations of a method and/or system. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure, and does not pose a limitation on the scope of the disclosure unless otherwise claimed. No language in the specification should be construed as indicating any non-claimed element as essential to the practice of the disclosure.

While the foregoing written description enables one skilled in the art to make and use what is considered presently to be the best mode thereof, those skilled in the art will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

Any element in a claim that does not explicitly state "means for" performing a specified function, or "step for" performing a specified function, is not to be interpreted as a "means" or "step" clause as specified in 35 U.S.C. § 112(f). In particular, any use of "step of" in the claims is not intended to invoke the provision of 35 U.S.C. § 112(f).

Persons skilled in the art may appreciate that numerous design configurations may be possible to enjoy the functional benefits of the inventive systems. Thus, given the wide variety of configurations and arrangements of embodiments of the present invention, the scope of the invention is reflected by the breadth of the claims below rather than narrowed by the embodiments described above.

What is claimed is:

1. A system, comprising:
a first steering lens interposed between an electromagnetic (EM) source and a second steering lens;
the second steering lens interposed between the first steering lens and an emission lens, the first steering lens and the second steering lens having a combined first effective focal length;
the emission lens comprising a positive lens having a second focal length;
wherein the first effective focal length is shorter than the second focal length;
a first steering actuator coupled to the first steering lens, the first steering actuator configured to move the first steering lens along a first movement course; and
a second steering actuator coupled to the second steering lens, the second steering actuator configured to move the second steering lens along a second movement course, wherein the second movement course is distinct from the first movement course.

2. The system of claim 1, wherein the first movement course corresponds to a first axis, and wherein the second movement course corresponds to a second axis.

3. The system of claim 2, wherein the first axis comprises a first steering axis, and wherein the second axis comprises a second steering axis.

4. The system of claim 2, wherein the first axis is perpendicular to the second axis.

5. The system of claim 2, wherein the first axis is radially separated from the second axis by at least 45 degrees.

6. The system of claim 1, wherein the first steering lens comprises a negative lens.

7. The system of claim 6, wherein the second steering lens comprises a negative lens.

8. The system of claim 6, wherein the second steering lens comprises a positive lens, and wherein a power of the first steering lens comprises a distinct magnitude from the power of the second steering lens.

9. The system of claim 1, wherein a ratio between the first effective focal length and the second focal length is selected in response to a beam steering angle capability value for a beam steering device comprising the first steering lens, the second steering lens, and the emission lens.

10. The system of claim 1, further comprising a beam steering controller, the beam steering controller comprising:
a steering target circuit structured to interpret a beam steering target value;
a steering lens control circuit structured to determine a first position of the first steering lens and a second position of the second steering lens in response to the beam steering target value; and
a steering actuation circuit structured to provide a first actuator command value in response to the first position, and a second actuator command value in response to the second position; and
wherein the first actuator is responsive to the first actuator command value, and wherein the second actuator is responsive to the second actuator command value.

11. The system of claim 10, wherein the first position comprises a selected displacement along a first steering axis.

12. The system of claim 11, wherein the second position comprises a selected displacement along a second steering axis.

13. The system of claim 10, wherein the steering lens control circuit is further structured to determine the first position and the second position, such that the EM source is incident upon the emission lens at a selected position of the emission lens.

14. The system of claim 10, wherein the beam steering target value comprises a steering azimuth value and a steering elevation value.

15. The system of claim 14, wherein the steering lens control circuit is further structured to determine one of the first position or the second position in response to the steering azimuth value, and to determine the other one of the first position or the second position in response to the steering elevation value.

16. The system of claim 14, wherein the steering lens control circuit is further structured to determine the first position and the second position such that the EM source is incident upon the emission lens at a selected position of the emission lens.

17. The system of claim 1, wherein a beam steering device comprising the first steering lens, the second steering lens, and the emission lens comprises a greater magnification in an elevation axis than in an azimuthal axis.

18. The system of claim 17, wherein the beam steering device comprises an azimuthal steering capability aligned with the azimuthal axis, an elevation steering capability aligned with the elevation axis, and wherein the elevation steering capability is greater than the azimuthal steering capability.

19. The system of claim 17, wherein the first movement course aligns with the elevation axis, and wherein the second actuator comprises a greater displacement range than the first actuator.

20. The system of claim 17, wherein the second movement course aligns with the azimuthal axis, and wherein the first actuator comprise a greater displacement range than the second actuator.

\* \* \* \* \*